United States Patent
Kim et al.

(10) Patent No.: US 11,963,437 B2
(45) Date of Patent: Apr. 16, 2024

(54) NEAR-INFRARED LIGHT-EMITTING DIODE AND DEVICE INCLUDING NEAR-INFRARED LIGHT-EMITTING DIODE

(71) Applicant: Samsung Display Co., Ltd., Yongin-si (KR)

(72) Inventors: Myeongsuk Kim, Yongin-si (KR); Sunwoo Kang, Yongin-si (KR); Soobyung Ko, Yongin-si (KR); Jimyoung Ye, Yongin-si (KR); Byeongwook Yoo, Yongin-si (KR); Illhun Cho, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 704 days.

(21) Appl. No.: 16/718,062

(22) Filed: Dec. 17, 2019

(65) Prior Publication Data

US 2020/0235319 A1    Jul. 23, 2020

(30) Foreign Application Priority Data

Jan. 17, 2019 (KR) .......................... 10-2019-0006434

(51) Int. Cl.
*H10K 85/30* (2023.01)
*C09K 11/06* (2006.01)
(Continued)

(52) U.S. Cl.
CPC ............ *H10K 85/348* (2023.02); *C09K 11/06* (2013.01); *C09K 2211/1007* (2013.01);
(Continued)

(58) Field of Classification Search
CPC .......................... H01L 51/0088; H10K 85/348
See application file for complete search history.

(56) References Cited

U.S. PATENT DOCUMENTS

| | | | |
|---|---|---|---|
| 7,416,791 | B1 | 8/2008 | Carlson et al. |
| 9,306,179 | B2 | 4/2016 | Tsai et al. |
| (Continued) | | | |

FOREIGN PATENT DOCUMENTS

| | | |
|---|---|---|
| CN | 103665048 A | 3/2014 |
| CN | 104804045 A | 7/2015 |
| (Continued) | | |

OTHER PUBLICATIONS

Lee T, et al., Rational Design of Charge-Neutral, Near-infrared-emitting osmium(II) complexes and OLED fabrication. Adv. Funct. Mater. Aug. 13, 2009, 19, 1639-2647. (Year: 2009).*

(Continued)

*Primary Examiner* — Sean M DeGuire
(74) *Attorney, Agent, or Firm* — Lewis Roca Rothgerber Christie LLP

(57) ABSTRACT

Provided are a near-infrared light-emitting diode including an osmium (Os)-containing organometallic compound and a device including the near-infrared light-emitting diode. The near-infrared light-emitting diode includes: a first electrode; a second electrode; and an organic layer between the first electrode and the second electrode, where the organic layer includes a near-infrared light-emitting layer, the near-infrared light-emitting layer includes the osmium (Os)-containing organometallic compound.

16 Claims, 1 Drawing Sheet

```
         10
    ┌─────────┐
    │   190   │
    ├─────────┤
    │   150   │
    ├─────────┤
    │   110   │
    └─────────┘
```

(51) Int. Cl.
  *H10K 50/11* (2023.01)
  *H10K 101/10* (2023.01)
(52) U.S. Cl.
  CPC ............... *C09K 2211/1029* (2013.01); *C09K 2211/1044* (2013.01); *C09K 2211/1059* (2013.01); *C09K 2211/1096* (2013.01); *C09K 2211/185* (2013.01); *H10K 50/11* (2023.02); *H10K 2101/10* (2023.02)

(56) References Cited

U.S. PATENT DOCUMENTS

| | | | |
|---|---|---|---|
| 9,331,289 | B2 | 5/2016 | Ikemizu et al. |
| 9,444,059 | B2 | 9/2016 | Inoue et al. |
| 2008/0269491 | A1 | 10/2008 | Jabbour et al. |
| 2009/0001875 | A1 | 1/2009 | Chi et al. |
| 2009/0236974 | A1 | 9/2009 | Tamaru et al. |
| 2009/0295281 | A1 | 12/2009 | Shin et al. |
| 2010/0133524 | A1 | 6/2010 | Kim et al. |
| 2010/0187977 | A1 | 7/2010 | Kai et al. |
| 2014/0008639 | A1 | 1/2014 | Thompson et al. |
| 2014/0117318 | A1 | 5/2014 | Choi et al. |
| 2014/0121372 | A1 | 5/2014 | Inoue et al. |
| 2014/0367662 | A1 | 12/2014 | Inoue et al. |
| 2015/0001472 | A1 | 1/2015 | Boudreault et al. |
| 2015/0090981 | A1 | 4/2015 | Xia et al. |
| 2015/0236277 | A1 | 8/2015 | Boudreault et al. |
| 2015/0318490 | A1 | 8/2015 | Boudreault et al. |
| 2016/0064678 | A1 | 3/2016 | Inoue et al. |
| 2016/0293866 | A1 | 10/2016 | Ishibashi et al. |
| 2017/0040553 | A1* | 2/2017 | Watabe ............... H01L 51/5028 |
| 2018/0130956 | A1 | 5/2018 | Boudreault et al. |
| 2018/0287091 | A1 | 10/2018 | Fujiwara et al. |
| 2018/0370999 | A1* | 12/2018 | Tsai ..................... C07F 15/002 |
| 2019/0062357 | A1 | 2/2019 | Yoo et al. |
| 2019/0100543 | A1 | 4/2019 | Yen et al. |
| 2019/0280216 | A1 | 9/2019 | Kawabe et al. |

FOREIGN PATENT DOCUMENTS

| | | | |
|---|---|---|---|
| CN | 106543231 A | | 3/2017 |
| KR | 10-0744199 B1 | | 8/2007 |
| KR | 10-2009-0093688 A | | 9/2009 |
| KR | 10-2010-0088715 A | | 8/2010 |
| KR | 10-2014-0001850 A | | 1/2014 |
| KR | 10-2014-0057419 A | | 5/2014 |
| KR | 10-2014-0104916 A | | 8/2014 |
| KR | 10-2015-0053709 A | | 5/2015 |
| KR | 10-2015-0110891 A | | 10/2015 |
| KR | 20150110891 A | * | 10/2015 |
| KR | 10-2016-0019926 A | | 2/2016 |
| KR | 10-2016-0101908 A | | 8/2016 |
| KR | 10-2018-0052096 A | | 5/2018 |
| WO | WO 2010/031738 A1 | | 3/2010 |

OTHER PUBLICATIONS

Zampetti et al, Near-Infrared (NIR) Organic Light-Emitting Dlodes (OLEDs): Challenges and Opportunities, Adv. Funct. Mater., 2019, 29, 1807623. (Year: 2019).*
Advisory Action for U.S. Appl. No. 16/015,031 dated Jun. 22, 2021, 3 pages.
Boudreault, et al. Claims of the U.S. Appl. No. 62/501,906, filed May 5, 2017, 39 pages.
Boudreault, et al. Specification of U.S. Appl. No. 62/419,620, filed Nov. 9, 2016, 58 pages.
Chen, H. et. "Room-temperature NIR Phosphorescence of new iridium (III) Complexes and Ligands Derived from Benzoquinoxaline," Can. J. Chem. 2006, vol. 84, pp. 309-318.
Edkins, R.M. et al. "Syntheses, Structures, and Comparison of the Photophysical Properties of Cyclometalated Iridium Complexes Containing the Isomeric 1- and 2-(2'-pyridyl)pyrene Ligands," Inorg. Chem. 2013, vol. 52, pp. 9842-9860.
Final Office Action for U.S. Appl. No. 16/015,031 dated Jan. 28, 2022, 39 pages.
Final Office Action for U.S. Appl. No. 16/015,031 dated Mar. 30, 2021, 30 pages.
Ge et al. "Highly Efficient Phosphorescent Iridium (III) Diazine Complexes for OLEDs: Different Photophysical Property Between Iridium (III) Pyrazine Complex and Iridium (III) Pyrimidine Complex," J. Organometallic Chem. 2009, vol. 694, pp. 3050-3057.
Ho et al. "Red to Near-Infrared Organometallic Phosphorescent Dyes for OLED Applications," J. Organometallic Chem. 2014, vol. 751, pp. 261-285.
Jiang, X. et al. "Red Electrophosphorescence for Osmium Complexes," Appl. Phys. Letts. 2002, vol. 80, pp. 713-715.
Lee, T. et al. "Rational Design of Charge-Neutral, Near-Infrared Emitting Osmium(II) Complexes and OLED Fabrication," Adv. Funct. Mater. 2009, vol. 19, pp. 2639-2647.
Ma et al. "An Isomeric Strategy for Enhancing Phosphorescence Efficiency of Iridium (III) Complexes with N-heterocyclic Naphthyrdine Ligands: A Theoretical Study," Org. Electronics, 2015, vol. 22, pp. 180-190.
Merriam-Webster, "Apparatus", https://www.merriam-webster.com/dictionary/apparatus, 2020.
Office Action for U.S. Appl. No. 16/015,031 dated Aug. 16, 2021, 29 pages.
Office Action for U.S. Appl. No. 16/015,031 dated Oct. 6, 2020, 20 pages.
Tao, R., et al., High-Efficiency near-infrared organic light-emitting devices based on a n iridium complex with negligible efficiency roll-off; Journal of Materials Chemistry C, 2013, pp. 6446-6454.
Treadway, J.A. et al. "Long-Lived Near-Infrared MLCT Emitters," Inorg. Chem. 2001, vol. 40, pp. 4508-4509.
Carlson , et. al., Tuning of excited state reduction potentials via expanded TT-systems. Synthesis and characterization of ruthenium complex [Ru(2,3-di(2'-pyridyl)benzo(g)quinoxaline)3](PF6)2; Inorganica Chi mica Acta (1991 ), 181 (1), 61-4; STN Abstract Only (Year: 1991).
U.S. Restriction Requirement dated Aug. 5, 2021, issued in U.S. Appl. No. 16/283,173 (7 pages).
U.S. Office Action dated Oct. 28, 2021, issued in U.S. Appl. No. 16/283,173 (10 pages).
U.S. Final Office Action dated Apr. 8, 2022, issued in U.S. Appl. No. 16/283,173 (13 pages).
U.S. Office Action dated Jul. 28, 2022, issued in U.S. Appl. No. 16/283,173 (9 pages).
U.S. Office Action dated Dec. 22, 2022, issued in U.S. Appl. No. 16/283,173 (11 pages).
U.S. Notice of Allowance dated Apr. 28, 2023, issued in U.S. Appl. No. 16/283,173 (10 pages).

* cited by examiner

10

| 190 |
|-----|
| 150 |
| 110 |

NEAR-INFRARED LIGHT-EMITTING DIODE AND DEVICE INCLUDING NEAR-INFRARED LIGHT-EMITTING DIODE

CROSS-REFERENCE TO RELATED APPLICATION

This application claims priority to and the benefit of Korean Patent Application No. 10-2019-0006434, filed on Jan. 17, 2019, in the Korean Intellectual Property Office, the entire content of which is incorporated herein by reference.

BACKGROUND

1. Field

One or more embodiments relate to a near-infrared light-emitting diode and a device including the near-infrared light-emitting diode.

2. Description of the Related Art

Organic light-emitting devices (OLEDs) are self-emission devices that, as compared with other devices, have wide viewing angles, high contrast ratios, short response times, and excellent characteristics in terms of brightness, driving voltage, and response speed.

OLEDs may include a first electrode on a substrate, and a hole transport region, an emission layer, an electron transport region, and a second electrode sequentially stacked on the first electrode. Holes provided from the first electrode may move toward the emission layer through the hole transport region. Electrons provided from the second electrode may move toward the emission layer through the electron transport region. Carriers, such as holes and electrons, may recombine in the emission layer to produce excitons. These excitons transit (e.g., transition or relax) from an excited state to a ground state to thereby generate light.

SUMMARY

One or more embodiments include a near-infrared light-emitting diode that may emit near-infrared light and have a long lifespan, and a device including the same.

Additional aspects of embodiments will be set forth in part in the description which follows and, in part, will be apparent from the description, or may be learned by practice of the presented embodiments.

According to one or more embodiments, a near-infrared light-emitting diode may include: a first electrode; a second electrode; and an organic layer between the first electrode and the second electrode, wherein the organic layer may include a near-infrared light-emitting layer, the near-infrared light-emitting layer may include an osmium (Os)-containing organometallic compound, and the Os-containing organometallic compound may be configured to emit near-infrared light having a maximum emission wavelength in a range of 680 nanometers (nm) or greater and 3,000 nm or less.

According to one or more embodiments, a device may include a near-infrared light-emitting diode.

BRIEF DESCRIPTION OF THE DRAWING

These and/or other aspects of embodiments will become apparent and more readily appreciated from the following description of the embodiments, taken in conjunction with the accompanying drawing in which:

The accompanying drawing is a schematic view of an embodiment of a near-infrared light-emitting diode.

DETAILED DESCRIPTION

Reference will now be made in more detail to embodiments, examples of which are illustrated in the accompanying drawing, wherein like reference numerals refer to like elements throughout. In this regard, the present embodiments may have different forms and should not be construed as being limited to the descriptions set forth herein. Accordingly, the embodiments are merely described below, by referring to the accompanying drawing, to explain aspects of embodiments of the present description. As used herein, the term "and/or" includes any and all combinations of one or more of the associated listed items. Expressions such as "at least one of," when preceding a list of elements, modify the entire list of elements and do not modify the individual elements of the list.

A near-infrared light-emitting diode may include a first electrode; a second electrode; and an organic layer between the first electrode and the second electrode and including an emission layer, wherein the organic layer may include a near-infrared light-emitting layer, and the near-infrared light-emitting layer may include an Os-containing organometallic compound.

The Os-containing organometallic compound may emit near-infrared light having a maximum emission wavelength in a range of 680 nanometers (nm) or greater and 3,000 nm or less. For example, the Os-containing organometallic compound may emit near-infrared light having a maximum emission wavelength in a range of 680 nm to 3,000 nm, or any range subsumed therein such as, for example, 680 nm to 850 nm.

In some embodiments, the Os-containing organometallic compound may emit near-infrared light having a maximum emission wavelength in a range of 690 nm or greater and 850 nm or less (e.g., in a range of 690 nm to 850 nm).

In some embodiments, the Os-containing organometallic compound may emit near-infrared light having a maximum emission wavelength in a range of 700 nm or greater and 850 nm or less (e.g., in a range of 700 nm to 850 nm). The Os-containing organometallic compound may be neutral. For example, the Os-containing organometallic compound may be an electrically neutral molecule.

In an embodiment, the Os-containing organometallic compound may be an organometallic compound represented by Formula 1:

$$M(L_1)_{n1}(L_2)_{n2} \qquad \text{Formula 1}$$

wherein, in Formula 1, M may be Os.

In Formula 1, $L_1$ may be selected from ligands represented by Formula 1-1:

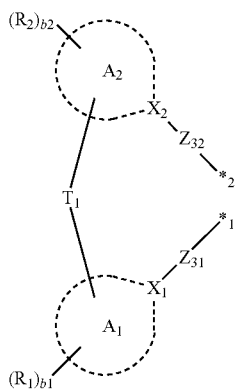

Formula 1-1

Formula 1-1 may be understood by referring to the descriptions provided herein below.

In Formula 1, n1 indicates the number of ligand(s) $L_1(s)$; and n1 may be an integer from 1 to 4. When n1 is 2 or greater, at least two $L_1(s)$ may be identical to or different from each other. In some embodiments, n1 may be 2 or 3, but embodiments are not limited thereto.

$L_2$ in Formula 1 may be an organic ligand. $L_2$ may be understood by referring to the descriptions provided herein below.

In Formula 1, n2 indicates the number of ligand(s) $L_2(s)$; and n2 may be an integer from 0 to 4. When n2 is 2 or greater, at least two $L_2(s)$ may be identical to or different from each other. In some embodiments, n2 may be 0, 1, or 2, but embodiments are not limited thereto.

In Formula 1, i) at least two selected from $L_1(s)$ in the number of n1, ii) at least two selected from $L_2(s)$ in the number of n2, or iii) at least one selected from $L_1(s)$ in the number of n1 and at least one selected from $L_2(s)$ in the number of n2 may optionally be bound via a single bond, a double bond, $*=N-*'$, $*-N=*'$, $*=C[(L_3)_{a3}-(R_3)]-*'$, $*-C[(L_3)_{a3}-(R_3)]=*'$, $*-N[(L_3)_{a3}-(R_3)]-*'$, $*-B(R_3)-*'$, $*-P(R_3)-*'$, $*-C(R_3)(R_4)-*'$, $*-Si(R_3)(R_4)-*'$, $*-Ge(R_3)(R_4)-*'$, $*-S-*'$, $*-Se-*'$, $*-O-*'$, $*-C(=O)-*'$, $*-S(=O)-*'$, $*-S(=O)_2-*'$, $*-C(R_3)=*'$, $*=C(R_3)-*'$, $*-C(R_3)=C(R_4)-*'$, $*-C(=S)-*'$, or $*-C\equiv C-*'$ to form a tridentate ligand, a tetradentate ligand, a pentadentate ligand, or a hexadentate ligand (as shown in, for example, Compounds 39 to 42 provided herein below), and * and *' may each indicate a binding site to an adjacent atom.

In Formula 1-1, ring $A_1$ and ring $A_2$ may each independently be a $C_5$-$C_{30}$ carbocyclic group or a $C_1$-$C_{30}$ heterocyclic group.

In some embodiments, the ring $A_1$ and ring $A_2$ may each independently be i) a first ring, ii) a second ring, iii) a condensed ring in which at least two first rings may be condensed (e.g., combined together), iv) a condensed ring in which at least two second rings may be condensed (e.g., combined together), or v) a condensed ring in which at least one first ring and at least one second ring may be condensed (e.g., combined together), the first ring may be a cyclopentane group, a cyclopentadiene group, a furan group, a thiophene group, a pyrrole group, a silole group, an indene group, a benzofuran group, a benzothiophene group, an indole group, a benzosilole group, an oxazole group, an isoxazole group, an oxadiazole group, an isoxadiazole group, an oxatriazole group, an isoxatriazole group, a thiazole group, an isothiazole group, a thiadiazole group, an iso-thiadiazole group, a thiatriazole group, an isothiatriazole group, a pyrazole group, an imidazole group, a triazole group, a tetrazole group, an azasilole group, a diazasilole group, or a triazasilole group, and the second ring may be an adamantane group, a norbornane group, a norbornene group, a cyclohexane group, a cyclohexene group, a cycloheptane group, a cycloheptadiene group, a cycloheptatriene group, a benzene group, a pyridine group, a pyrimidine group, a pyrazine group, a pyridazine group, a triazine group, an oxasiline group, a thiasiline group, a dihydroazasiline group, a dihydrodisiline group, a dihydrosiline group, a dioxin group, an oxathiine group, an oxazine group, a pyran group, a dithiine group, a thiazine group, a thiopyran group, a cyclohexadiene group, a dihydropyridine group, or a dihydropyrazine group.

In an embodiment, the first ring may be a pyrrole group, a thiadiazole group, a pyrazole group, an imidazole group, or a triazole group, and the second ring may be a cyclohexene group, a benzene group, a pyridine group, a pyrimidine group, a pyrazine group, or a pyridazine group, but embodiments are not limited thereto.

In one or more embodiments, the ring $A_1$ and ring $A_2$ may each independently be a benzene group, a naphthalene group, an anthracene group, a phenanthrene group, a triphenylene group, a pyrene group, a chrysene group, a perylene group, an azaperylene group, a benzoperylene group, an azabenzoperylene group, a naphthoperylene group, an azanaphthoperylene group, a cyclopentadiene group, a 1,2,3,4-tetrahydronaphthalene group, a pyrrole group, a thiophene group, a furan group, an indole group, a benzoindole group, a naphthoindole group, an isoindole group, a benzoisoindole group, a naphthoisoindole group, a benzoborole group, a benzophosphole group, an indene group, a benzosilole group, a benzogermole group, a benzothiophene group, a benzoselenophene group, a benzofuran group, a carbazole group, a dibenzoborole group, a dibenzophosphole group, a fluorene group, a dibenzosilole group, a dibenzogermole group, a dibenzothiophene group, dibenzoselenophene group, a dibenzofuran group, a dibenzothiophene 5-oxide group, 9H-fluorene-9-one group, a dibenzothiophene 5,5-dioxide group, an azacarbazole group, an azadibenzoborole group, an azadibenzophosphole group, an azafluorene group, an azadibenzosilole group, an azadibenzogermole group, an azadibenzothiophene group, an azadibenzoselenophene group, an azadibenzofuran group, an azadibenzothiophene 5-oxide group, an aza-9H-fluoren-9-one group, an azadibenzothiophene 5,5-dioxide group, a pyridine group, a pyrimidine group, a pyrazine group, a pyridazine group, a triazine group, a quinoline group, a benzoquinoline group, an isoquinoline group, a benzoisoquinoline group, a quinoxaline group, a benzoquinoxaline group, a quinazoline group, a benzoquinazoline group, a phenanthroline group, a pyrazole group, an imidazole group, a triazole group, a tetrazole group, an oxazole group, an iso-oxazole group, a thiazole group, an isothiazole group, an oxadiazole group, a thiadiazole group, a benzopyrazole group, a benzimidazole group, a benzoxazole group, a benzothiazole group, a benzoxadiazole group, a benzothiadiazole group, a 5,6,7,8-tetrahydroisoquinoline group, a 5,6,7,8-tetrahydroquinoline group, a phthalazine group, a perimidine group, an imidazopyridine group, an imidazopyrimidine group, an imidazotriazine group, an imidazopyrazine group, an imidazopyridazine group, an azulene group, or a naphthyridine group.

In one or more embodiments, the ring $A_1$ and ring $A_2$ may each independently be a benzene group, a naphthalene group, an indole group, a pyridine group, a pyrimidine group, a pyrazine group, a pyridazine group, a triazine group, a quinoline group, an isoquinoline group, an isoquinoline group, a benzoisoquinoline group, a quinoxaline group, a benzoquinoxaline group, a quinazoline group, a benzoquinazoline group, a phenanthroline group, a pyrazole group, an imidazole group, a triazole group, a tetrazole group, an oxazole group, an iso-oxazole group, a thiazole group, an isothiazole group, an oxadiazole group, a thiadiazole group, a benzopyrazole group, a benzimidazole group, a benzoxazole group, a benzothiazole group, a benzoxadiazole group, a benzothiadiazole group, a phthalazine group, a perimidine group, an imidazopyridine group, an imidazopyrimidine group, an imidazotriazine group, an imidazopyrazine group, an imidazopyridazine group, an azulene group, or a naphthyridine group, but embodiments are not limited thereto.

In Formula 1-1, $Z_{31}$ and $Z_{32}$ may each independently be a covalent bond, a coordinate bond, O, S, $C(R_7)(R_8)$, $Si(R_7)(R_8)$, $N(R_7)$, $P(R_7)$, $C(R_7)(R_8)(R_9)$, $Si(R_7)(R_8)(R_9)$, $N(R_7)(R_8)$, or $P(R_7)(R_8)$.

In an embodiment, $Z_{31}$ may be a covalent bond, O, S, $C(R_7)(R_8)$, $Si(R_7)(R_8)$, or $N(R_7)$, and $Z_{32}$ may be a coordinate bond, but embodiments are not limited thereto.

In Formula 1-1, $X_1$ and $X_2$ may each independently be C or N.

In some embodiments, $X_1$ may be C or N, and $X_2$ may be N, but embodiments are not limited thereto.

In Formula 1-1, the ring $A_1$ and $T_1$ and $T_1$ and the ring $A_2$ may each be linked via a single bond or a double bond. In some embodiments, the ring $A_1$ and $T_1$ and $T_1$ and the ring $A_2$ may each be linked via a single bond.

In Formula 1-1, $T_1$ may be a single bond, a double bond, *—N—*', *—N=*', *—C[$(L_5)_{a5}$-$(R_5)$]—*', *—C[$(L_5)_{a5}$-$(R_5)$]=*', *—N[$(L_5)_{a5}$-$(R_5)$]—*', *—B$(R_5)$—*', *—P$(R_5)$—*', *—C$(R_5)(R_6)$—*', *—Si$(R_5)(R_6)$—*', *—Ge$(R_5)(R_6)$—*', *—S—*', *—Se—*', *—O—*', *—C(=O)—*', *—S(=O)—*' *—S(=O)$_2$—*', *—C$(R_5)$=*', *—C$(R_5)$—*', *—C$(R_5)$=C$(R_6)$—*', *—C(=S)—*', or *—C≡C—*', wherein * and *' may each indicate a binding site to an adjacent atom.

In an embodiment, $T_1$ may be a single bond.

$L_3$ and $L_5$ may each independently be a single bond, a $C_5$-$C_{30}$ carbocyclic group unsubstituted or substituted with at least one $R_{10}$, or a $C_1$-$C_{30}$ heterocyclic group unsubstituted or substituted with at least one $R_{10}$, and a3 and a5 may each independently be an integer from 1 to 5.

In some embodiments, $L_3$ and $L_5$ may each independently be:

a single bond; or a benzene group, a pentalene group, an indene group, a naphthalene group, an azulene group, an indacene group, an acenaphthalene group, a fluorene group, a spiro-bifluorene group, a spiro-benzofluorene-fluorene group, a benzofluorene group, a dibenzofluorene group, a phenalene group, a phenanthrene group, an anthracene group, a fluoranthene group, a triphenylene group, a pyrene group, a chrysene group, a perylene group, a pentaphene group, a pyrrole group, a thiophene group, a furan group, a silole group, an indole group, an isoindole group, a purine group, a benzofuran group, a benzothiophene group, a benzosilole group, a dibenzofuran group, a dibenzothiophene group, a dibenzosilole group, a carbazole group, a benzocarbazole group, or a dibenzocarbazole group, each unsubstituted or substituted with at least one selected from deuterium, a $C_1$-$C_{20}$ alkyl group, a $C_1$-$C_{20}$ alkoxy group, a cyclopentyl group, a cyclohexyl group, a cycloheptyl group, a cyclopentenyl group, a cyclohexenyl group, a phenyl group, a biphenyl group, a terphenyl group, a pentalenyl group, an indenyl group, a naphthyl group, an azulenyl group, an indacenyl group, an acenaphthyl group, a fluorenyl group, a spiro-bifluorenyl group, a spiro-benzofluorene-fluorenyl group, a benzofluorenyl group, a dibenzofluorenyl group, a phenalenyl group, a phenanthrenyl group, an anthracenyl group, a fluoranthenyl group, a triphenylenyl group, a pyrenyl group, a chrysenyl group, a perylenyl group, a pentaphenyl group, a pyrrolyl group, a thiophenyl group, a furanyl group, a silolyl group, an indolyl group, an isoindolyl group, a purinyl group, a benzofuranyl group, a benzothiophenyl group, a benzosilolyl group, a dibenzofuranyl group, a dibenzothiophenyl group, a dibenzosilolyl group, a carbazolyl group, a benzocarbazolyl group, a dibenzocarbazolyl group, —Si$(Q_{51})(Q_{52})(Q_{53})$, —N$(Q_{51})(Q_{52})$, and —B$(Q_{51})(Q_{52})$;

a3 and a5 may each independently be 1, 2, or 3.

$R_1$ to $R_{10}$ may each independently be hydrogen, deuterium, —F, —Cl, —Br, —I, a hydroxyl group, a cyano group, a nitro group, an amidino group, a hydrazine group, a hydrazone group, a substituted or unsubstituted $C_1$-$C_{60}$ alkyl group, a substituted or unsubstituted $C_2$-$C_{60}$ alkenyl group, a substituted or unsubstituted $C_2$-$C_{60}$ alkynyl group, a substituted or unsubstituted $C_1$-$C_{60}$ alkoxy group, a substituted or unsubstituted $C_3$-$C_{10}$ cycloalkyl group, a substituted or unsubstituted $C_1$-$C_{10}$ heterocycloalkyl group, a substituted or unsubstituted $C_3$-$C_{10}$ cycloalkenyl group, a substituted or unsubstituted $C_1$-$C_{10}$ heterocycloalkenyl group, a substituted or unsubstituted $C_6$-$C_{60}$ aryl group, a substituted or unsubstituted $C_6$-$C_{60}$ aryloxy group, a substituted or unsubstituted $C_6$-$C_{60}$ arylthio group, a substituted or unsubstituted $C_1$-$C_{60}$ heteroaryl group, a substituted or unsubstituted monovalent non-aromatic condensed polycyclic group, a substituted or unsubstituted monovalent non-aromatic condensed heteropolycyclic group, —Si$(Q_1)(Q_2)(Q_3)$, —N$(Q_1)(Q_2)$, —B$(Q_1)(Q_2)$, —C(=O)$_2(Q_1)$, —S(=O)$_2(Q_1)$, or —P(=O)$(Q_1)(Q_2)$, wherein $Q_1$ to $Q_3$ may respectively be understood by referring to the descriptions therefor provided herein.

In some embodiments, $R_1$ to $R_6$ and $R_{10}$ may each independently be:

hydrogen, deuterium, —F, —Cl, —Br, —I, a hydroxyl group, a cyano group, a nitro group, an amidino group, a hydrazine group, or a hydrazone group;

a $C_1$-$C_{10}$ alkyl group, a $C_2$-$C_{10}$ alkenyl group, a $C_2$-$C_{10}$ alkynyl group, or a $C_1$-$C_{10}$ alkoxy group, each unsubstituted or substituted with at least one selected from deuterium, —F, —Cl, —Br, —I, —CD$_3$, —CD$_2$H, —CDH$_2$, —CF$_3$, —CF$_2$H, —CFH$_2$, a hydroxyl group, a cyano group, a nitro group, an amidino group, a hydrazine group, a hydrazone group, a cyclopentyl group, a cyclohexyl group, a cycloheptyl group, a cyclooctyl group, an adamantanyl group, a norbornanyl group, a norbornenyl group, a cyclopentenyl group, a cyclohexenyl group, a cycloheptenyl group, a tetrahydro-2H-pyranyl group, a morpholinyl group, a phenyl group, a ($C_1$-$C_{10}$ alkyl)phenyl group, a di($C_1$-$C_{10}$ alkyl)phenyl group, a biphenyl group, a di(phenyl)phenyl group, a terphenyl group, a naphthyl group, a pyridinyl group, a pyrimidinyl group, —O$(Q_{31})$, —S$(Q_{31})$, —Si$(Q_{31})(Q_{32})(Q_{33})$, —N$(Q_{31})(Q_{32})$, —B$(Q_{31})(Q_{32})$, —P$(Q_{31})(Q_{32})$, —C(=O)$(Q_{31})$, —S(=O)$_2(Q_{31})$, and —P(=O)$(Q_{31})(Q_{32})$;

a cyclopentyl group, a cyclohexyl group, a cycloheptyl group, a cyclooctyl group, an adamantanyl group, a norbornanyl group, a norbornenyl group, a cyclopentenyl group, a cyclohexenyl group, a cycloheptenyl group, a tetrahydro-2H-pyranyl group, a morpholinyl group, a dioxanyl group, a phenyl group, a (C₁-C₁₀ alkyl)phenyl group, a di(C₁-C₁₀ alkyl)phenyl group, a biphenyl group, a di(phenyl)phenyl group, a terphenyl group, a naphthyl group, a fluorenyl group, a phenanthrenyl group, an anthracenyl group, a fluoranthenyl group, a triphenylenyl group, a pyrenyl group, a chrysenyl group, a pyrrolyl group, a thiophenyl group, a furanyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, an isoindolyl group, an indolyl group, an indazolyl group, a purinyl group, a quinolinyl group, an isoquinolinyl group, a benzoquinolinyl group, a quinoxalinyl group, a quinazolinyl group, a cinnolinyl group, a carbazolyl group, a phenanthrolinyl group, a benzimidazolyl group, a benzofuranyl group, a benzothiophenyl group, an isobenzothiazolyl group, a benzoxazolyl group, an isobenzoxazolyl group, a triazolyl group, a tetrazolyl group, an oxadiazolyl group, a triazinyl group, a dibenzofuranyl group, a dibenzothiophenyl group, a benzocarbazolyl group, a dibenzocarbazolyl group, an imidazopyridinyl group, an imidazopyrimidinyl group, a 2,3-dihydro-1H-indenyl group, a 1,2,3,4-tetrahydronaphthalenyl group, a 2,3-dihydrobenzodioxinyl group, or a benzodioxanyl group, each unsubstituted or substituted with at least one selected from deuterium, —F, —Cl, —Br, —I, —CD₃, —CD₂H, —CDH₂, —CF₃, —CF₂H, —CFH₂, a hydroxyl group, a cyano group, a nitro group, an amidino group, a hydrazine group, a hydrazone group, a C₁-C₁₀ alkyl group, a C₂-C₁₀ alkenyl group, a C₂-C₁₀ alkynyl group, a C₁-C₁₀ alkoxy group, a cyclopentyl group, a cyclohexyl group, a cycloheptyl group, a cyclooctyl group, an adamantanyl group, a norbornanyl group, a norbornenyl group, a cyclopentenyl group, a cyclohexenyl group, a cycloheptenyl group, a tetrahydro-2H-pyranyl group, a morpholinyl group, a dioxanyl group, a phenyl group, a (C₁-C₁₀ alkyl)phenyl group, a di(C₁-C₁₀ alkyl)phenyl group, a biphenyl group, a di(phenyl)phenyl group, a terphenyl group, a naphthyl group, a fluorenyl group, a phenanthrenyl group, an anthracenyl group, a fluoranthenyl group, a triphenylenyl group, a pyrenyl group, a chrysenyl group, a pyrrolyl group, a thiophenyl group, a furanyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, an isoindolyl group, an indolyl group, an indazolyl group, a purinyl group, a quinolinyl group, an isoquinolinyl group, a benzoquinolinyl group, a quinoxalinyl group, a quinazolinyl group, a cinnolinyl group, a carbazolyl group, a phenanthrolinyl group, a benzimidazolyl group, a benzofuranyl group, a benzothiophenyl group, an isobenzothiazolyl group, a benzoxazolyl group, an isobenzoxazolyl group, a triazolyl group, a tetrazolyl group, an oxadiazolyl group, a triazinyl group, a dibenzofuranyl group, a dibenzothiophenyl group, a benzocarbazolyl group, a dibenzocarbazolyl group, an imidazopyridinyl group, an imidazopyrimidinyl group, a 2,3-dihydro-1H-indenyl group, a 1,2,3,4-tetrahydronaphthalenyl group, a 2,3-dihydrobenzodioxinyl group, a benzodioxanyl group, —O(Q₃₁), —S(Q₃₁), —Si(Q₃₁)(Q₃₂)(Q₃₃), —N(Q₃₁)(Q₃₂), —B(Q₃₁)(Q₃₂), —P(Q₃₁)(Q₃₂), —C(=O)(Q₃₁), —S(=O)₂(Q₃₁), and —P(=O)(Q₃₁)(Q₃₂); or —O(Q₁), —S(Q₁), —Si(Q₁)(Q₂)(Q₃), —N(Q₁)(Q₂), —B(Q₁)(Q₂), —P(Q₁)(Q₂), —C(=O)(Q₁), —S(=O)₂(Q₁), or —P(=O)(Q₁)(Q₂), wherein Q₁ to Q₃ and Q₃₁ to Q₃₃ may each independently be hydrogen, deuterium, —F, —Cl, —Br, —I, —CD₃, —CD₂H, —CDH₂, —CF₃, —CF₂H, —CFH₂, a hydroxyl group, a cyano group, a nitro group, an amidino group, a hydrazine group, a hydrazone group, a C₁-C₁₀ alkyl group, a C₂-C₁₀ alkenyl group, a C₂-C₁₀ alkynyl group, a C₁-C₁₀ alkoxy group, a cyclopentyl group, a cyclohexyl group, a cycloheptyl group, a cyclooctyl group, an adamantanyl group, a norbornanyl group, a norbornenyl group, a cyclopentenyl group, a cyclohexenyl group, a cycloheptenyl group, a tetrahydro-2H-pyranyl group, a morpholinyl group, a dioxanyl group, a phenyl group, a (C₁-C₁₀ alkyl)phenyl group, a di(C₁-C₁₀ alkyl)phenyl group, a biphenyl group, a di(phenyl)phenyl group, a terphenyl group, a naphthyl group, a fluorenyl group, a phenanthrenyl group, an anthracenyl group, a fluoranthenyl group, a triphenylenyl group, a pyrenyl group, a chrysenyl group, a pyrrolyl group, a thiophenyl group, a furanyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, an isoindolyl group, an indolyl group, an indazolyl group, a purinyl group, a quinolinyl group, an isoquinolinyl group, a benzoquinolinyl group, a quinoxalinyl group, a quinazolinyl group, a cinnolinyl group, a carbazolyl group, a phenanthrolinyl group, a benzimidazolyl group, a benzofuranyl group, a benzothiophenyl group, an isobenzothiazolyl group, a benzoxazolyl group, an isobenzoxazolyl group, a triazolyl group, a tetrazolyl group, an oxadiazolyl group, a triazinyl group, a dibenzofuranyl group, a dibenzothiophenyl group, a benzocarbazolyl group, a dibenzocarbazolyl group, an imidazopyridinyl group, an imidazopyrimidinyl group, a 2,3-dihydro-1H-indenyl group, a 1,2,3,4-tetrahydronaphthalenyl group, a 2,3-dihydrobenzodioxinyl group, or a benzodioxanyl group.

In an embodiment, R₁ to R₆ and R₁₀ may each independently be hydrogen, deuterium, —F, —Cl, —Br, —I, —CH₃, —CD₃, —CD₂H, —CDH₂, —CF₃, —CF₂H, —CFH₂, a hydroxyl group, a cyano group, a nitro group, an amidino group, a hydrazine group, a hydrazone group, or one of groups represented by Formulae 3-1(1) to 3-1(29), 3-2(1) to 3-2(21), 3-3(1) to 3-3(19), 3-4(1) to 3-4(4), 3-5(1) to 3-5(107), 3-6(1) to 3-6(10), and 3-7(1) to 3-7(27), but embodiments are not limited thereto:

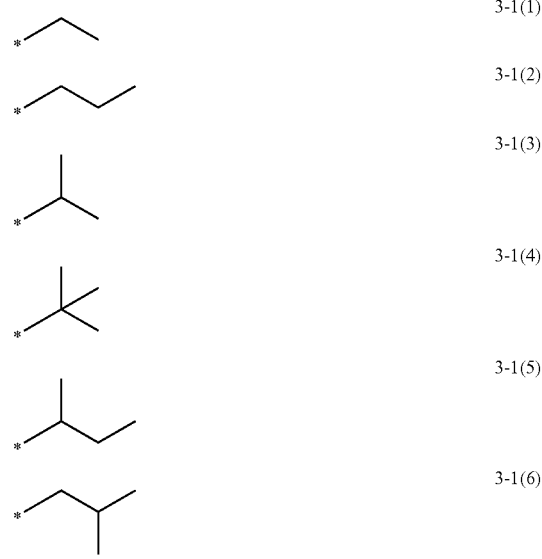

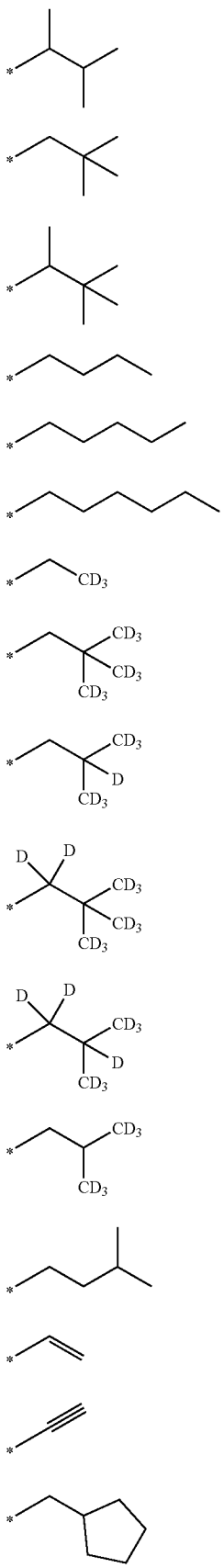
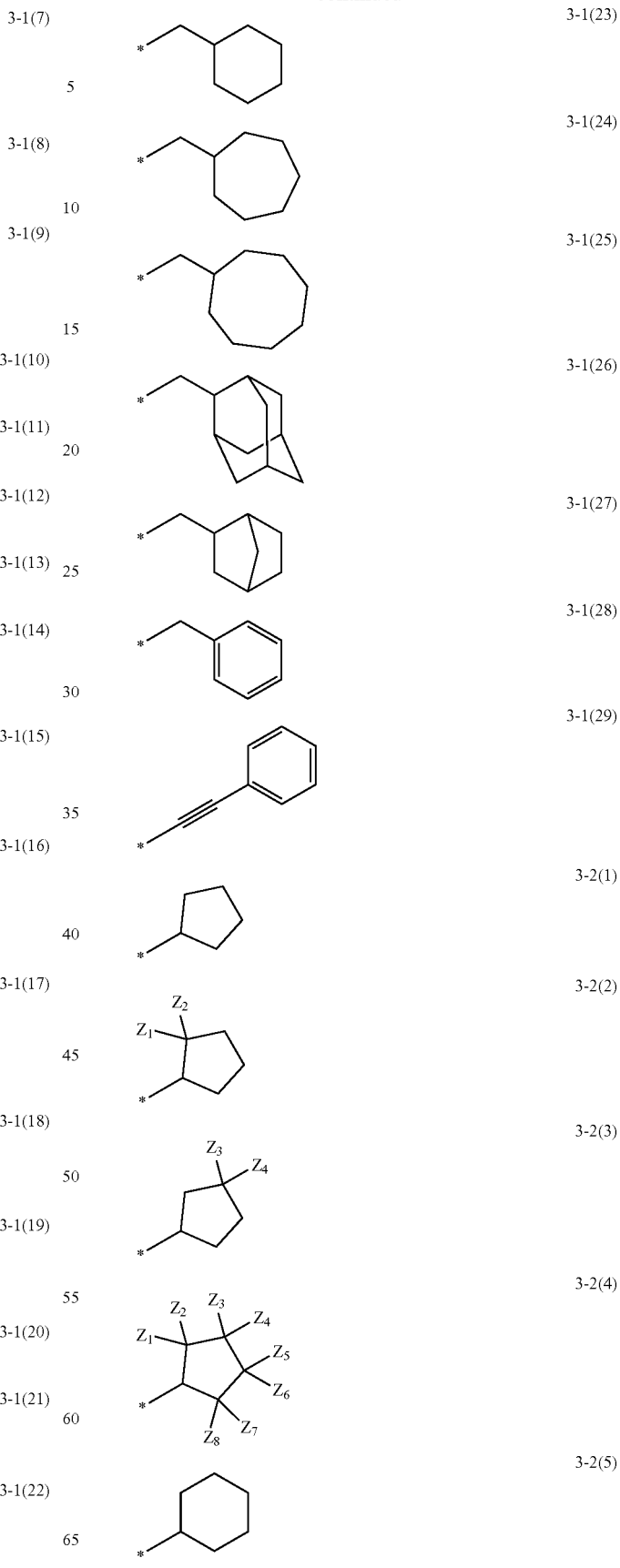

-continued
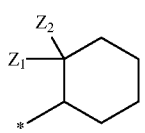 3-2(6)
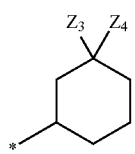 3-2(7)
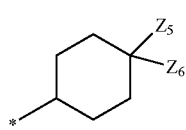 3-2(8)
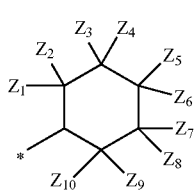 3-2(9)
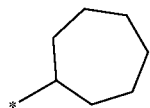 3-2(10)
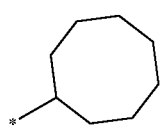 3-2(11)
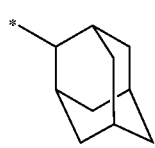 3-2(12)
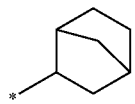 3-2(13)
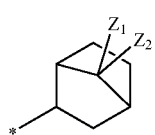 3-2(14)
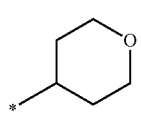 3-2(15)
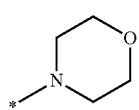 3-2(16)
-continued
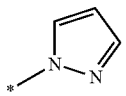 3-2(17)
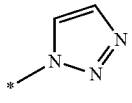 3-2(18)
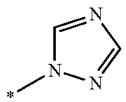 3-2(19)
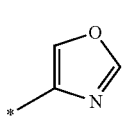 3-2(20)
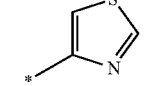 3-2(21)
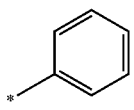 3-3(1)
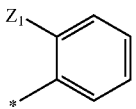 3-3(2)
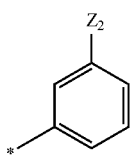 3-3(3)
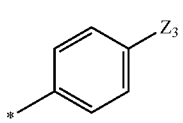 3-3(4)
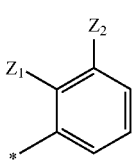 3-3(5)
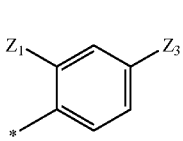 3-3(6)
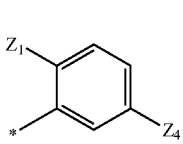 3-3(7)

-continued
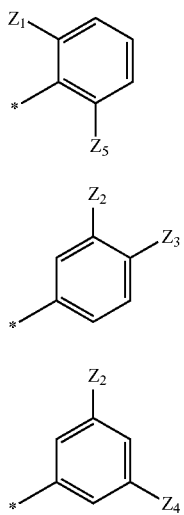
3-3(8)
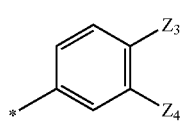
3-3(9)
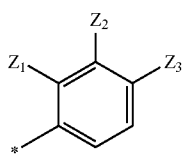
3-3(10)
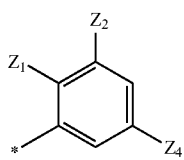
3-3(11)
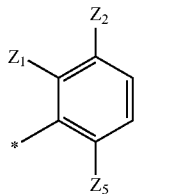
3-3(12)
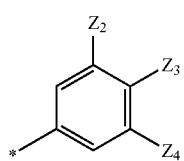
3-3(13)
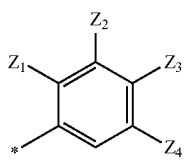
3-3(14)
3-3(15)
3-3(16)
-continued
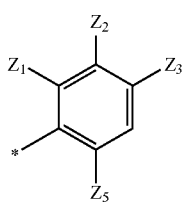
3-3(17)
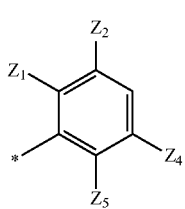
3-3(18)
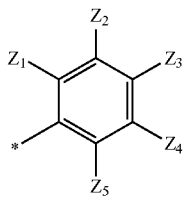
3-3(19)
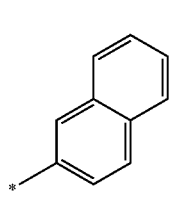
3-4(1)
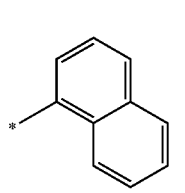
3-4(2)
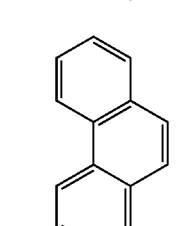
3-4(3)
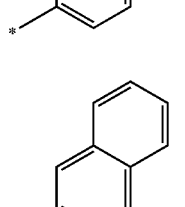
3-4(4)
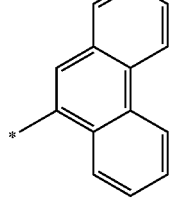
3-5(1)
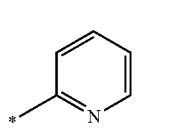

-continued
3-5(2) 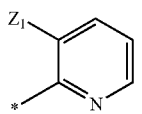
3-5(3) 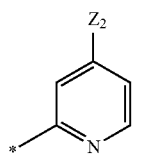
3-5(4) 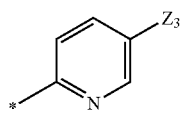
3-5(5) 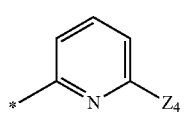
3-5(6) 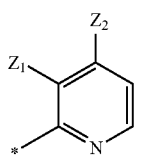
3-5(7) 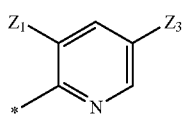
3-5(8) 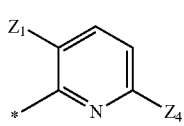
3-5(9) 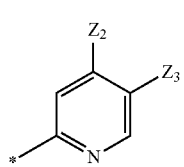
3-5(10) 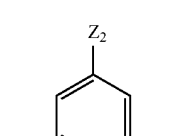
3-5(11) 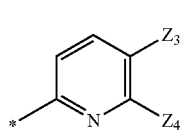
-continued
3-5(12) 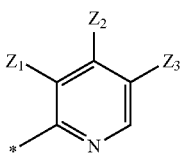
3-5(13) 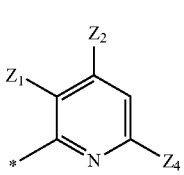
3-5(14) 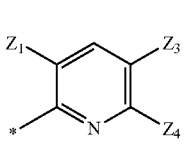
3-5(15) 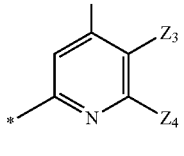
3-5(16) 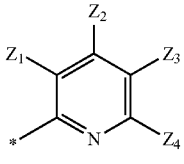
3-5(17) 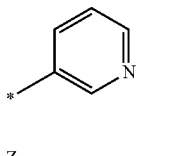
3-5(18) 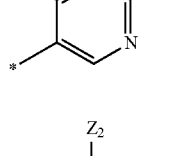
3-5(19) 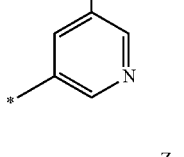
3-5(20) 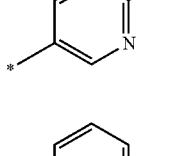
3-5(21) 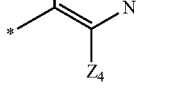

-continued
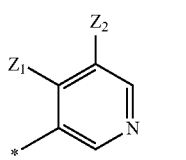
3-5(22)
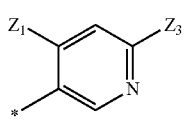
3-5(23)
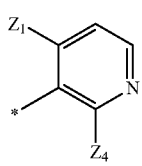
3-5(24)
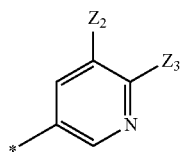
3-5(25)
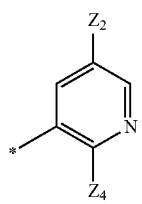
3-5(26)
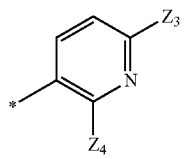
3-5(27)
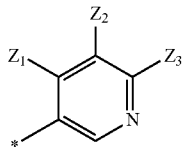
3-5(28)
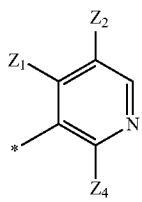
3-5(29)
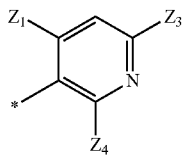
3-5(30)
-continued
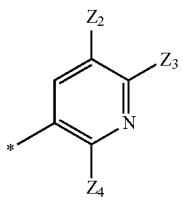
3-5(31)
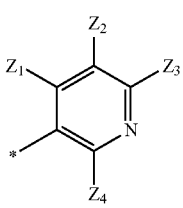
3-5(32)
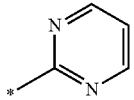
3-5(33)
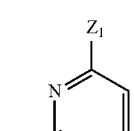
3-5(34)
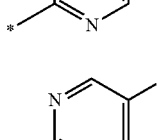
3-5(35)
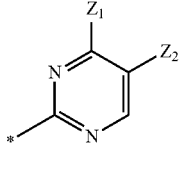
3-5(36)
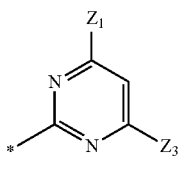
3-5(37)
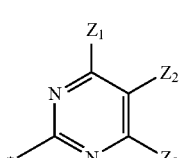
3-5(38)
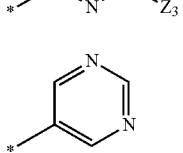
3-5(39)
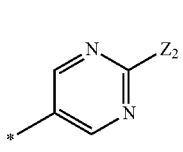
3-5(40)

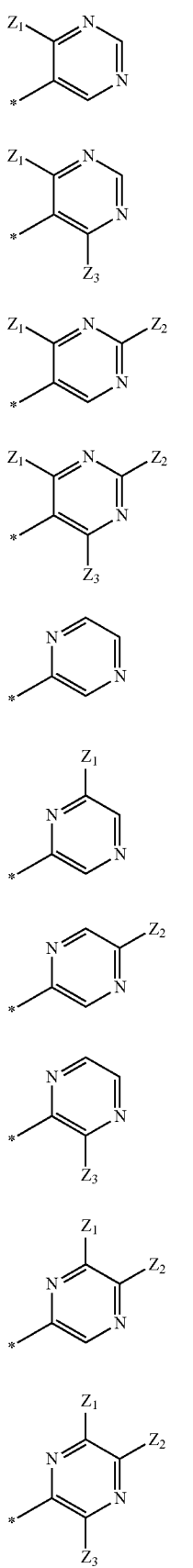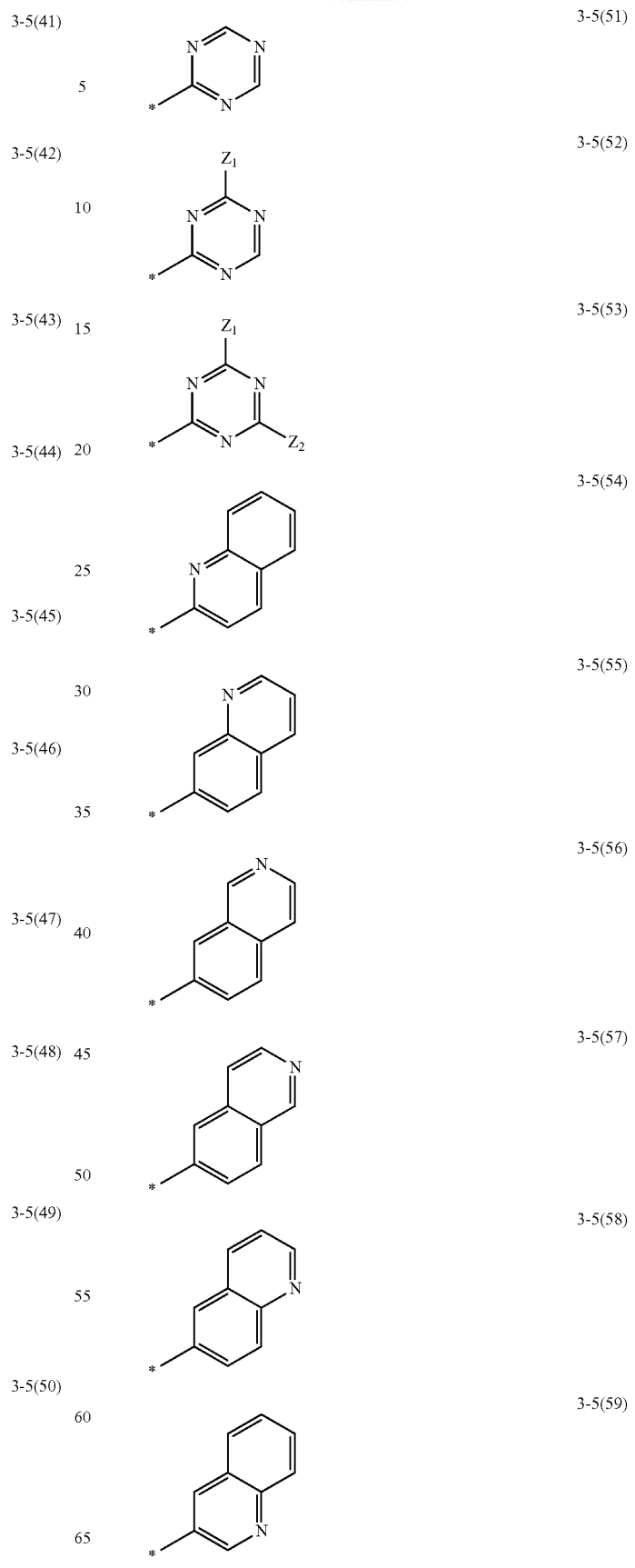
3-5(41)
3-5(42)
3-5(43)
3-5(44)
3-5(45)
3-5(46)
3-5(47)
3-5(48)
3-5(49)
3-5(50)
3-5(51)
3-5(52)
3-5(53)
3-5(54)
3-5(55)
3-5(56)
3-5(57)
3-5(58)
3-5(59)

21
-continued
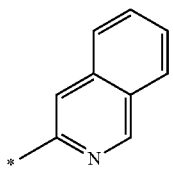 3-5(60)
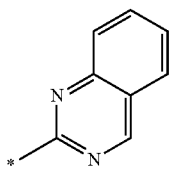 3-5(61)
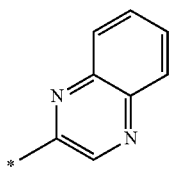 3-5(62)
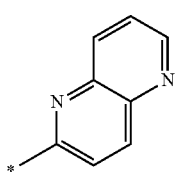 3-5(63)
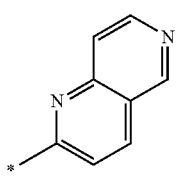 3-5(64)
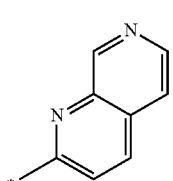 3-5(65)
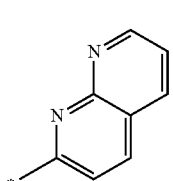 3-5(66)
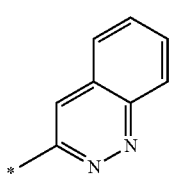 3-5(67)
22
-continued
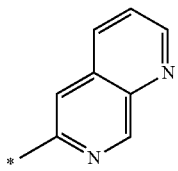 3-5(68)
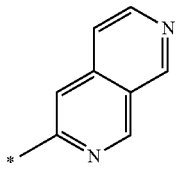 3-5(69)
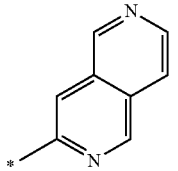 3-5(70)
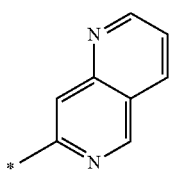 3-5(71)
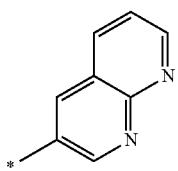 3-5(72)
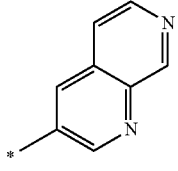 3-5(73)
3-5(74)
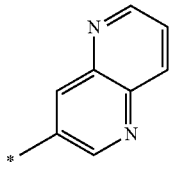 3-5(75)

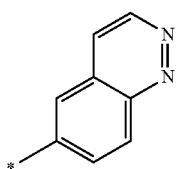 3-5(76)
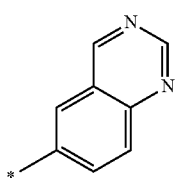 3-5(77)
 3-5(78)
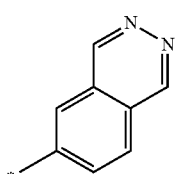 3-5(79)
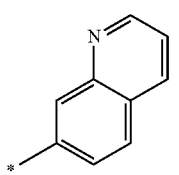 3-5(80)
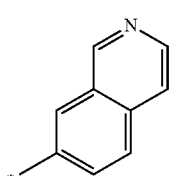 3-5(81)
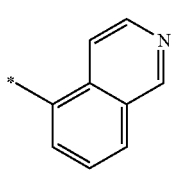 3-5(82)
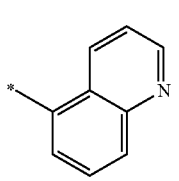 3-5(83)
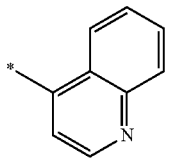 3-5(84)
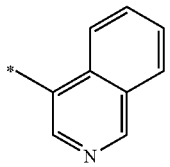 3-5(85)
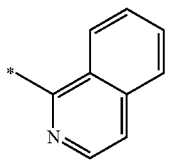 3-5(86)
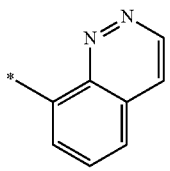 3-5(87)
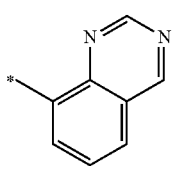 3-5(88)
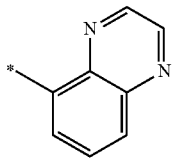 3-5(89)
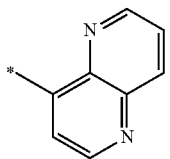 3-5(90)
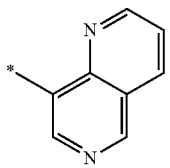 3-5(91)
3-5(92)

3-5(93) 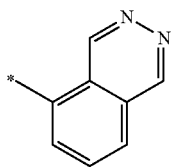
3-5(94) 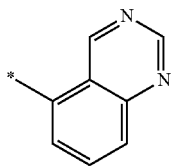
3-5(95) 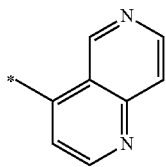
3-5(96) 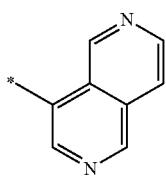
3-5(97) 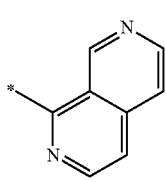
3-5(98) 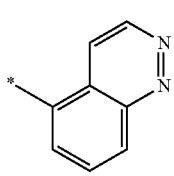
3-5(99) 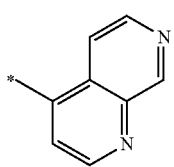
3-5(100) 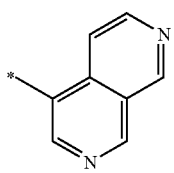
3-5(101) 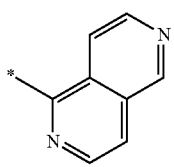
3-5(102) 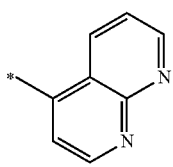
3-5(103) 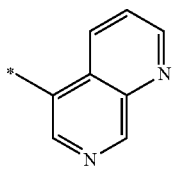
3-5(104) 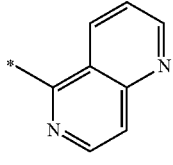
3-5(105) 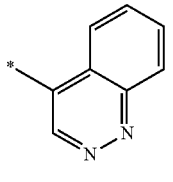
3-5(106) 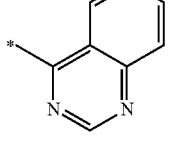
3-5(107) 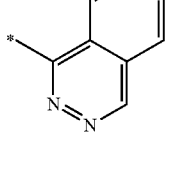
3-6(1) 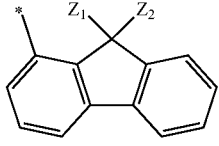
3-6(2) 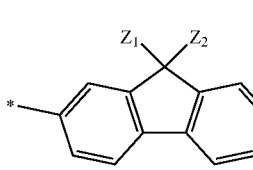
3-6(3) 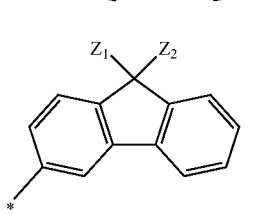

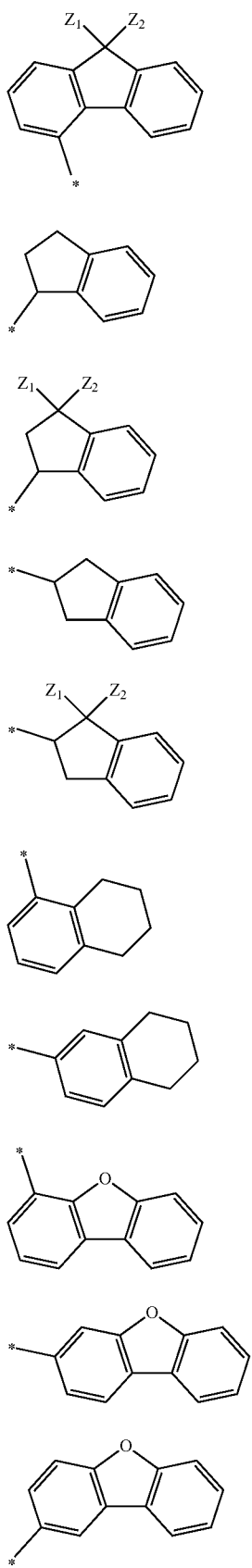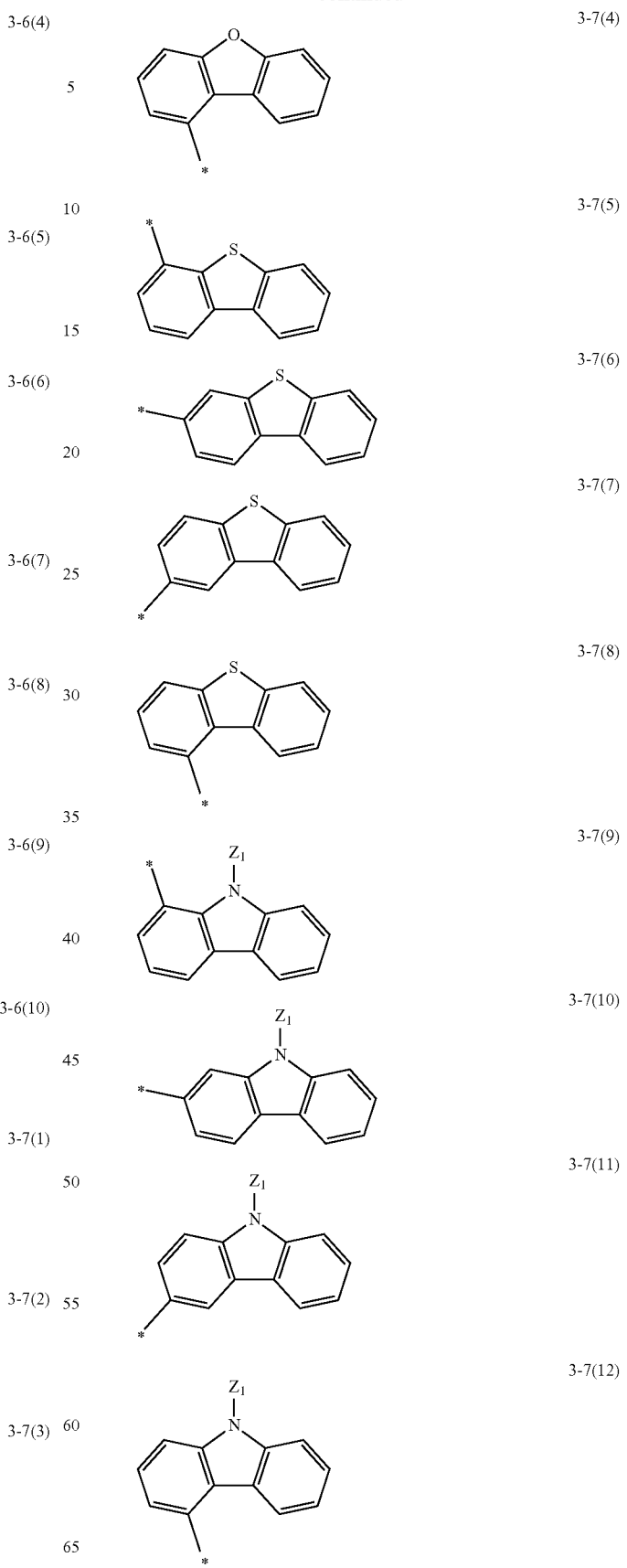

-continued 3-7(13) 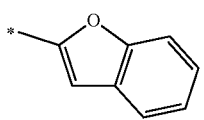

3-7(14) 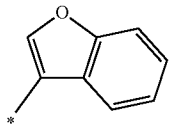

3-7(15) 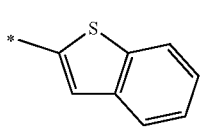

3-7(16) 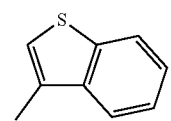

3-7(17) 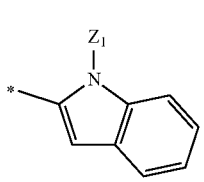

3-7(18) 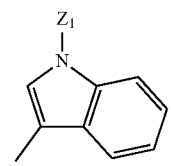

3-7(19) 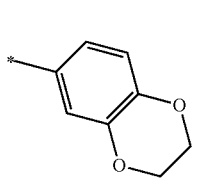

3-7(20) 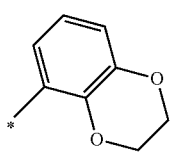

3-7(21) 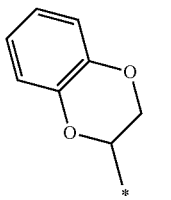

3-7(22) 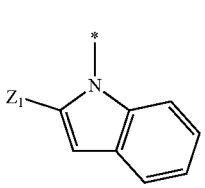

-continued 3-7(23) 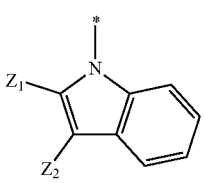

3-7(24) 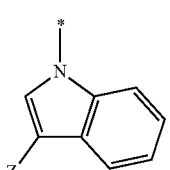

3-7(25) 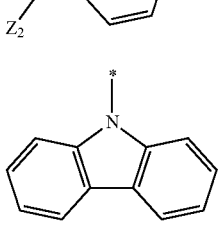

3-7(26) 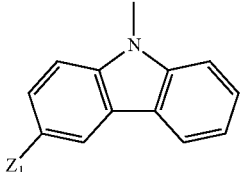

3-7(27) 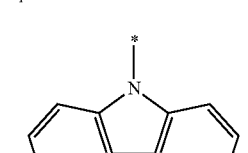

In Formulae 3-1(1) to 3-1(29), 3-2(1) to 3-2(21), 3-3(1) to 3-3(19), 3-4(1) to 3-4(4), 3-5(1) to 3-5(107), 3-6(1) to 3-6(10) and 3-7(1) to 3-7(27), $Z_1$ to $Z_{10}$ may each independently be deuterium, —F, —Cl, —Br, —I, —CD$_3$, —CD$_2$H, —CDH$_2$, —CF$_3$, —CF$_2$H, —CFH$_2$, a hydroxyl group, a cyano group, a nitro group, an amidino group, a hydrazine group, a hydrazone group, a $C_1$-$C_{10}$ alkyl group, a $C_2$-$C_{10}$ alkenyl group, a $C_2$-$C_{10}$ alkynyl group, a $C_1$-$C_{10}$ alkoxy group, a cyclopentyl group, a cyclohexyl group, a cycloheptyl group, a cyclooctyl group, an adamantanyl group, a norbornanyl group, a norbornenyl group, a cyclopentenyl group, a cyclohexenyl group, a cycloheptenyl group, a tetrahydro-2H-pyranyl group, a morpholinyl group, a dioxanyl group, a phenyl group, a ($C_1$-$C_{10}$ alkyl)phenyl group, a di($C_1$-$C_{10}$ alkyl)phenyl group, a biphenyl group, a di(phenyl)phenyl group, a terphenyl group, a naphthyl group, a fluorenyl group, a phenanthrenyl group, an anthracenyl group, a fluoranthenyl group, a triphenylenyl group, a pyrenyl group, a chrysenyl group, a pyrrolyl group, a thiophenyl group, a furanyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, an isoindolyl group, an indolyl group, an indazolyl group, a purinyl group, a quinolinyl group, an isoquinolinyl group, a benzoquinolinyl group, a quinoxalinyl group, a quinazolinyl group, a cinnolinyl group, a carbazolyl group, a phenanthrolinyl group, a benzimidazolyl group, a benzofuranyl group, a benzothiophenyl group, an isobenzothiazolyl group, a benzoxazolyl group, an isobenzoxazolyl group, a triazolyl group, a tetrazolyl group, an oxadiazolyl group, a triazinyl group, a dibenzofuranyl group, a dibenzothiophenyl group, a benzocarbazolyl group, a dibenzocarbazolyl group, an imidazopyridinyl group, an imidazopyrimidinyl group, a 2,3-dihydro-1H-indenyl group, 1,2,3,4-tetrahydronaphthalenyl group, a 2,3-dihydrobenzodioxinyl group, a benzodioxanyl group, $-O(Q_{31})$, $-S(Q_{31})$, $-Si(Q_{31})(Q_{32})(Q_{33})$, $-N(Q_{31})(Q_{32})$, $-B(Q_{31})(Q_{32})$, $-P(Q_{31})(Q_{32})$, $-C(=O)(Q_{31})$, $-S(=O)_2(Q_{31})$, or $-P(=O)(Q_{31})(Q_{32})$, wherein $Q_{31}$ to $Q_{33}$ may respectively be understood by referring to the descriptions therefor provided herein, and

* indicates a binding site to an adjacent atom.

Two adjacent groups selected from $R_1$ to $R_{10}$ may optionally be bound to form a $C_5$-$C_{30}$ carbocyclic group unsubstituted or substituted with at least one $R_{10a}$ or a $C_1$-$C_{30}$ heterocyclic group unsubstituted or substituted with at least one $R_{10a}$, for example, a benzene group, a naphthalene group, an indole group, a pyridine group, a pyrimidine group, a pyrazine group, a pyridazine group, a triazine group, a quinoline group, a benzoquinoline group, an isoquinoline group, a benzoisoquinoline group, a quinoxaline group, a benzoquinoxaline group, a quinazoline group, a benzoquinazoline group, a phenanthroline group, a pyrazole group, an imidazole group, a triazole group, a tetrazole group, an oxazole group, an iso-oxazole group, a thiazole group, an isothiazole group, an oxadiazole group, a thiadiazole group, a benzopyrazole group, a benzimidazole group, a benzoxazole group, a benzothiazole group, a benzoxadiazole group, a benzothiadiazole group, a phthalazine group, a perimidine group, an imidazopyridine group, an imidazopyrimidine group, an imidazotriazine group, an imidazopyrazine group, an imidazopyridazine group, an azulene group, or a naphthyridine group, each unsubstituted or substituted with at least one $R_{10a}$. Here, $R_{10a}$ may be understood by referring to the descriptions for $R_{10}$ provided herein.

b1 and b2 in Formula 1-1 may each indicate the number of $R_1$(s) and $R_2$(s), respectively. b1 and b2 may each independently be an integer from 0 to 10. When b1 is 2 or greater, at least two $R_1$(s) may be identical to or different from each other. When b2 is 2 or greater, at least two $R_2$(s) may be identical to or different from each other. In an embodiment, b1 and b2 may each independently be an integer from 0 to 4, but embodiments are not limited thereto.

In Formula 1-1, *¹ and *² may each indicate a binding site to M in Formula 1.

A bond between M in Formula 1 and $Z_{31}$ or $X_1$ in Formula 1-1 and a bond between M in Formula 1 and $Z_{32}$ or $X_2$ in Formula 1-1 may each independently be a covalent bond or a coordinate bond (e.g., a coordinate covalent bond or dative bond).

In some embodiments, a bond between M in Formula 1 and $Z_{31}$ or $X_1$ in Formula 1-1 may be a covalent bond, and a bond between M in Formula 1 and $Z_{32}$ or $X_2$ in Formula 1-1 may be a coordinate bond, but embodiments are not limited thereto.

In an embodiment, a moiety represented by

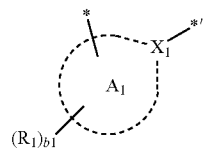

in Formula 1-1 may be selected from groups represented by Formulae A1-1 to A1-56 (e.g., may be selected from groups represented by Formulae A1-1, A1-8, A1-31 to A1-33, A1-46 to A1-48, A1-52, A1-53, and A1-56):

A1-1

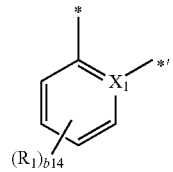

A1-2

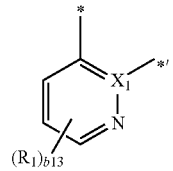

A1-3

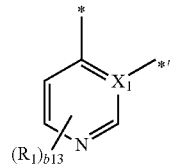

A1-4

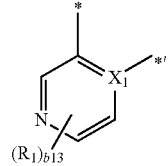

A1-5

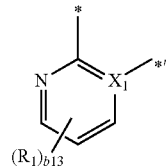

A1-6

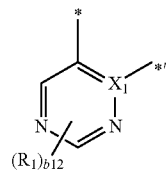

-continued
A1-7
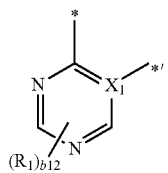
A1-8
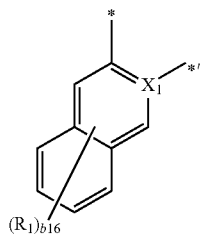
A1-9
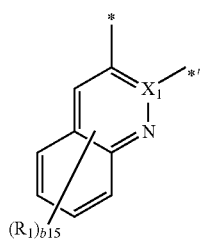
A1-10
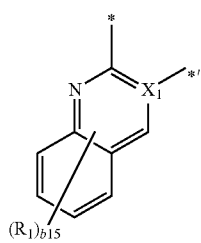
A1-11
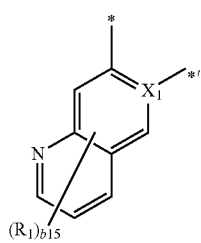
A1-12
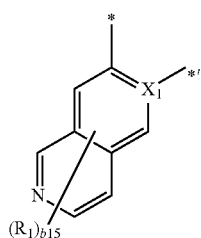
A1-13
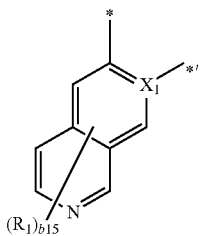
A1-14
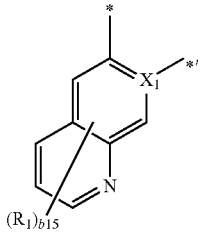
A1-15
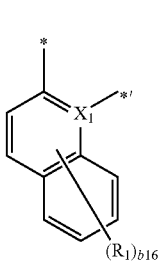
A1-16
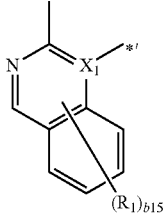
A1-17
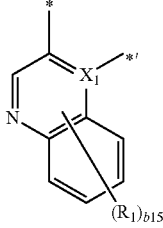
A1-18
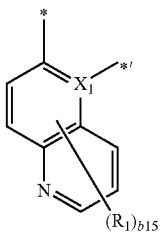

-continued
A1-19
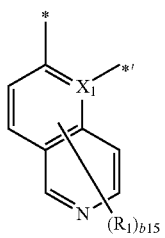
A1-20
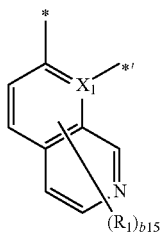
A1-21
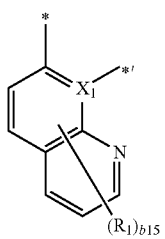
A1-22
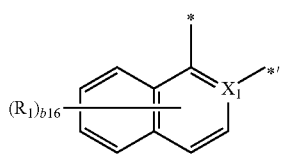
A1-23
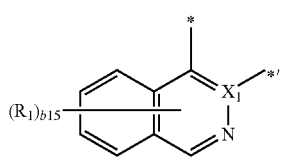
A1-24
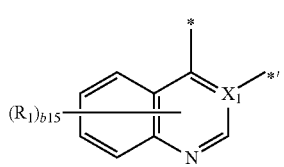
A1-25
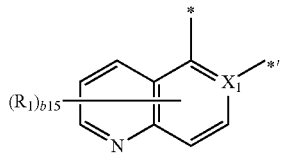
A1-26
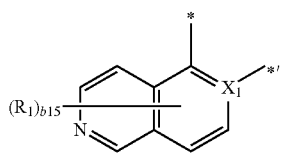
-continued
A1-27
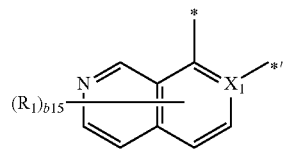
A1-28
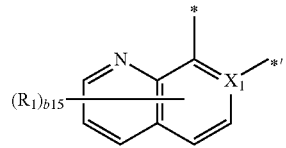
A1-29
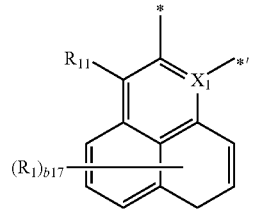
A1-30
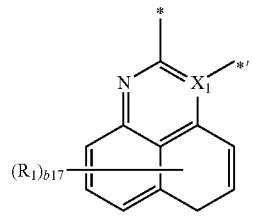
A1-31
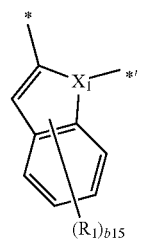
A1-32
A1-33

A1-34 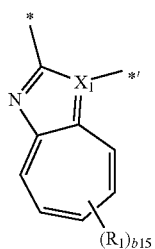
A1-35 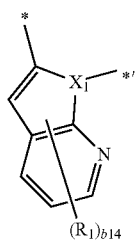
A1-36 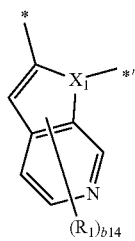
A1-37 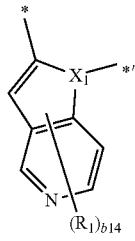
A1-38 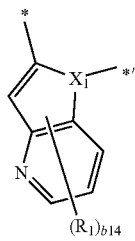
A1-39 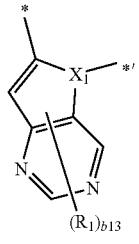
A1-40 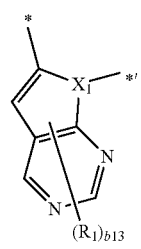
A1-41 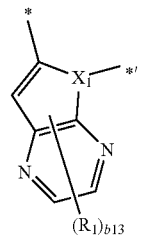
A1-42 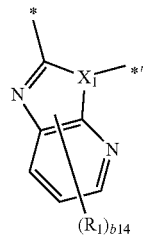
A1-43 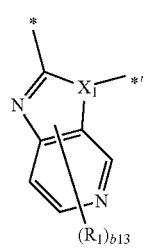
A1-44 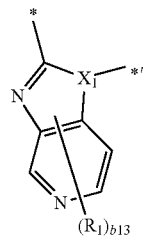
A1-45 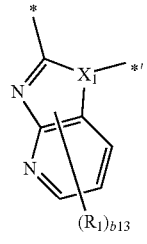

-continued

A1-46 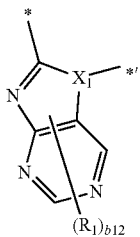

A1-47 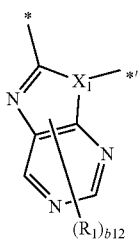

A1-48 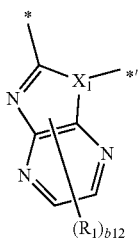

A1-49 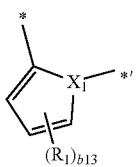

A1-50 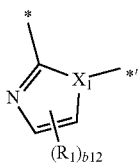

A1-51 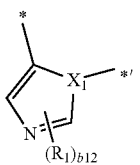

A1-52 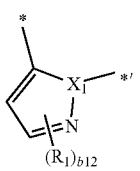

-continued

A1-53 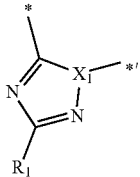

A1-54 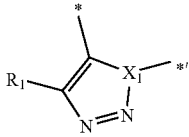

A1-55 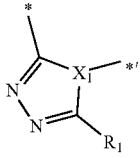

A1-56 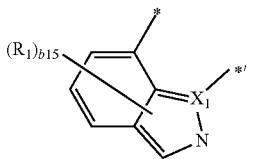

wherein in Formulae A1-1 to A1-56,
$X_1$ and $R_1$ may respectively be understood by referring to the descriptions therefor provided herein,
b12 may be an integer from 0 to 2,
b13 may be an integer from 0 to 3,
b14 may be an integer from 0 to 4,
b15 may be an integer from 0 to 5,
b16 may be an integer from 0 to 6,
b17 may be an integer from 0 to 7,
*' indicates a binding site to $Z_{31}$ in Formula 1-1, and
* indicates a binding site to $T_1$ in Formula 1-1.
In one or more embodiments, a moiety represented by

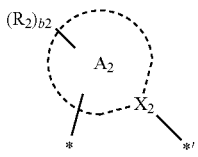

in Formula 1-1 may be selected from groups represented by Formulae A2-1 to A2-50 (e.g., groups represented by Formulae A2-1, A2-2, A2-8, A2-9, A2-11, A2-17, A2-22, A2-41, A2-43, and A2-44 to A2-50):

A2-1 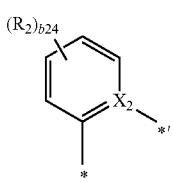

A2-2
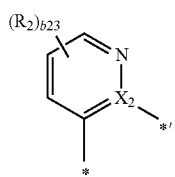
A2-3
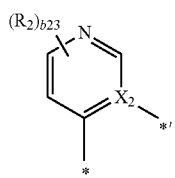
A2-4
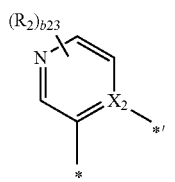
A2-5
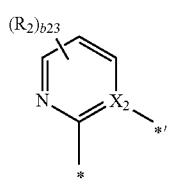
A2-6
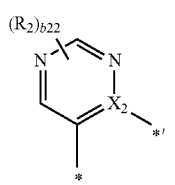
A2-7
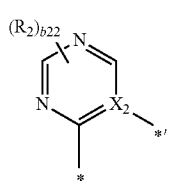
A2-8
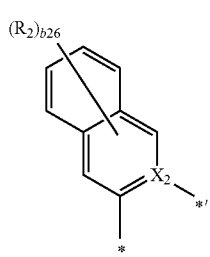
A2-9
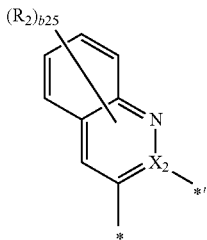
A2-10
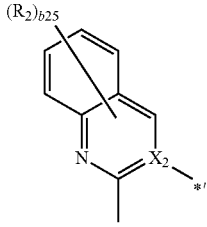
A2-11
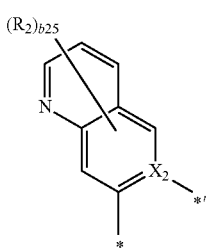
A2-12
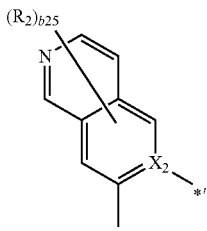
A2-13
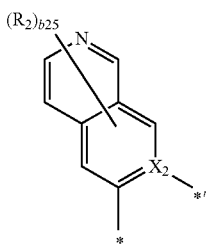
A2-14
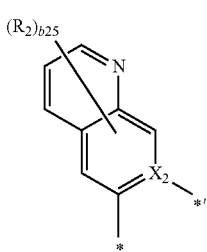

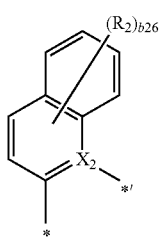 A2-15
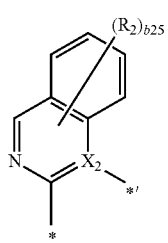 A2-16
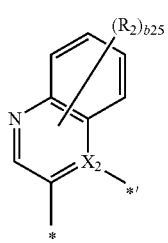 A2-17
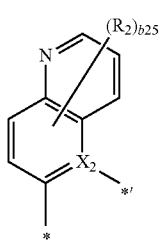 A2-18
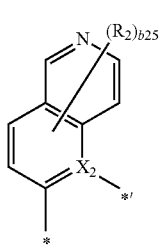 A2-19
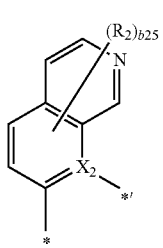 A2-20
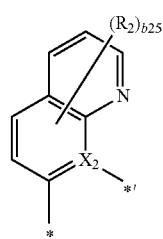 A2-21
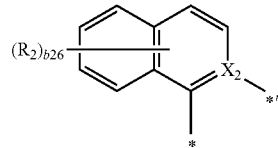 A2-22
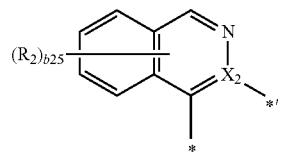 A2-23
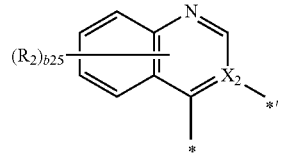 A2-24
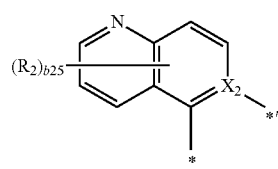 A2-25
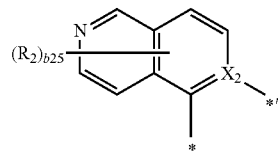 A2-26
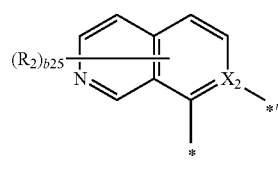 A2-27
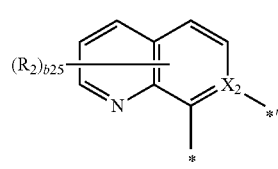 A2-28

A2-29 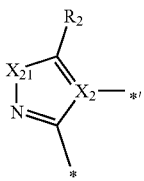
A2-30 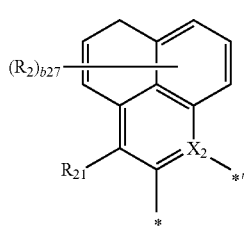
A2-38 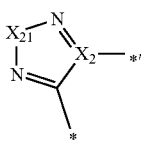
A2-31 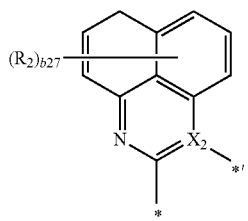
A2-39 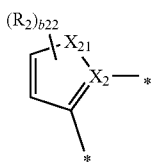
A2-32 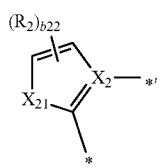
A2-40 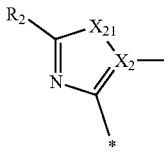
A2-33 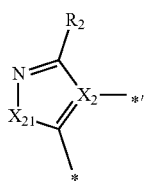
A2-41 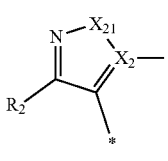
A2-34 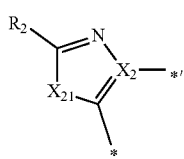
A2-42 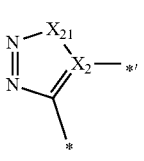
A2-35 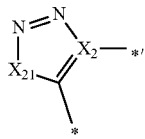
A2-43 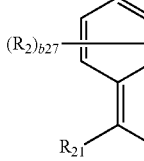
A2-36 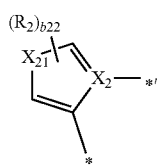
A2-44 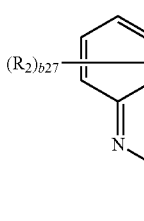
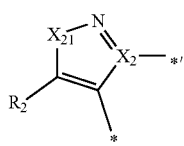

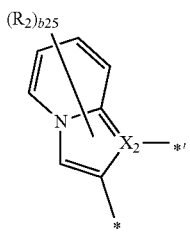

A2-45

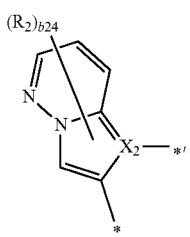

A2-46

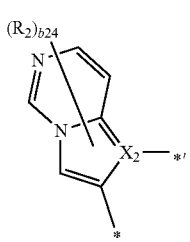

A2-47

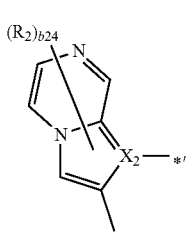

A2-48

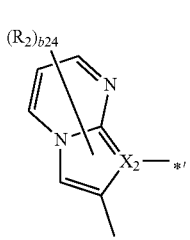

A2-49

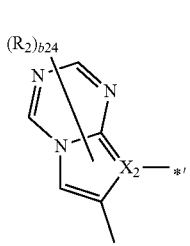

A2-50 wherein in Formulae A2-1 to A2-50, $X_2$ and $R_2$ may respectively be understood by referring to the descriptions therefor provided herein, $X_{21}$ may be selected from O, S, $N(R_{21})$, $C(R_{21})(R_{22})$, and $Si(R_{21})(R_{22})$, $R_{21}$ and $R_{22}$ may each be understood by referring to the descriptions for $R_2$ provided herein, b22 may be an integer from 0 to 2,
b23 may be an integer from 0 to 3,
b24 may be an integer from 0 to 4,
b25 may be an integer from 0 to 5,
b26 may be an integer from 0 to 6,
b27 may be an integer from 0 to 7,

*' indicates a binding site to $Z_{32}$ in Formula 1-1, and
* indicates a binding site to $T_1$ in Formula 1-1.

In one or more embodiments, $L_1$ in Formula 1 may be selected from ligands represented by Formula 1-1(1) (as shown in, for example, Compound 12):

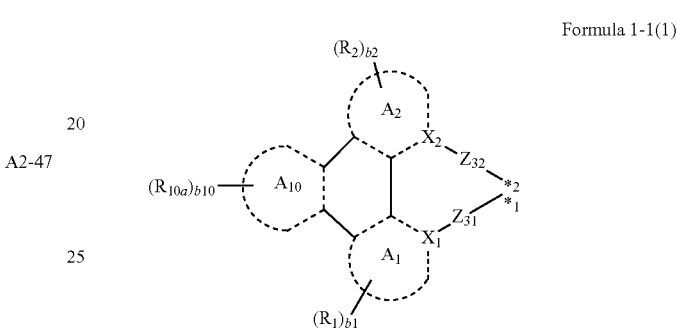

Formula 1-1(1)

wherein, in Formula 1-1(1), ring $A_1$, ring $A_2$, $Z_{31}$, $Z_{32}$, $X_1$, $X_2$, $R_1$, $R_2$, b1, b2, $R_{10a}$, *¹, and *² may respectively be understood by referring to the descriptions therefor provided herein, ring $A_{10}$ may be understood by referring to the descriptions for ring $A_1$ provided herein, and b10 may be understood by referring to the descriptions for b1 provided herein.

$L_2$ in Formula 1 may be any suitable organic ligand. In some embodiments, $L_2$ may be selected from a monodentate ligand, a bidentate ligand, a tridentate ligand, and a tetradentate.

In an embodiment, in Formula 1, $L_2$ may be selected from a monodentate ligand, and $L_2$ may be selected from I⁻, Br⁻, Cl⁻, sulfide, nitrate, azide, hydroxide, cyanate, isocyanate, thiocyanate), water, acetonitrile, pyridine, ammonia carbon monooxide, $P(Ph)_3$, $P(Ph)_2CH_3$, $PPh(CH_3)_2$, and $P(CH_3)_3$, but embodiments are not limited thereto.

In some embodiments, in Formula 1, $L_2$ may be selected from a bidentate ligand, and $L_2$ may be selected from oxalate, acetylacetonate, picolinic acid, 1,2-bis(diphenylphosphino)ethane, 1,1-bis(diphenylphosphino)methane, glycinate, and ethylenediamine, but embodiments are not limited thereto.

In one or more embodiments, $L_2$ in Formula 1 may be selected from ligands represented by Formulae 4-1 to 4-5:

4-1

4-2

-continued

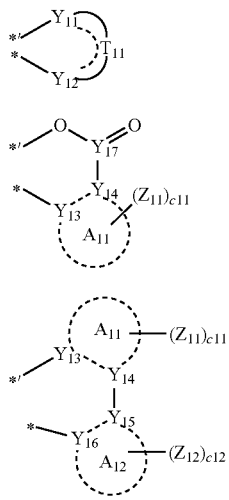

wherein, in Formulae 4-1 to 4-5, $Y_1$ may be C, P, or As, $Y_{11}$ may be O, N, $N(Z_{13})$, $P(Z_{13})(Z_{14})$, or $As(Z_{13})(Z_{14})$, $Y_{12}$ may be O, N, $N(Z_{15})$, $P(Z_{15})(Z_{16})$, or $As(Z_{15})(Z_{16})$, $T_{11}$ may be a single bond, a double bond, *—$C(Z_{11})(Z_{12})$—*', *—$C(Z_{11})(Z_{12})$—$C(Z_{13})(Z_{14})$—*', *—$C(Z_{11})$=$C(Z_{12})$—*', *=$C(Z_{11})$—*', *—$C(Z_{11})$=*', *—$C(Z_{11})$C(Z_{12})$=$C(Z_{13})$—*', —$C(Z_{11})$=$C(Z_{12})$—$C(Z_{13})$=*', or *—$N(Z_{11})$—*', wherein * and *' may each indicate a binding site to an adjacent atom, and $Z_{11}$ and $Z_{12}$ in *—$C(Z_{11})$=$C(Z_{12})$—*' may optionally be bound to form a $C_5$-$C_{30}$ carbocyclic group unsubstituted or substituted with at least one $R_{10a}$ or a $C_1$-$C_{30}$ heterocyclic group unsubstituted or substituted with at least one $R_{10a}$ (e.g., a benzene group, a naphthalene group, an indole group, a pyridine group, a pyrimidine group, a pyrazine group, a pyridazine group, a triazine group, a quinoline group, a benzoquinoline group, an isoquinoline group, a benzoisoquinoline group, a quinoxaline group, a benzoquinoxaline group, a quinazoline group, a benzoquinazoline group, a phenanthroline group, a pyrazole group, an imidazole group, a triazole group, a tetrazole group, an oxazole group, an iso-oxazole group, a thiazole group, an isothiazole group, an oxadiazole group, a thiadiazole group, a benzopyrazole group, a benzimidazole group, a benzoxazole group, a benzothiazole group, a benzoxadiazole group, a benzothiadiazole group, a phthalazine group, a perimidine group, an imidazopyridine group, an imidazopyrimidine group, an imidazotriazine group, an imidazopyrazine group, an imidazopyridazine group, an azulene group, or a naphthyridine group, each unsubstituted or substituted with at least one $R_{10a}$), wherein $R_{10a}$ may be understood by referring to the descriptions therefor provided herein, $Y_{13}$ to $Y_{16}$ may each independently be C or N, $Y_{17}$ may be C, $N(Z_{17})$, or $P(Z_{17})$, ring $A_{11}$ and ring $A_{12}$ may each independently be a $C_5$-$C_{30}$ carbocyclic group or a $C_1$-$C_{30}$ heterocyclic group, $Z_{11}$ to $Z_{17}$ may each be understood by referring to the descriptions for $R_1$ provided herein, c11 and c12 may each independently be an integer from 0 to 10, and

* and *' may each independently indicate a binding site to M in Formula 1.

In some embodiments, the ring $A_{11}$ and ring $A_{12}$ may each be understood by referring to the descriptions for the ring $A_1$ provided herein.

In some embodiments, $L_2$ in Formula 1 may be selected from ligands represented by Formulae 4-1 to 4-3, wherein, in Formulae 4-1 to 4-3, $Y_1$ may be P, $Y_{11}$ may be $P(Z_{13})(Z_{14})$, and $Y_{12}$ may be $P(Z_{15})(Z_{16})$.

In an embodiment, in Formula 1, n1 may be 2, n2 may be 1, and $L_2$ may be selected from ligands represented by Formulae 4-2 and 4-3, wherein, in Formulae 4-2 and 4-3, $Y_{11}$ may be $P(Z_{13})(Z_{14})$, and $Y_{12}$ may be $P(Z_{15})(Z_{16})$ (as shown in, for example, Compound 1).

In one or more embodiments, in Formula 1, n1 may be 3, n2 may be 0, and two $L_1$(s) selected from three $L_1$(s) may be different from each other (as shown in, for example, Compound 3).

In one or more embodiments, in Formula 1, n1 may be 3, n2 may be 0, and three $L_1$(s) may be identical to each other (as shown in, for example, Compound 4).

In one or more embodiments, in Formula 1, n1 may be 2, n2 may be 2, and $L_2$ may be selected from a ligand represented by Formula 4-1, wherein $Y_1$ in Formula 4-1 may be P (as shown in, for example, Compound 22).

In one or more embodiments, in Formula 1, n1 may be 2, n2 may be 2, and $L_2$ may be selected from a ligand represented by Formula 4-1, wherein in Formula 4-1, $Y_1$ may be P, and two $L_1$(s) and two $L_2$(s) may be bound via a single bond, *—$N[(L_3)_{a3}$-$(R_3)]$—*', *—$B(R_3)$—*', *—$P(R_3)$—*', *—$C(R_3)(R_4)$—*', *—$Si(R_3)(R_4)$—*', *—S—*', or *—O—*' to form a hexadentate ligand (as shown in, for example, Compound 39).

In one or more embodiments, the Os-containing organometallic compound may be selected from Compounds 1 to 42, but embodiments are not limited thereto:

1

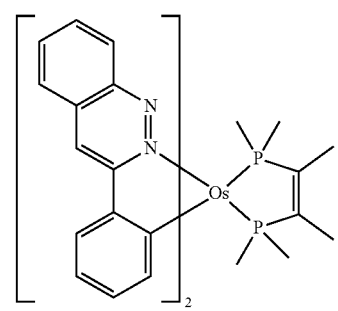

2

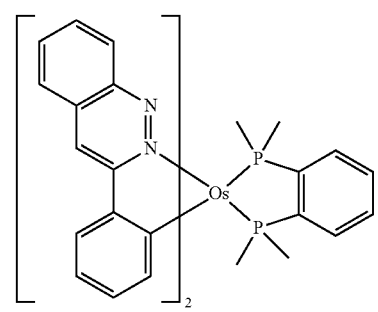

3
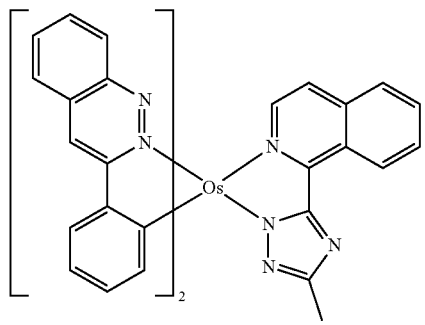
4
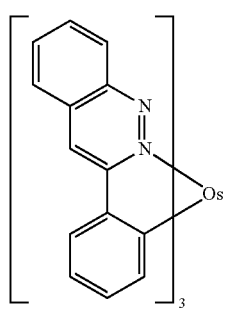
5
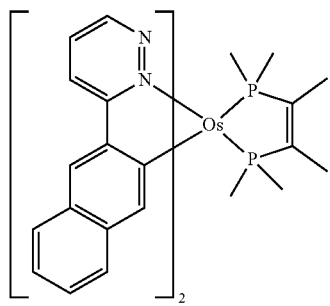
6
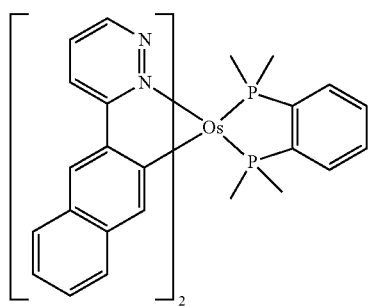
7
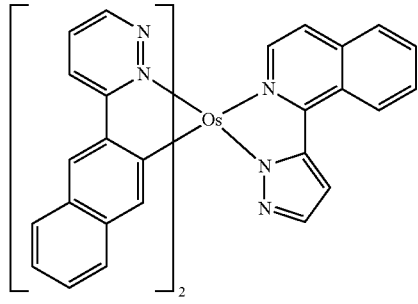
8
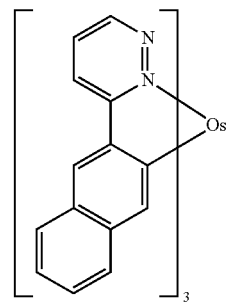
9
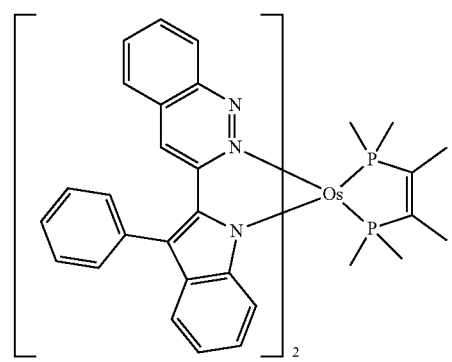
10
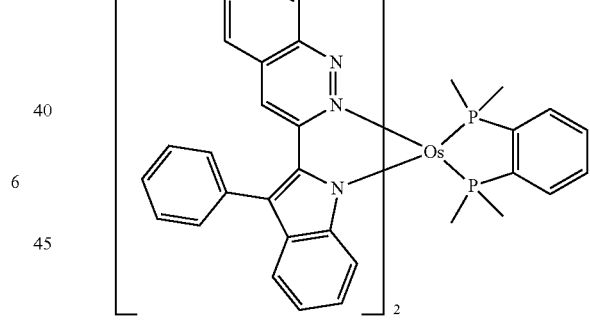
11
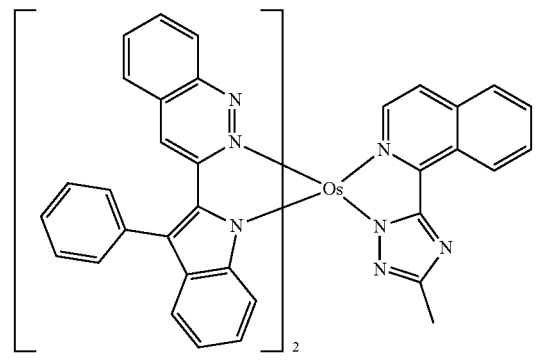

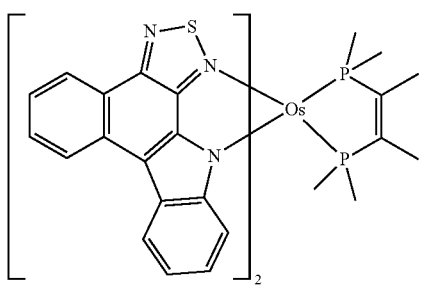
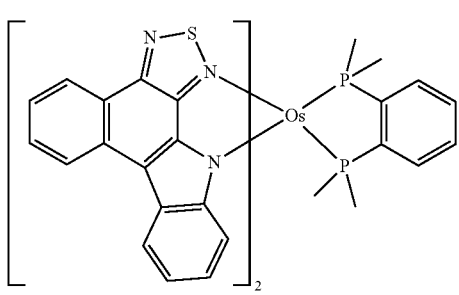
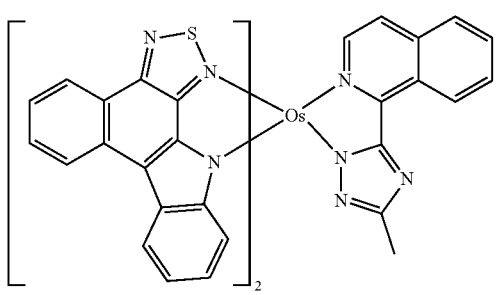
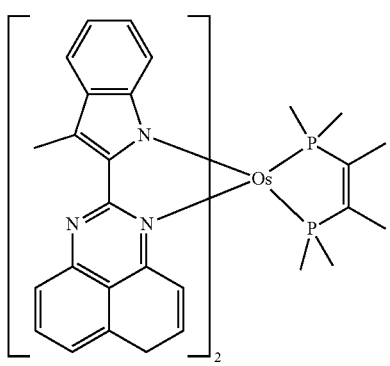
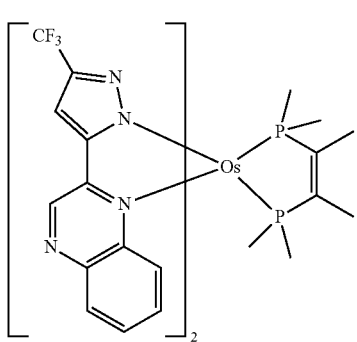
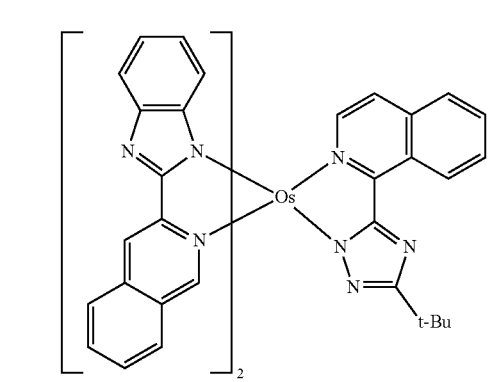
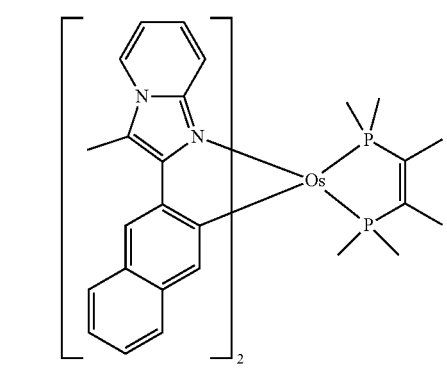
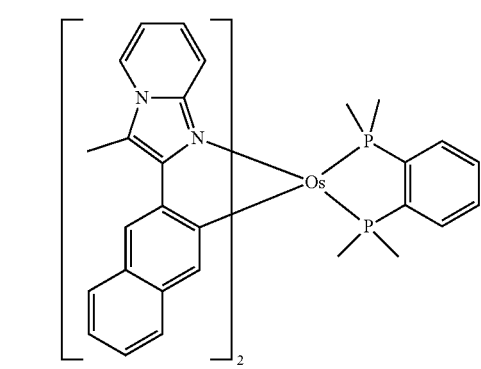
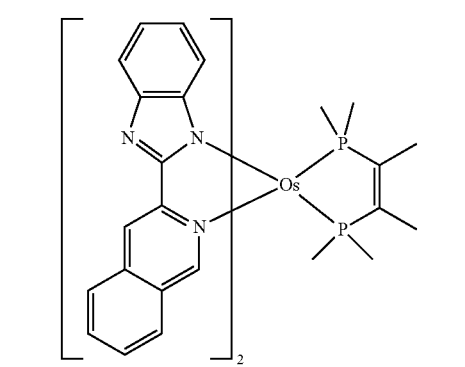

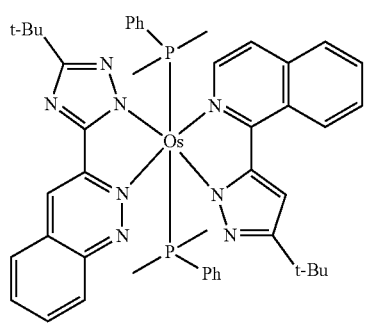
21
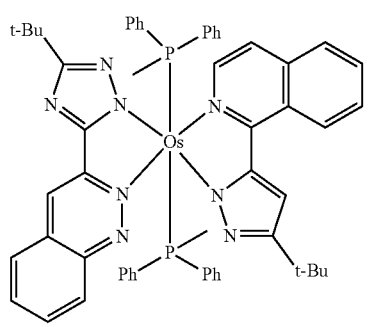
22
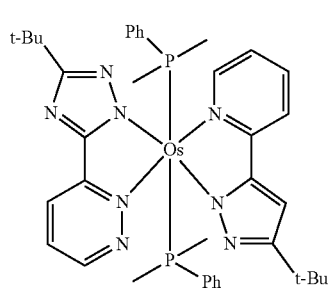
23
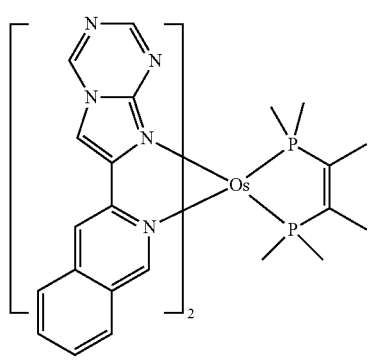
24
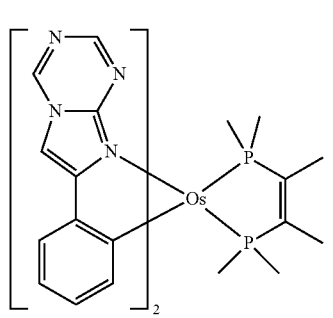
25
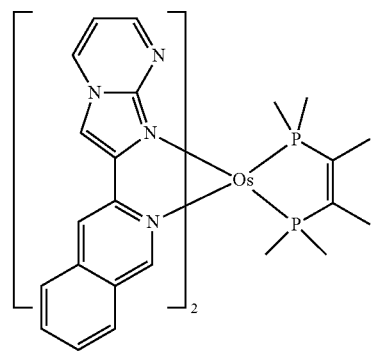
26
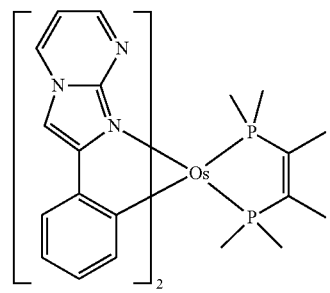
27
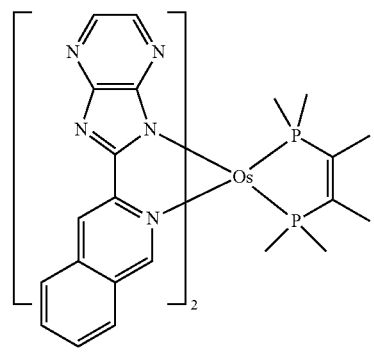
28
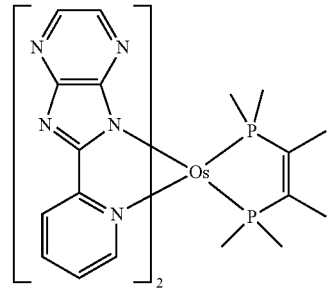
29
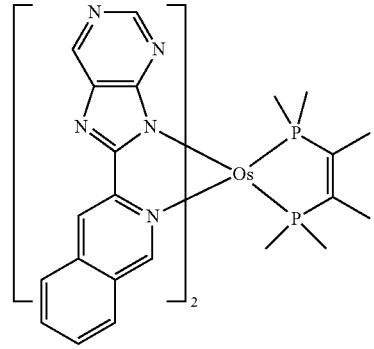
30

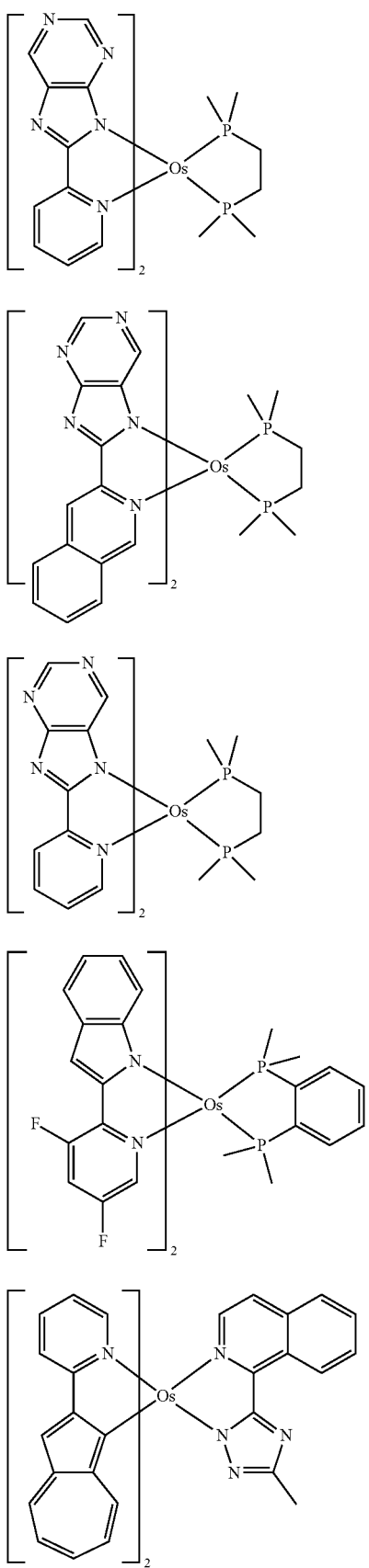
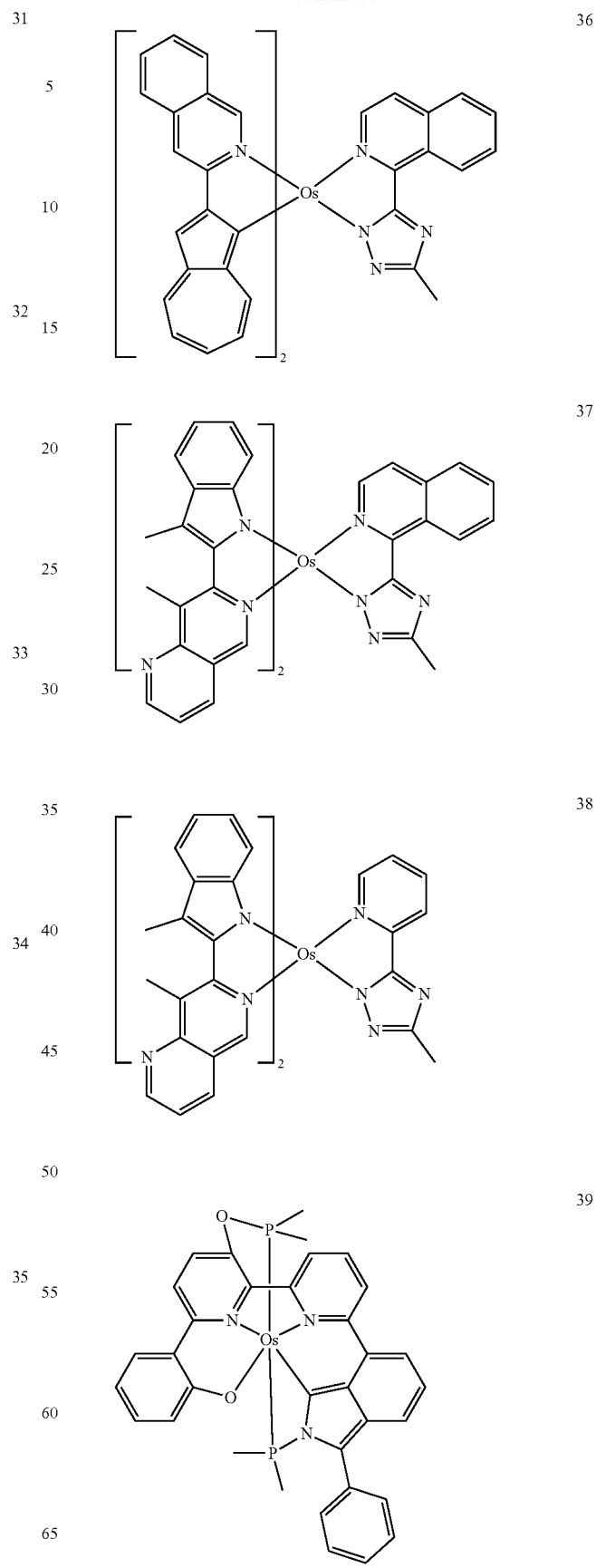

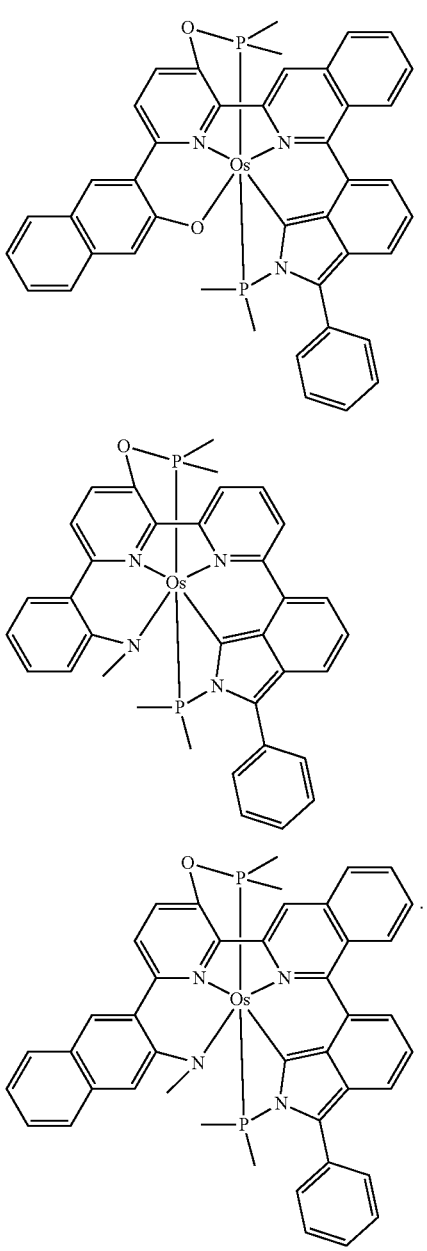

As the Os-containing organometallic compound represented by Formula 1 contains osmium and is configured to emit near-infrared light, an emission diode employing the Os-containing organometallic compound may emit near-infrared light while having a long lifespan.

DESCRIPTION OF THE ACCOMPANYING DRAWING

The accompanying drawing illustrates a schematic view of an embodiment of a near-infrared light-emitting diode 10. The near-infrared light-emitting diode 10 may include a first electrode 110, an organic layer 150, and a second electrode 190.

Hereinafter, the structure of the near-infrared light-emitting diode 10 according to an embodiment and a method of manufacturing the near-infrared light-emitting diode 10 according to an embodiment will be described in connection with the accompanying drawing.

First Electrode 110

In the accompanying drawing, a substrate may be additionally located under the first electrode 110 or above the second electrode 190. The substrate may be a glass substrate or a plastic substrate, each having excellent mechanical strength, thermal stability, transparency, surface smoothness, ease of handling, and water resistance.

The first electrode 110 may be formed by depositing or sputtering, onto the substrate, a material for forming the first electrode 110. When the first electrode 110 is an anode, the material for forming the first electrode 110 may be selected from materials with a high work function that facilitate hole injection.

The first electrode 110 may be a reflective electrode, a semi-transmissive electrode, or a transmissive electrode. When the first electrode 110 is a transmissive electrode, a material for forming the first electrode 110 may be selected from indium tin oxide (ITO), indium zinc oxide (IZO), tin oxide ($SnO_2$), zinc oxide (ZnO), and any combinations thereof, but embodiments are not limited thereto. In some embodiments, when the first electrode 110 is a semi-transmissive electrode or a reflective electrode, as a material for forming the first electrode 110, at least one of magnesium (Mg), silver (Ag), aluminum (Al), aluminum-lithium (Al—Li), calcium (Ca), magnesium-indium (Mg—In), magnesium-silver (Mg—Ag), and any combination thereof may be used, but embodiments are not limited thereto.

The first electrode 110 may have a single-layered structure, or a multi-layered structure including two or more layers. In some embodiments, the first electrode 110 may have a triple-layered structure of ITO/Ag/ITO, but embodiments are not limited thereto.

Organic Layer 150

The organic layer 150 may be on the first electrode 110. The organic layer 150 may include a near-infrared light-emitting layer including the organometallic compound containing Os described above.

The near-infrared light-emitting layer may further include a host described herein.

The organic layer 150 may include a hole transport region between the first electrode 110 and the near-infrared light-emitting layer and an electron transport region between the near-infrared light-emitting layer and the second electrode 190.

Hole Transport Region in Organic Layer 150

The hole transport region may have i) a single-layered structure consisting of a single layer consisting of a single material, ii) a single-layered structure consisting of a single layer including a plurality of different materials, or iii) a multi-layered structure having a plurality of layers including a plurality of different materials.

The hole transport region may include at least one selected from a hole injection layer, a hole transport layer, an emission auxiliary layer, and an electron blocking layer.

For example, the hole transport region may have a single-layered structure including a single layer including a plurality of different materials or a multi-layered structure, e.g., a hole injection layer/hole transport layer structure, a hole injection layer/hole transport layer/emission auxiliary layer structure, a hole injection layer/emission auxiliary layer structure, a hole transport layer/emission auxiliary layer structure, or a hole injection layer/hole transport layer/electron blocking layer structure, wherein layers of each structure are sequentially stacked on the first electrode 110 in each stated order, but embodiments are not limited thereto.

The hole transport region may include at least one selected from m-MTDATA, TDATA, 2-TNATA, NPB (NPD), β-NPB, TPD, a spiro-TPD, a spiro-NPB, methylated-NPB, TAPC, HMTPD, 4,4',4''-tris(N-carbazolyl)triphenylamine (TCTA), polyaniline/dodecylbenzenesulfonic acid (PANI/DBSA), poly(3,4-ethylenedioxythiophene)/poly (4-styrenesulfonate) (PEDOT/PSS), polyaniline/camphor sulfonic acid (PANI/CSA), (polyaniline)/poly(4-styrenesulfonate) (PANI/PSS), a compound represented by Formula 201, and a compound represented by Formula 202:

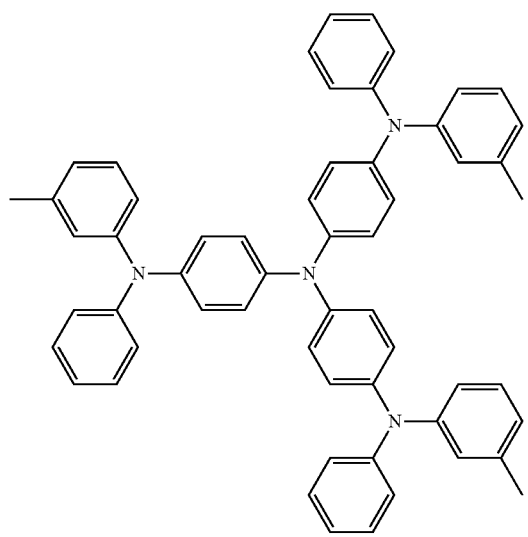

m-MTDATA

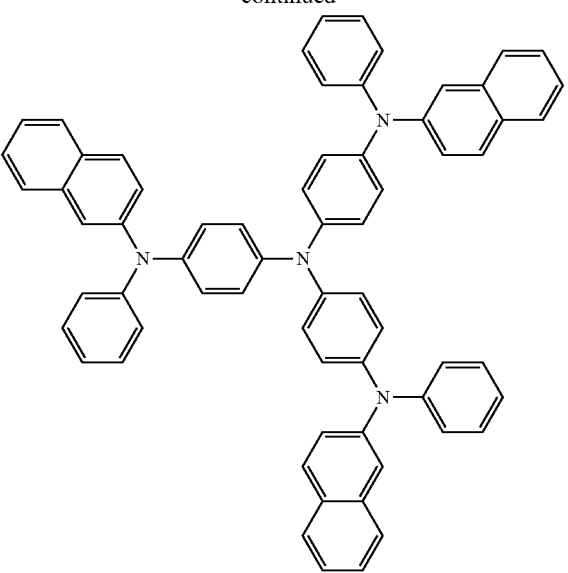

2-TNATA

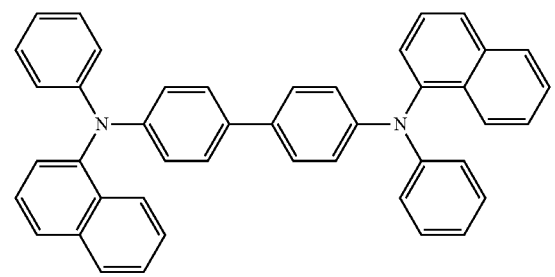

NPB

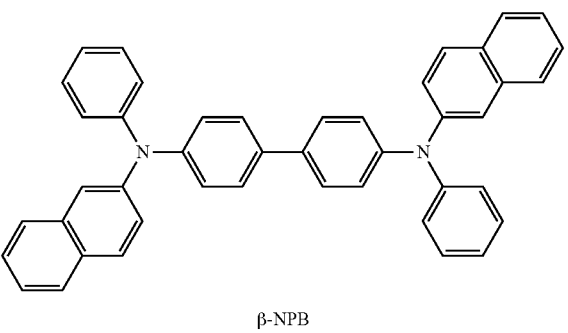

β-NPB

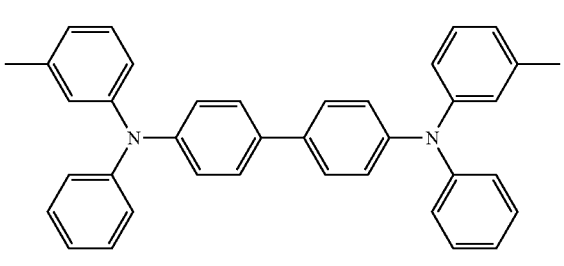

TPD

TDATA

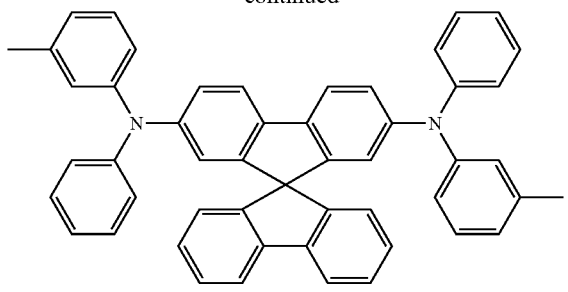

Spiro-TPD

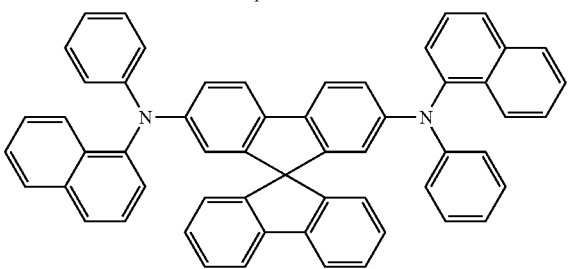

Spiro-NPB

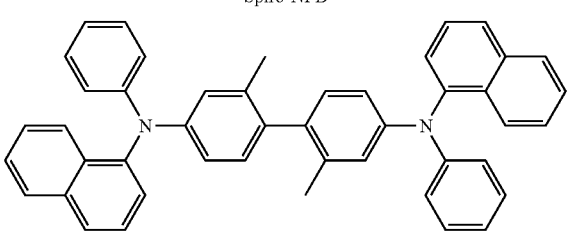

methylated NPB

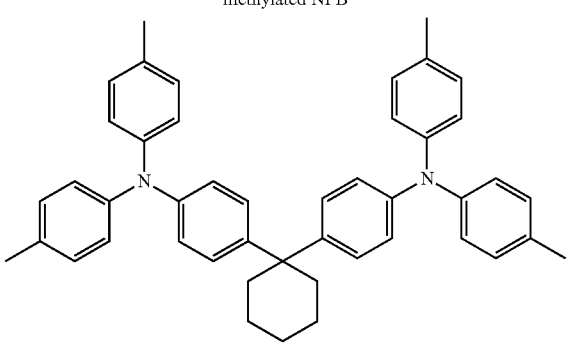

TAPC

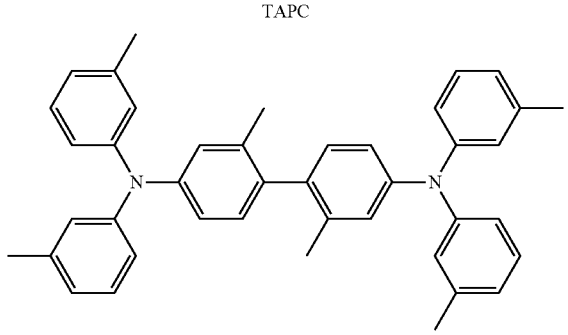

HMTPD

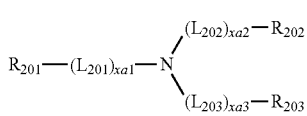

Formula 201

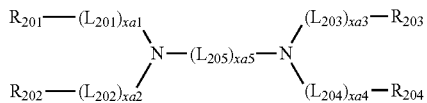

Formula 202 wherein, in Formulae 201 and 202, $L_{201}$ to $L_{204}$ may each independently be selected from a substituted or unsubstituted $C_3$-$C_{10}$ cycloalkylene group, a substituted or unsubstituted $C_1$-$C_{10}$ heterocycloalkylene group, a substituted or unsubstituted $C_3$-$C_{10}$ cycloalkenylene group, a substituted or unsubstituted $C_1$-$C_{10}$ heterocycloalkenylene group, a substituted or unsubstituted $C_6$-$C_{60}$ arylene group, a substituted or unsubstituted $C_1$-$C_{60}$ heteroarylene group, a substituted or unsubstituted divalent non-aromatic condensed polycyclic group, and a substituted or unsubstituted divalent non-aromatic condensed heteropolycyclic group, $L_{205}$ may be selected from *—O—*', *—S—*', *—N($Q_{201}$)-*', a substituted or unsubstituted $C_1$-$C_{20}$ alkylene group, a substituted or unsubstituted $C_2$-$C_{20}$ alkenylene group, a substituted or unsubstituted $C_3$-$C_{10}$ cycloalkylene group, a substituted or unsubstituted $C_1$-$C_{10}$ heterocycloalkylene group, a substituted or unsubstituted $C_3$-$C_{10}$ cycloalkenylene group, a substituted or unsubstituted $C_1$-$C_{10}$ heterocycloalkenylene group, a substituted or unsubstituted $C_6$-$C_{60}$ arylene group, a substituted or unsubstituted $C_1$-$C_{60}$ heteroarylene group, a substituted or unsubstituted divalent non-aromatic condensed polycyclic group, and a substituted or unsubstituted divalent non-aromatic condensed heteropolycyclic group, xa1 to xa4 may each independently be an integer from 0 to 3, xa5 may be an integer from 1 to 10, and $R_{201}$ to $R_{204}$ and $Q_{201}$ may each independently be selected from a substituted or unsubstituted $C_3$-$C_{10}$ cycloalkyl group, a substituted or unsubstituted $C_1$-$C_{10}$ heterocycloalkyl group, a substituted or unsubstituted $C_3$-$C_{10}$ cycloalkenyl group, a substituted or unsubstituted $C_1$-$C_{10}$ heterocycloalkenyl group, a substituted or unsubstituted $C_6$-$C_{60}$ aryl group, a substituted or unsubstituted $C_6$-$C_{60}$ aryloxy group, a substituted or unsubstituted $C_6$-$C_{60}$ arylthio group, a substituted or unsubstituted $C_1$-$C_{60}$ heteroaryl group, a substituted or unsubstituted monovalent non-aromatic condensed polycyclic group, and a substituted or unsubstituted monovalent non-aromatic condensed heteropolycyclic group.

In some embodiments, in Formula 202, $R_{201}$ and $R_{202}$ may optionally be bound via a single bond, a dimethyl-methylene group, or a diphenyl-methylene group, and $R_{203}$ and $R_{204}$ may optionally be bound via a single bond, a dimethyl-methylene group, or a diphenyl-methylene group.

In one embodiment, in Formulae 201 and 202, $L_{201}$ to $L_{205}$ may each independently be selected from a phenylene group, a pentalenylene group, an indenylene group, a naphthylene group, an azulenylene group, a heptalenylene group, an indacenylene group, an acenaphthylene group, a fluorenylene group, a spiro-bifluorenylene group, a benzofluorenylene group, a dibenzofluorenylene group, a phenalenylene group, a phenanthrenylene group, an anthracenylene group, a fluoranthenylene group, a triphenylenylene group, a pyrenylene group, a chrysenylene group, a naphthacenylene group, a picenylene group, a perylenylene group, a pentaphenylene group, a hexacenylene group, a pentacenylene group, a rubicenylene group, a coronenylene group, an ovalenylene group, a thiophenylene group, a furanylene group, a carbazolylene group, an indolylene group, an isoindolylene group, a benzofuranylene group, a benzothiophenylene group, a dibenzofuranylene group, a dibenzothiophenylene group, a benzocarbazolylene group, a dibenzocarbazolylene group, a dibenzosilolylene group, and a pyridinylene group; and a phenylene group, a pentalenylene group, an indenylene group, a naphthylene group, an azulenylene group, a heptalenylene group, an indacenylene group, an acenaphthylene group, a fluorenylene group, a spiro-bifluorenylene group, a benzofluorenylene group, a dibenzofluorenylene group, a phenalenylene group, a phenanthrenylene group, an anthracenylene group, a fluoranthenylene group, a triphenylenylene group, a pyrenylene group, a chrysenylene group, a naphthacenylene group, a picenylene group, a perylenylene group, a pentaphenylene group, a hexacenylene group, a pentacenylene group, a rubicenylene group, a coronenylene group, an ovalenylene group, a thiophenylene group, a furanylene group, a carbazolylene group, an indolylene group, an isoindolylene group, a benzofuranylene group, a benzothiophenylene group, a dibenzofuranylene group, a dibenzothiophenylene group, a benzocarbazolylene group, a dibenzocarbazolylene group, a dibenzosilolylene group, and a pyridinylene group, each substituted with at least one selected from deuterium, —F, —Cl, —Br, —I, a hydroxyl group, a cyano group, a nitro group, an amidino group, a hydrazino group, a hydrazono group, a $C_1$-$C_{20}$ alkyl group, a $C_1$-$C_{20}$ alkoxy group, a cyclopentyl group, a cyclohexyl group, a cycloheptyl group, a cyclopentenyl group, a cyclohexenyl group, a phenyl group, a biphenyl group, a terphenyl group, a phenyl group substituted with a $C_1$-$C_{10}$ alkyl group, a phenyl group substituted with —F, a pentalenyl group, an indenyl group, a naphthyl group, an azulenyl group, a heptalenyl group, an indacenyl group, an acenaphthyl group, a fluorenyl group, a spiro-bifluorenyl group, a benzofluorenyl group, a dibenzofluorenyl group, a phenalenyl group, a phenanthrenyl group, an anthracenyl group, a fluoranthenyl group, a triphenylenyl group, a pyrenyl group, a chrysenyl group, a naphthacenyl group, a picenyl group, a perylenyl group, a pentaphenyl group, a hexacenyl group, a pentacenyl group, a rubicenyl group, a coronenyl group, an ovalenyl group, a thiophenyl group, a furanyl group, a carbazolyl group, an indolyl group, an isoindolyl group, a benzofuranyl group, a benzothiophenyl group, a dibenzofuranyl group, a dibenzothiophenyl group, a benzocarbazolyl group, a dibenzocarbazolyl group, a dibenzosilolyl group, a pyridinyl group, —Si($Q_{31}$)($Q_{32}$)($Q_{33}$), and —N($Q_{31}$)($Q_{32}$), wherein $Q_{31}$ to $Q_{33}$ may each independently be selected from a $C_1$-$C_{10}$ alkyl group, a $C_1$-$C_{10}$ alkoxy group, a phenyl group, a biphenyl group, a terphenyl group, and a naphthyl group.

In one or more embodiments, xa1 to xa4 may each independently be 0, 1, or 2.

In one or more embodiments, xa5 may be 1, 2, 3, or 4.

In one or more embodiments, $R_{201}$ to $R_{204}$ and $Q_{201}$ may each independently be selected from a phenyl group, a biphenyl group, a terphenyl group, a pentalenyl group, an indenyl group, a naphthyl group, an azulenyl group, a heptalenyl group, an indacenyl group, an acenaphthyl group, a fluorenyl group, a spiro-bifluorenyl group, a benzofluorenyl group, a dibenzofluorenyl group, a phenalenyl group, a phenanthrenyl group, an anthracenyl group, a fluoranthenyl group, a triphenylenyl group, a pyrenyl group, a chrysenyl group, a naphthacenyl group, a picenyl group, a perylenyl group, a pentaphenyl group, a hexacenyl group, a pentacenyl group, a rubicenyl group, a coronenyl group, an ovalenyl group, a thiophenyl group, a furanyl group, a carbazolyl group, an indolyl group, an isoindolyl group, a benzofuranyl group, a benzothiophenyl group, a dibenzofuranyl group, a dibenzothiophenyl group, a benzocarbazolyl group, a dibenzocarbazolyl group, a dibenzosilolyl group, and a pyridinyl group; and a phenyl group, a biphenyl group, a terphenyl group, a pentalenyl group, an indenyl group, a naphthyl group, an azulenyl group, a heptalenyl group, an indacenyl group, an acenaphthyl group, a fluorenyl group, a spiro-bifluorenyl group, a benzofluorenyl group, a dibenzofluorenyl group, a phenalenyl group, a phenanthrenyl group, an anthracenyl group, a fluoranthenyl group, a triphenylenyl group, a pyrenyl group, a chrysenyl group, a naphthacenyl group, a picenyl group, a perylenyl group, a pentaphenyl group, a hexacenyl group, a pentacenyl group, a rubicenyl group, a coronenyl group, an ovalenyl group, a thiophenyl group, a furanyl group, a carbazolyl group, an indolyl group, an isoindolyl group, a benzofuranyl group, a benzothiophenyl group, a dibenzofuranyl group, a dibenzothiophenyl group, a benzocarbazolyl group, a dibenzocarbazolyl group, a dibenzosilolyl group, and a pyridinyl group, each substituted with at least one selected from deuterium, —F, —Cl, —Br, —I, a hydroxyl group, a cyano group, a nitro group, an amidino group, a hydrazino group, a hydrazono group, a $C_1$-$C_{20}$ alkyl group, a $C_1$-$C_{20}$ alkoxy group, a cyclopentyl group, a cyclohexyl group, a cycloheptyl group, a cyclopentenyl group, a cyclohexenyl group, a phenyl group, a biphenyl group, a terphenyl group, a phenyl group substituted with a $C_1$-$C_{10}$ alkyl group, a phenyl group substituted with —F, a pentalenyl group, an indenyl group, a naphthyl group, an azulenyl group, a heptalenyl group, an indacenyl group, an acenaphthyl group, a fluorenyl group, a spiro-bifluorenyl group, a benzofluorenyl group, a dibenzofluorenyl group, a phenalenyl group, a phenanthrenyl group, an anthracenyl group, a fluoranthenyl group, a triphenylenyl group, a pyrenyl group, a chrysenyl group, a naphthacenyl group, a picenyl group, a perylenyl group, a pentaphenyl group, a hexacenyl group, a pentacenyl group, a rubicenyl group, a coronenyl group, an ovalenyl group, a thiophenyl group, a furanyl group, a carbazolyl group, an indolyl group, an isoindolyl group, a benzofuranyl group, a benzothiophenyl group, a dibenzofuranyl group, a dibenzothiophenyl group, a benzocarbazolyl group, a dibenzocarbazolyl group, a dibenzosilolyl group, a pyridinyl group, —Si($Q_{31}$)($Q_{32}$)($Q_{33}$), and —N($Q_{31}$)($Q_{32}$), wherein $Q_{31}$ to $Q_{33}$ may respectively be understood by referring to the descriptions therefor provided herein.

In one or more embodiments, in Formula 201, at least one of $R_{201}$ to $R_{203}$ may be selected from a fluorenyl group, a spiro-bifluorenyl group, a carbazolyl group, a dibenzofuranyl group, and a dibenzothiophenyl group; and a fluorenyl group, a spiro-bifluorenyl group, a carbazolyl group, a dibenzofuranyl group, and a dibenzothiophenyl group, each substituted with at least one selected from deuterium, —F, —Cl, —Br, —I, a hydroxyl group, a cyano group, a nitro group, an amidino group, a hydrazino group, a hydrazono group, a $C_1$-$C_{20}$ alkyl group, a $C_1$-$C_{20}$ alkoxy group, a cyclopentyl group, a cyclohexyl group, a cycloheptyl group, a cyclopentenyl group, a cyclohexenyl group, a phenyl group, a biphenyl group, a terphenyl group, a phenyl group substituted with a $C_1$-$C_{10}$ alkyl group, a phenyl group substituted with —F, a naphthyl group, a fluorenyl group, a spiro-bifluorenyl group, a carbazolyl group, a dibenzofuranyl group, and a dibenzothiophenyl group, but embodiments are not limited thereto.

In one or more embodiments, in Formula 202, i) $R_{201}$ and $R_{202}$ may be bound via a single bond, and/or ii) $R_{203}$ and $R_{204}$ may be bound via a single bond.

In one or more embodiments, in Formula 202, at least one of $R_{201}$ to $R_{204}$ may be selected from
a carbazolyl group; and
a carbazolyl group substituted with at least one selected from deuterium, —F, —Cl, —Br, —I, a hydroxyl group, a cyano group, a nitro group, an amidino group, a hydrazino group, a hydrazono group, a $C_1$-$C_{20}$ alkyl group, a $C_1$-$C_{20}$ alkoxy group, a cyclopentyl group, a cyclohexyl group, a cycloheptyl group, a cyclopentenyl group, a cyclohexenyl group, a phenyl group, a biphenyl group, a terphenyl group, a phenyl group substituted with a $C_1$-$C_{10}$ alkyl group, a phenyl group substituted with —F, a naphthyl group, a fluorenyl group, a spiro-bifluorenyl group, a carbazolyl group, a dibenzofuranyl group, and a dibenzothiophenyl group, but embodiments are not limited thereto.

The compound represented by Formula 201 may be represented by Formula 201A:

Formula 201A

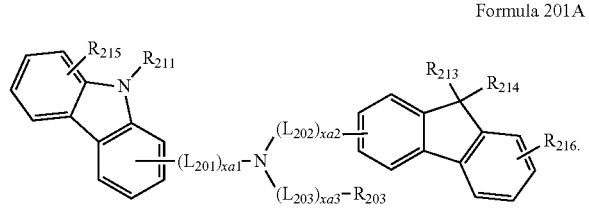

In some embodiments, the compound represented by Formula 201 may be represented by Formula 201A(1), but embodiments are not limited thereto:

Formula 201A(1)

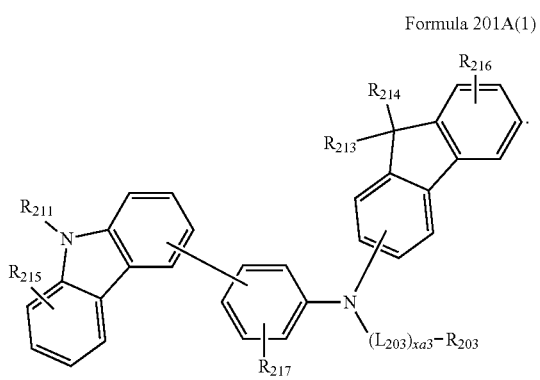

In some embodiments, the compound represented by Formula 201 may be represented by Formula 201A-1, but embodiments are not limited thereto:

Formula 201A-1

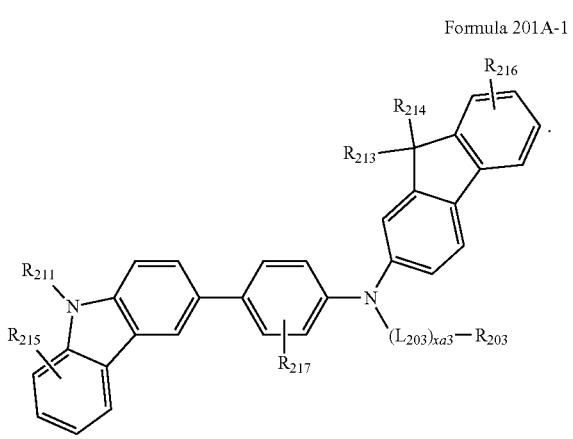

In some embodiments, the compound represented by Formula 202 may be represented by Formula 202A:

Formula 202A

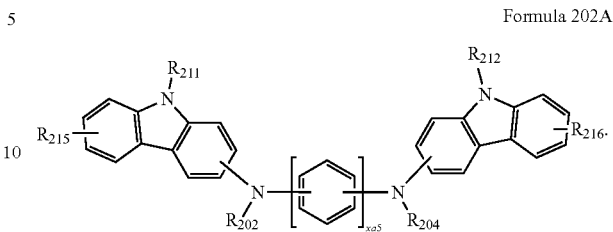

In some embodiments, the compound represented by Formula 202 may be represented by Formula 202A-1:

Formula 202A-1

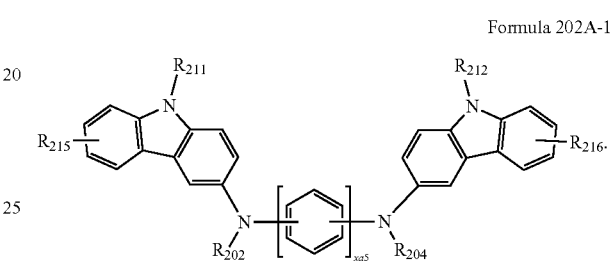

In Formulae 201A, 201A(1), 201A-1, 202A, and 202A-1,
$L_{201}$ to $L_{203}$, xa1 to xa3, xa5, and $R_{202}$ to $R_{204}$ may respectively be understood by referring to the descriptions therefor provided herein, $R_{211}$ and $R_{212}$ may each be understood by referring to the descriptions for $R_{203}$ provided herein, and $R_{213}$ to $R_{217}$ may each independently be selected from hydrogen, deuterium, —F, —Cl, —Br, —I, a hydroxyl group, a cyano group, a nitro group, an amidino group, a hydrazino group, a hydrazono group, a $C_1$-$C_{20}$ alkyl group, a $C_1$-$C_{20}$ alkoxy group, a cyclopentyl group, a cyclohexyl group, a cycloheptyl group, a cyclopentenyl group, a cyclohexenyl group, a phenyl group, a biphenyl group, a terphenyl group, a phenyl group substituted with a $C_1$-$C_{10}$ alkyl group, a phenyl group substituted with —F, a pentalenyl group, an indenyl group, a naphthyl group, an azulenyl group, a heptalenyl group, an indacenyl group, an acenaphthyl group, a fluorenyl group, a spiro-bifluorenyl group, a benzofluorenyl group, a dibenzofluorenyl group, a phenalenyl group, a phenanthrenyl group, an anthracenyl group, a fluoranthenyl group, a triphenylenyl group, a pyrenyl group, a chrysenyl group, a naphthacenyl group, a picenyl group, a perylenyl group, a pentaphenyl group, a hexacenyl group, a pentacenyl group, a rubicenyl group, a coronenyl group, an ovalenyl group, a thiophenyl group, a furanyl group, a carbazolyl group, an indolyl group, an isoindolyl group, a benzofuranyl group, a benzothiophenyl group, a dibenzofuranyl group, a dibenzothiophenyl group, a benzocarbazolyl group, a dibenzocarbazolyl group, a dibenzosilolyl group, and a pyridinyl group.

The thickness of the hole transport region may be in a range of about 100 (Angstroms)Å to about 10,000 Å, and in some embodiments, about 100 Å to about 1,000 Å. When the hole transport region includes at least one selected from a hole injection layer and a hole transport layer, the thickness of the hole injection layer may be in a range of about 100 Å to about 9,000 Å, and in some embodiments, about 100 Å to about 1,000 Å, and the thickness of the hole transport layer may be in a range of about 50 Å to about 2,000 Å, and in some embodiments, about 100 Å to about 1,500 Å. When the thicknesses of the hole transport region, the hole injection layer, and the hole transport layer are within any of these ranges, excellent hole transport characteristics may be obtained without a substantial increase in driving voltage.

The emission auxiliary layer may increase light emission efficiency by compensating for an optical resonance distance according to the wavelength of light emitted by a near-infrared light-emitting layer. The electron blocking layer may reduce or eliminate the flow of electrons from an electron transport region. The emission auxiliary layer and the electron blocking layer may include the aforementioned materials.

p-Dopant

The hole transport region may include a charge generating material as well as the aforementioned materials, to improve conductive properties of the hole transport region. The charge generating material may be substantially homogeneously or non-homogeneously dispersed in the hole transport region.

The charge generating material may include, for example, a p-dopant.

In some embodiments, the lowest unoccupied molecular orbital (LUMO) energy level of the p-dopant may be −3.5 eV or less.

The p-dopant may include at least one selected from a quinone derivative, a metal oxide, and a cyano group-containing compound, but embodiments are not limited thereto.

In some embodiments, the p-dopant may include at least one selected from a quinone derivative, such as tetracyanoquinodimethane (TCNQ) or 2,3,5,6-tetrafluoro-7,7,8,8-tetracyanoquinodimethane (F4-TCNQ);

a metal oxide, such as tungsten oxide or molybdenum oxide;

1,4,5,8,9,12-hexaazatriphenylene-hexacarbonitrile (HAT-CN); and a compound represented by Formula 221, but embodiments are not limited thereto:

Formula 221

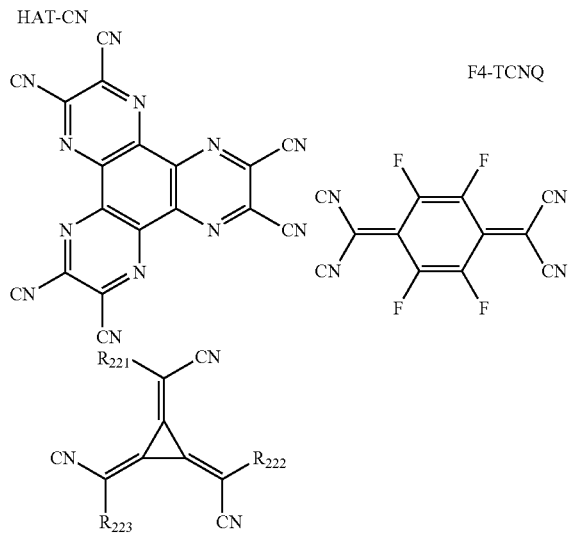

wherein, in Formula 221, $R_{221}$ to $R_{223}$ may each independently be selected from a substituted or unsubstituted $C_3$-$C_{10}$ cycloalkyl group, a substituted or unsubstituted $C_1$-$C_{10}$ heterocycloalkyl group, a substituted or unsubstituted $C_3$-$C_{10}$ cycloalkenyl group, a substituted or unsubstituted $C_1$-$C_{10}$ heterocycloalkenyl group, a substituted or unsubstituted $C_6$-$C_{60}$ aryl group, a substituted or unsubstituted $C_1$-$C_{60}$ heteroaryl group, a substituted or unsubstituted monovalent non-aromatic condensed polycyclic group, and a substituted or unsubstituted monovalent non-aromatic condensed heteropolycyclic group, wherein at least one selected from $R_{221}$ to $R_{223}$ may include at least one substituent selected from a cyano group, —F, —Cl, —Br, —I, a $C_1$-$C_{20}$ alkyl group substituted with —F, a $C_1$-$C_{20}$ alkyl group substituted with —Cl, a $C_1$-$C_{20}$ alkyl group substituted with —Br, and a $C_1$-$C_{20}$ alkyl group substituted with —I.

Near-Infrared Light-Emitting Layer in Organic Layer 150

The near-infrared light-emitting layer may include the organometallic compound containing Os described herein.

In some embodiments, the near-infrared light-emitting layer may include a host and a dopant, and the dopant may include the organometallic compound containing Os. The amount of the dopant in the near-infrared light-emitting layer may be, in general, in a range of about 0.01 parts to about 15 parts by weight based on 100 parts by weight of the host, but embodiments are not limited thereto.

The thickness of the near-infrared light-emitting layer may be in a range of about 100 Å to about 1,000 Å, and in some embodiments, about 200 Å to about 600 Å. When the thickness of the near-infrared light-emitting layer is within any of these ranges, improved luminescence characteristics may be obtained without a substantial increase in driving voltage.

Host in Near-Infrared Light-Emitting Layer

The host may include a compound represented by Formula 301:

$$[Ar_{301}]_{xb11}-[(L_{301})_{xb1}-R_{301}]_{xb21} \qquad \text{Formula 301}$$

wherein, in Formula 301, $Ar_{301}$ may be selected from a substituted or unsubstituted $C_5$-$C_{60}$ carbocyclic group and a substituted or unsubstituted $C_1$-$C_{60}$ heterocyclic group, xb11 may be 1, 2, or 3, $L_{301}$ may be selected from a substituted or unsubstituted $C_3$-$C_{10}$ cycloalkylene group, a substituted or unsubstituted $C_1$-$C_{10}$ heterocycloalkylene group, a substituted or unsubstituted $C_3$-$C_{10}$ cycloalkenylene group, a substituted or unsubstituted $C_1$-$C_{10}$ heterocycloalkenylene group, a substituted or unsubstituted $C_6$-$C_{60}$ arylene group, a substituted or unsubstituted $C_1$-$C_{60}$ heteroarylene group, a substituted or unsubstituted divalent non-aromatic condensed polycyclic group, and a substituted or unsubstituted divalent non-aromatic condensed heteropolycyclic group, xb1 may be an integer from 0 to 5, $R_{301}$ may be selected from deuterium, —F, —Cl, —Br, —I, a hydroxyl group, a cyano group, a nitro group, an amidino group, a hydrazino group, a hydrazono group, a substituted or unsubstituted $C_1$-$C_{60}$ alkyl group, a substituted or unsubstituted $C_2$-$C_{60}$ alkenyl group, a substituted or unsubstituted $C_2$-$C_{60}$ alkynyl group, a substituted or unsubstituted $C_1$-$C_{60}$ alkoxy group, a substituted or unsubstituted $C_3$-$C_{10}$ cycloalkyl group, a substituted or unsubstituted $C_1$-$C_{10}$ heterocycloalkyl group, a substituted or unsubstituted $C_3$-$C_{10}$ cycloalkenyl group, a substituted or unsubstituted $C_1$-$C_{10}$ heterocycloalkenyl group, a substituted or unsubstituted $C_6$-$C_{60}$ aryl group, a substituted or unsubstituted $C_6$-$C_{60}$ aryloxy group, a substituted or unsubstituted $C_6$-$C_{60}$ arylthio group, a substituted or unsubstituted $C_1$-$C_{60}$ heteroaryl group, a substituted or unsubstituted monovalent non-aromatic condensed polycyclic group, a substituted or unsubstituted monovalent non-aromatic condensed heteropolycyclic group, —Si($Q_{301}$)($Q_{302}$)($Q_{303}$), —N($Q_{301}$)($Q_{302}$), —B($Q_{301}$)($Q_{302}$), —C(=O)($Q_{301}$), —S(=O)$_2$($Q_{301}$), and —P(=O)($Q_{301}$)($Q_{302}$), and xb21 may be an integer from 1 to 5, wherein $Q_{301}$ to $Q_{303}$ may each independently be selected from a $C_1$-$C_{10}$ alkyl group, a $C_1$-$C_{10}$ alkoxy group, a phenyl group, a biphenyl group, a terphenyl group, and a naphthyl group, but embodiments are not limited thereto.

In an embodiment, in Formula 301, $Ar_{301}$ may be selected from a naphthalene group, a fluorene group, a spiro-bifluorene group, a benzofluorene group, a dibenzofluorene group, a phenalene group, a phenanthrene group, an anthracene group, a fluoranthene group, a triphenylene group, a pyrene group, a chrysene group, a naphthacene group, a picene group, a perylene group, a pentaphene group, an indenoanthracene group, a dibenzofuran group, and a dibenzothiophene group; and a naphthalene group, a fluorene group, a spiro-bifluorene group, a benzofluorene group, a dibenzofluorene group, a phenalene group, a phenanthrene group, an anthracene group, a fluoranthene group, a triphenylene group, a pyrene group, a chrysene group, a naphthacene group, a picene group, a perylene group, a pentaphene group, an indenoanthracene group, a dibenzofuran group, and a dibenzothiophene group, each substituted with at least one selected from deuterium, —F, —Cl, —Br, —I, a hydroxyl group, a cyano group, a nitro group, an amidino group, a hydrazino group, a hydrazono group, a $C_1$-$C_{20}$ alkyl group, a $C_1$-$C_{20}$ alkoxy group, a phenyl group, a biphenyl group, a terphenyl group, a naphthyl group, —Si($Q_{31}$)($Q_{32}$)($Q_{33}$), —N($Q_{31}$)($Q_{32}$), —B($Q_{31}$)($Q_{32}$), —C(=O)($Q_{31}$), —S(=O)$_2$($Q_{31}$), and —P(=O)($Q_{31}$)($Q_{32}$), wherein $Q_{31}$ to $Q_{33}$ may each independently be selected from a $C_1$-$C_{10}$ alkyl group, a $C_1$-$C_{10}$ alkoxy group, a phenyl group, a biphenyl group, a terphenyl group, and a naphthyl group, but embodiments are not limited thereto.

When xb11 in Formula 301 is 2 or greater, at least two $Ar_{301}$(s) may be bound via a single bond.

In one or more embodiments, the compound represented by Formula 301 may be represented by Formula 301-1 or 301-2:

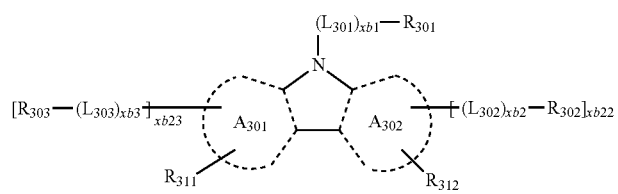

Formula 301-1

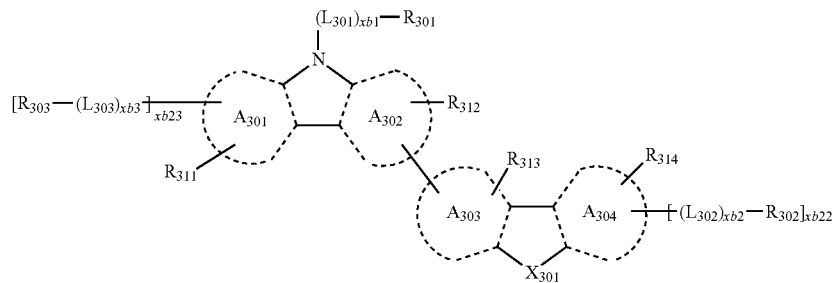

Formula 301-2 wherein, in Formulae 301-1 and 301-2, $A_{301}$ to $A_{304}$ may each independently be selected from a benzene group, a naphthalene group, a phenanthrene group, a fluoranthene group, a triphenylene group, a pyrene group, a chrysene group, a pyridine group, a pyrimidine group, an indene group, a fluorene group, a spiro-bifluorene group, a benzofluorene group, a dibenzofluorene group, an indole group, a carbazole group, a benzocarbazole group, a dibenzocarbazole group, a furan group, a benzofuran group, a dibenzofuran group, a naphthofuran group, a benzonaphthofuran group, a dinaphthofuran group, a thiophene group, a benzothiophene group, a dibenzothiophene group, a naphthothiophene group, a benzonapthothiophene group, and a dinaphthothiophene group, $X_{301}$ may be O, S, or N-[($L_{304}$)$_{xb4}$-$R_{304}$], $R_{311}$ to $R_{314}$ may each independently be selected from hydrogen, deuterium, —F, —Cl, —Br, —I, a hydroxyl group, a cyano group, a nitro group, an amidino group, a hydrazino group, a hydrazono group, a $C_1$-$C_{20}$ alkyl group, a $C_1$-$C_{20}$ alkoxy group, a phenyl group, a biphenyl group, a terphenyl group, a naphthyl group —Si($Q_{31}$)($Q_{32}$)($Q_{33}$), —N(Q$_{31}$)(Q$_{32}$), —B(Q$_{31}$)(Q$_{32}$), —C(=O)(Q$_{31}$), —S(=O)$_2$(Q$_{31}$), and —P(=O)(Q$_{31}$)(Q$_{32}$), xb22 and xb23 may each independently be 0, 1, or 2, L$_{301}$, xb1, R$_{301}$, and Q$_{31}$ to Q$_{33}$ may respectively be understood by referring to the descriptions therefor provided herein, L$_{302}$ to L$_{304}$ may each be understood by referring to the descriptions for L$_{301}$ provided herein, xb2 to xb4 may each be understood by referring to the descriptions for xb1 provided herein, and R$_{302}$ to R$_{304}$ may each be understood by referring to the descriptions for R$_{301}$ provided herein.

In some embodiments, in Formulae 301, 301-1, and 301-2, L$_{301}$ to L$_{304}$ may each independently be selected from a phenylene group, a naphthylene group, a fluorenylene group, a spiro-bifluorenylene group, a benzofluorenylene group, a dibenzofluorenylene group, a phenanthrenylene group, an anthracenylene group, a fluoranthenylene group, a triphenylenylene group, a pyrenylene group, a chrysenylene group, a perylenylene group, a pentaphenylene group, a hexacenylene group, a pentacenylene group, a thiophenylene group, a furanylene group, a carbazolylene group, an indolylene group, an isoindolylene group, a benzofuranylene group, a benzothiophenylene group, a dibenzofuranylene group, a dibenzothiophenylene group, a benzocarbazolylene group, a dibenzocarbazolylene group, a dibenzosilolylene group, a pyridinylene group, an imidazolylene group, a pyrazolylene group, a thiazolylene group, an isothiazolylene group, an oxazolylene group, an isoxazolylene group, a thiadiazolylene group, an oxadiazolylene group, a pyrazinylene group, a pyrimidinylene group, a pyridazinylene group, a triazinylene group, a quinolinylene group, an isoquinolinylene group, a benzoquinolinylene group, a phthalazinylene group, a naphthyridinylene group, a quinoxalinylene group, a quinazolinylene group, a cinnolinylene group, a phenanthridinylene group, an acridinylene group, a phenanthrolinylene group, a phenazinylene group, a benzimidazolylene group, an isobenzothiazolylene group, a benzoxazolylene group, an isobenzoxazolylene group, a triazolylene group, a tetrazolylene group, an imidazopyridinylene group, an imidazopyrimidinylene group, and an azacarbazolylene group; and a phenylene group, a naphthylene group, a fluorenylene group, a spiro-bifluorenylene group, a benzofluorenylene group, a dibenzofluorenylene group, a phenanthrenylene group, an anthracenylene group, a fluoranthenylene group, a triphenylenylene group, a pyrenylene group, a chrysenylene group, a perylenylene group, a pentaphenylene group, a hexacenylene group, a pentacenylene group, a thiophenylene group, a furanylene group, a carbazolylene group, an indolylene group, an isoindolylene group, a benzofuranylene group, a benzothiophenylene group, a dibenzofuranylene group, a dibenzothiophenylene group, a benzocarbazolylene group, a dibenzocarbazolylene group, a dibenzosilolylene group, a pyridinylene group, an imidazolylene group, a pyrazolylene group, a thiazolylene group, an isothiazolylene group, an oxazolylene group, an isoxazolylene group, a thiadiazolylene group, an oxadiazolylene group, a pyrazinylene group, a pyrimidinylene group, a pyridazinylene group, a triazinylene group, a quinolinylene group, an isoquinolinylene group, a benzoquinolinylene group, a phthalazinylene group, a naphthyridinylene group, a quinoxalinylene group, a quinazolinylene group, a cinnolinylene group, a phenanthridinylene group, an acridinylene group, a phenanthrolinylene group, a phenazinylene group, a benzimidazolylene group, an isobenzothiazolylene group, a benzoxazolylene group, an isobenzoxazolylene group, a triazolylene group, a tetrazolylene group, an imidazopyridinylene group, an imidazopyrimidinylene group, and an azacarbazolylene group, each substituted with at least one selected from deuterium, —F, —Cl, —Br, —I, a hydroxyl group, a cyano group, a nitro group, an amidino group, a hydrazino group, a hydrazono group, a C$_1$-C$_{20}$ alkyl group, a C$_1$-C$_{20}$ alkoxy group, a phenyl group, a biphenyl group, a terphenyl group, a naphthyl group, a fluorenyl group, a spiro-bifluorenyl group, a benzofluorenyl group, a dibenzofluorenyl group, a phenanthrenyl group, an anthracenyl group, a fluoranthenyl group, a triphenylenyl group, a pyrenyl group, a chrysenyl group, a perylenyl group, a pentaphenyl group, a hexacenyl group, a pentacenyl group, a thiophenyl group, a furanyl group, a carbazolyl group, an indolyl group, an isoindolyl group, a benzofuranyl group, a benzothiophenyl group, a dibenzofuranyl group, a dibenzothiophenyl group, a benzocarbazolyl group, a dibenzocarbazolyl group, a dibenzosilolyl group, a pyridinyl group, an imidazolyl group, a pyrazolyl group, a thiazolyl group, an isothiazolyl group, an oxazolyl group, an isoxazolyl group, a thiadiazolyl group, an oxadiazolyl group, a pyrazinyl group, a pyrimidinyl group, a pyridazinyl group, a triazinyl group, a quinolinyl group, an isoquinolinyl group, a benzoquinolinyl group, a phthalazinyl group, a naphthyridinyl group, a quinoxalinyl group, a quinazolinyl group, a cinnolinyl group, a phenanthridinyl group, an acridinyl group, a phenanthrolinyl group, a phenazinyl group, a benzimidazolyl group, an isobenzothiazolyl group, a benzoxazolyl group, an isobenzoxazolyl group, a triazolyl group, a tetrazolyl group, an imidazopyridinyl group, an imidazopyrimidinyl group, an azacarbazolyl group, —Si(Q$_{31}$)(Q$_{32}$)(Q$_{33}$), —N(Q$_{31}$)(Q$_{32}$), —B(Q$_{31}$)(Q$_{32}$), —C(=O)(Q$_{31}$), —S(=O)$_2$(Q$_{31}$), and —P(=O)(Q$_{31}$)(Q$_{32}$), wherein Q$_{31}$ to Q$_{33}$ may respectively be understood by referring to the descriptions therefor provided herein.

In some embodiments, in Formulae 301, 301-1, and 301-2, R$_{301}$ to R$_{304}$ may each independently be selected from a phenyl group, a biphenyl group, a terphenyl group, a naphthyl group, a fluorenyl group, a spiro-bifluorenyl group, a benzofluorenyl group, a dibenzofluorenyl group, a phenanthrenyl group, an anthracenyl group, a fluoranthenyl group, a triphenylenyl group, a pyrenyl group, a chrysenyl group, a perylenyl group, a pentaphenyl group, a hexacenyl group, a pentacenyl group, a thiophenyl group, a furanyl group, a carbazolyl group, an indolyl group, an isoindolyl group, a benzofuranyl group, a benzothiophenyl group, a dibenzofuranyl group, a dibenzothiophenyl group, a benzocarbazolyl group, a dibenzocarbazolyl group, a dibenzosilolyl group, a pyridinyl group, an imidazolyl group, a pyrazolyl group, a thiazolyl group, an isothiazolyl group, an oxazolyl group, an isoxazolyl group, a thiadiazolyl group, an oxadiazolyl group, a pyrazinyl group, a pyrimidinyl group, a pyridazinyl group, a triazinyl group, a quinolinyl group, an isoquinolinyl group, a benzoquinolinyl group, a phthalazinyl group, a naphthyridinyl group, a quinoxalinyl group, a quinazolinyl group, a cinnolinyl group, a phenanthridinyl group, an acridinyl group, a phenanthrolinyl group, a phenazinyl group, a benzimidazolyl group, an isobenzothiazolyl group, a benzoxazolyl group, an isobenzoxazolyl group, a triazolyl group, a tetrazolyl group, an imidazopyridinyl group, an imidazopyrimidinyl group, and an azacarbazolyl group; and a phenyl group, a biphenyl group, a terphenyl group, a naphthyl group, a fluorenyl group, a spiro-bifluorenyl group, a benzofluorenyl group, a dibenzofluorenyl group, a phenanthrenyl group, an anthracenyl group, a fluoranthenyl group, a triphenylenyl group, a pyrenyl group, a chrysenyl group, a perylenyl group, a pentaphenyl group, a hexacenyl group, a pentacenyl group, a thiophenyl group, a furanyl group, a carbazolyl group, an indolyl group, an isoindolyl group, a benzofuranyl group, a benzothiophenyl group, a dibenzofuranyl group, a dibenzothiophenyl group, a benzocarbazolyl group, a dibenzocarbazolyl group, a dibenzosilolyl group, a pyridinyl group, an imidazolyl group, a pyrazolyl group, a thiazolyl group, an isothiazolyl group, an oxazolyl group, an isoxazolyl group, a thiadiazolyl group, an oxadiazolyl group, a pyrazinyl group, a pyrimidinyl group, a pyridazinyl group, a triazinyl group, a quinolinyl group, an isoquinolinyl group, a benzoquinolinyl group, a phthalazinyl group, a naphthyridinyl group, a quinoxalinyl group, a quinazolinyl group, a cinnolinyl group, a phenanthridinyl group, an acridinyl group, a phenanthrolinyl group, a phenazinyl group, a benzimidazolyl group, an isobenzothiazolyl group, a benzoxazolyl group, an isobenzoxazolyl group, a triazolyl group, a tetrazolyl group, an imidazopyridinyl group, an imidazopyrimidinyl group, and an azacarbazolyl group, each substituted with at least one selected from deuterium, —F, —Cl, —Br, —I, a hydroxyl group, a cyano group, a nitro group, an amidino group, a hydrazino group, a hydrazono group, a $C_1$-$C_{20}$ alkyl group, a $C_1$-$C_{20}$ alkoxy group, a phenyl group, a biphenyl group, a terphenyl group, a naphthyl group, a fluorenyl group, a spiro-bifluorenyl group, a benzofluorenyl group, a dibenzofluorenyl group, a phenanthrenyl group, an anthracenyl group, a fluoranthenyl group, a triphenylenyl group, a pyrenyl group, a chrysenyl group, a perylenyl group, a pentaphenyl group, a hexacenyl group, a pentacenyl group, a thiophenyl group, a furanyl group, a carbazolyl group, an indolyl group, an isoindolyl group, a benzofuranyl group, a benzothiophenyl group, a dibenzofuranyl group, a dibenzothiophenyl group, a benzocarbazolyl group, a dibenzocarbazolyl group, a dibenzosilolyl group, a pyridinyl group, an imidazolyl group, a pyrazolyl group, a thiazolyl group, an isothiazolyl group, an oxazolyl group, an isoxazolyl group, a thiadiazolyl group, an oxadiazolyl group, a pyrazinyl group, a pyrimidinyl group, a pyridazinyl group, a triazinyl group, a quinolinyl group, an isoquinolinyl group, a benzoquinolinyl group, a phthalazinyl group, a naphthyridinyl group, a quinoxalinyl group, a quinazolinyl group, a cinnolinyl group, a phenanthridinyl group, an acridinyl group, a phenanthrolinyl group, a phenazinyl group, a benzimidazolyl group, an isobenzothiazolyl group, a benzoxazolyl group, an isobenzoxazolyl group, a triazolyl group, a tetrazolyl group, an imidazopyridinyl group, an imidazopyrimidinyl group, an azacarbazolyl group, —Si($Q_{31}$)($Q_{32}$)($Q_{33}$), —N($Q_{31}$)($Q_{32}$), —B($Q_{31}$)($Q_{32}$), —C(=O)($Q_{31}$), —S(=O)$_2$($Q_{31}$), and —P(=O)($Q_{31}$)($Q_{32}$), wherein $Q_{31}$ to $Q_{33}$ may respectively be understood by referring to the descriptions therefor provided herein.

In some embodiments, the host may include an alkaline earth metal complex. For example, the host may include an aluminum (Al) complex, e.g., Alq, a beryllium (Be) complex, e.g., Compound H55, a magnesium (Mg) complex, or a zinc (Zn) complex.

The host may include at least one selected from 9,10-di(2-naphthyl)anthracene (ADN), 2-methyl-9,10-bis(naphthalen-2-yl)anthracene (MADN), 9,10-di-(2-naphthyl)-2-t-butyl-anthracene (TBADN), 4,4'-bis(N-carbazolyl)-1,1'-biphenyl (CBP), 1,3-di-9-carbazolylbenzene (mCP), 1,3,5-tri(carbazol-9-yl)benzene (TCP), bis(4-(9H-carbazol-9-yl)phenyl)diphenylsilane (BCPDS), 4-(1-(4-(diphenylamino)phenyl)cyclohexyl)phenyl)diphenyl-phosphine oxide (POPCPA), and Compounds H1 to H55, but embodiments are not limited thereto:

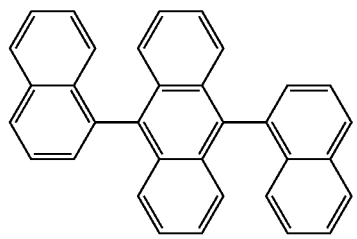

H1

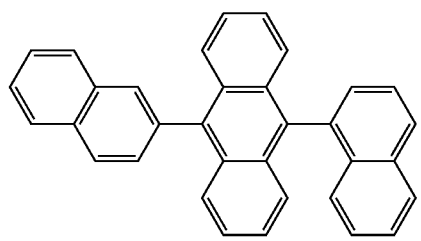

H2

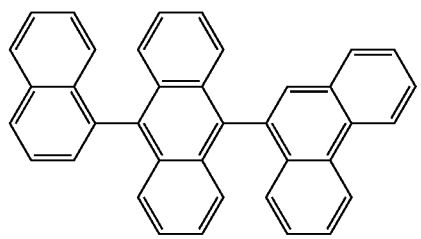

H3

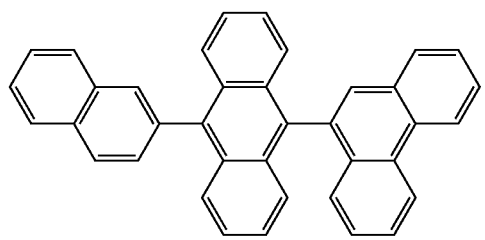

H4

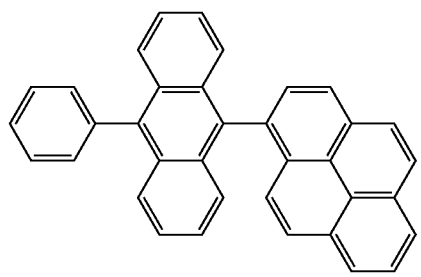

H5

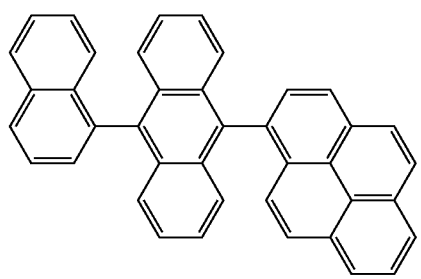

H6

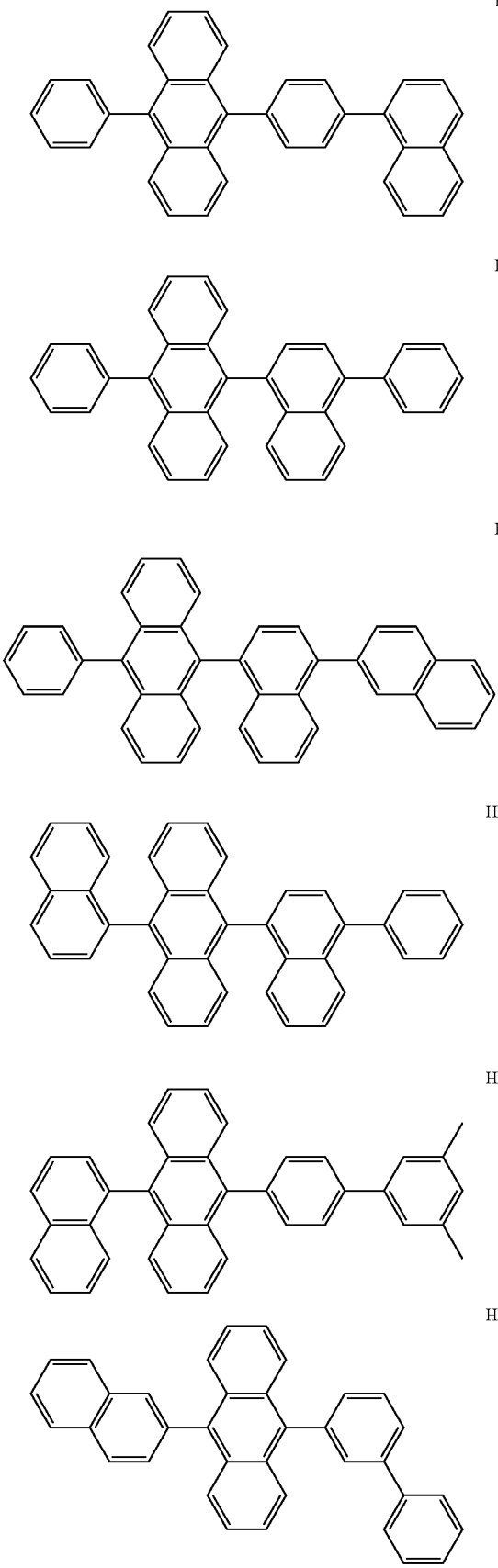
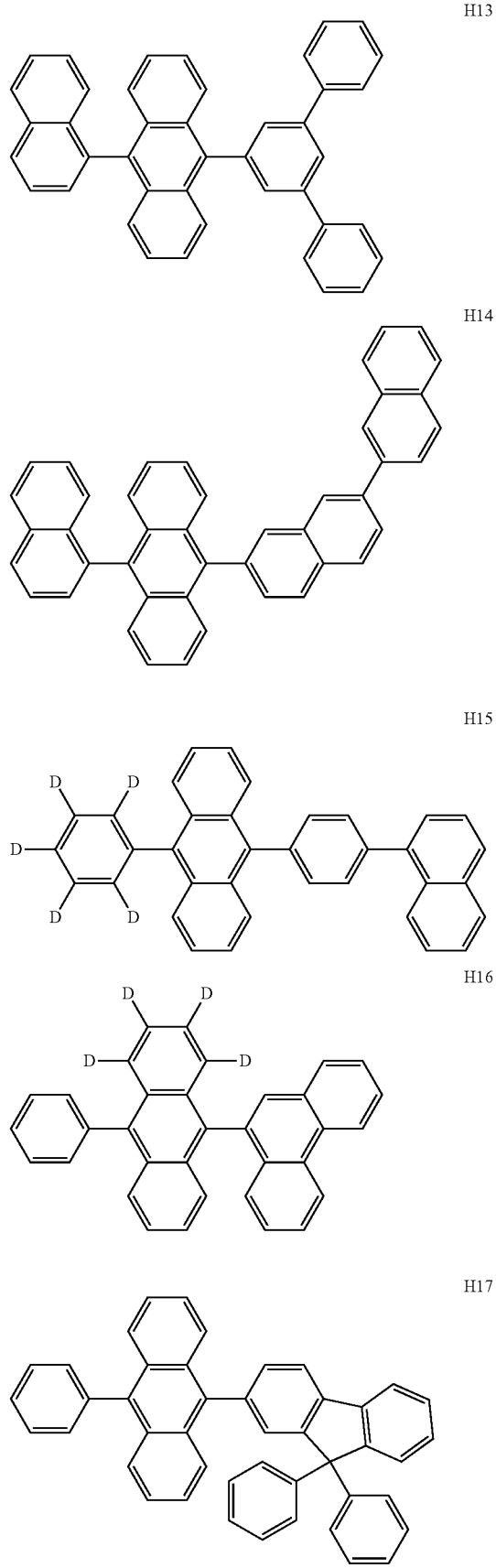

H18
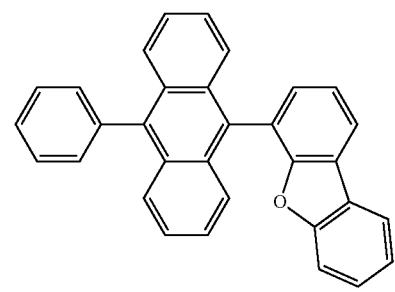
H19
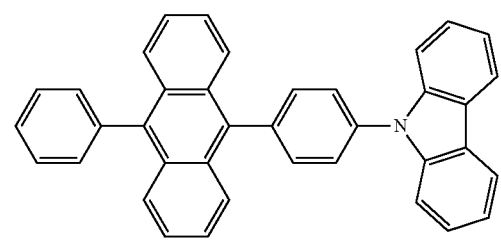
H20
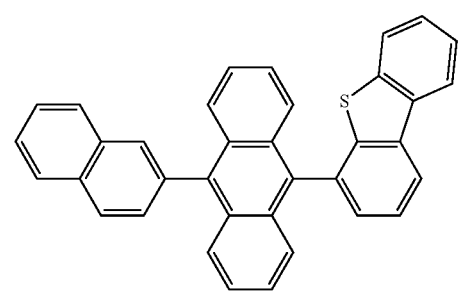
H21
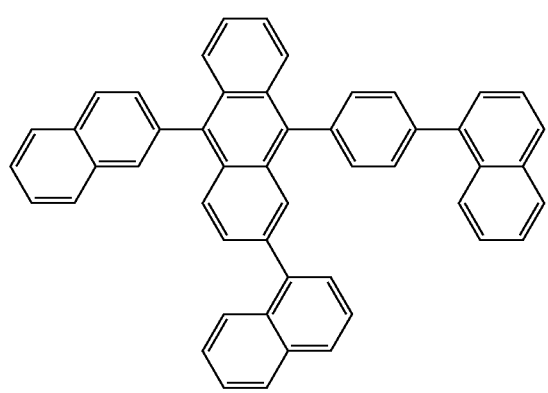
H22
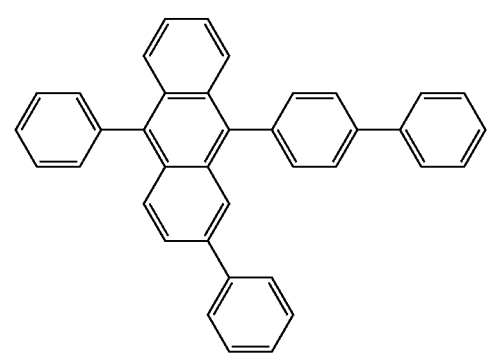
H23
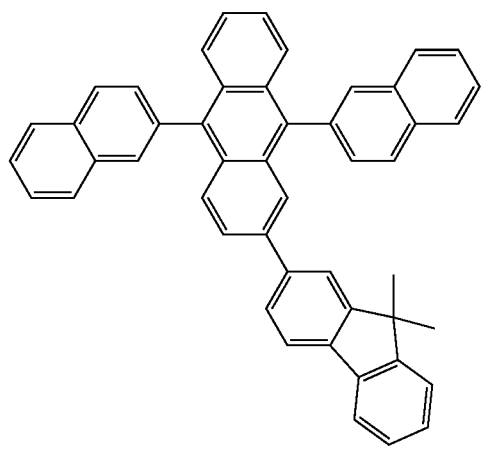
H24
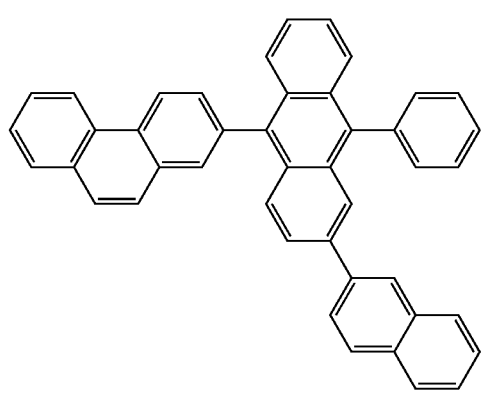
H25
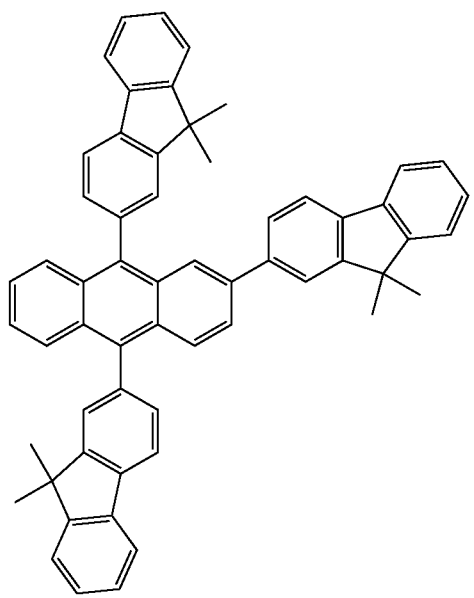

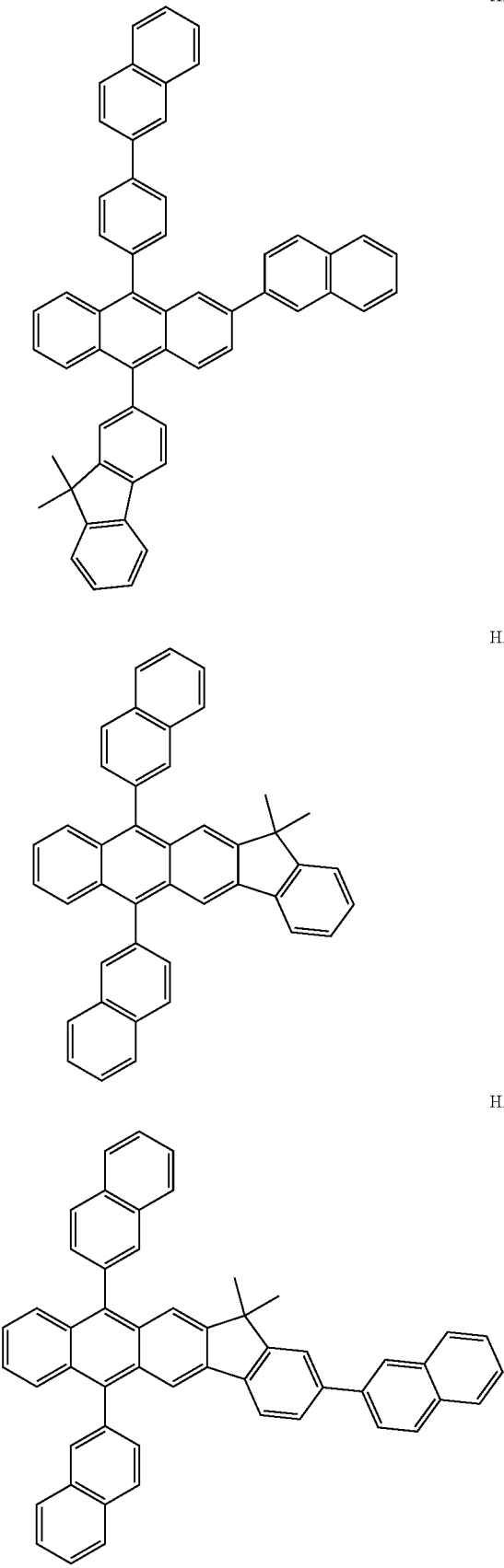
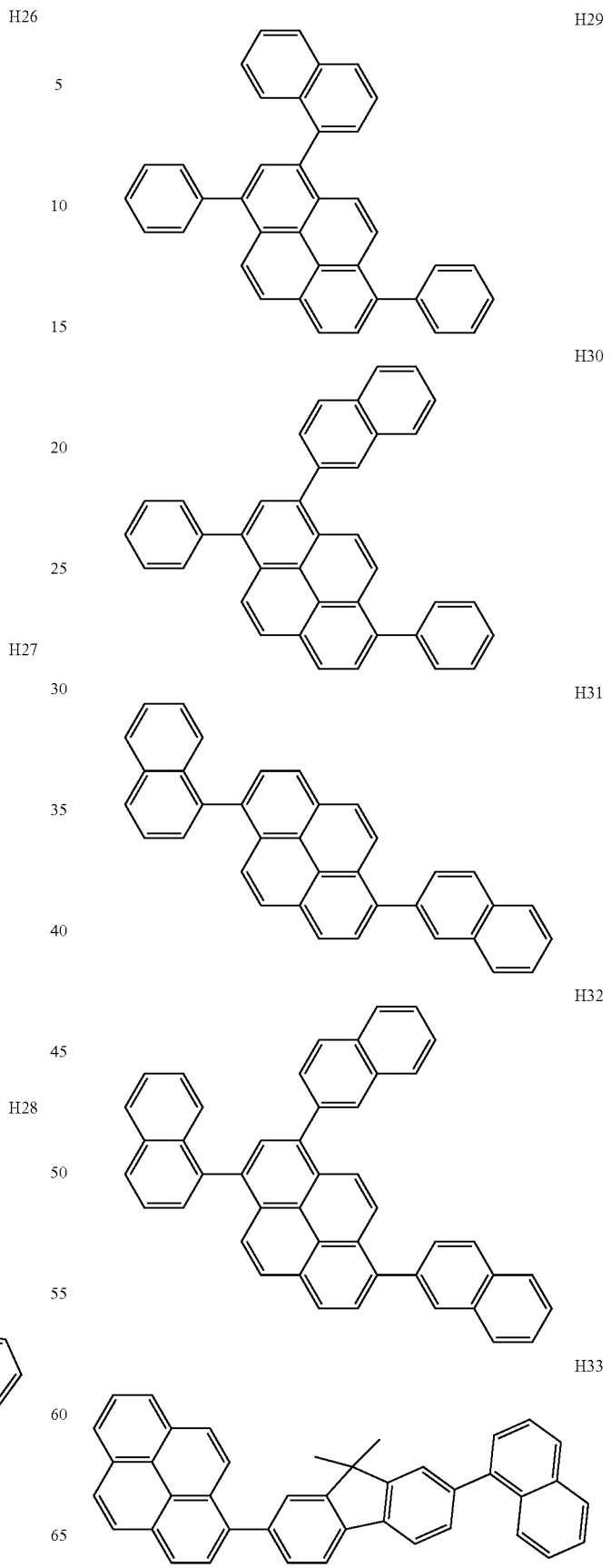
H26
H27
H28
H29
H30
H31
H32
H33

H34
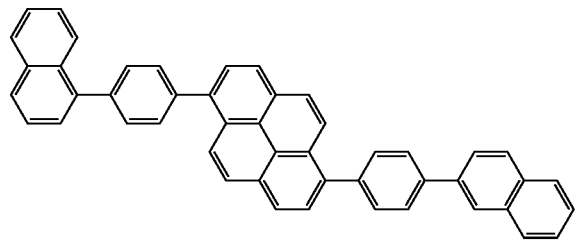
H35
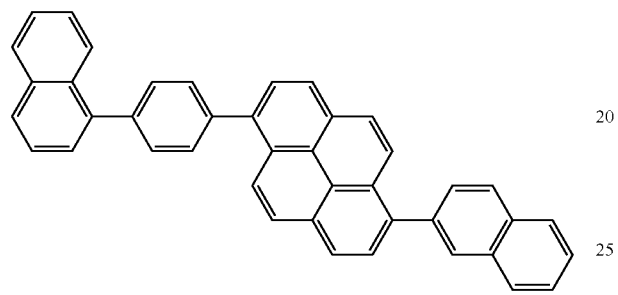
H36
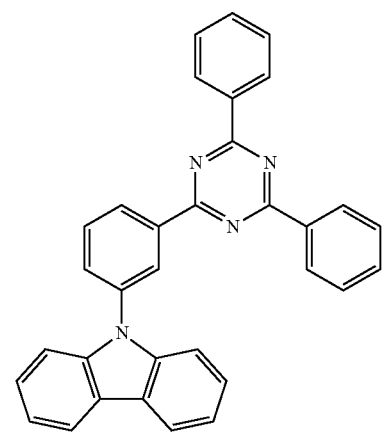
H37
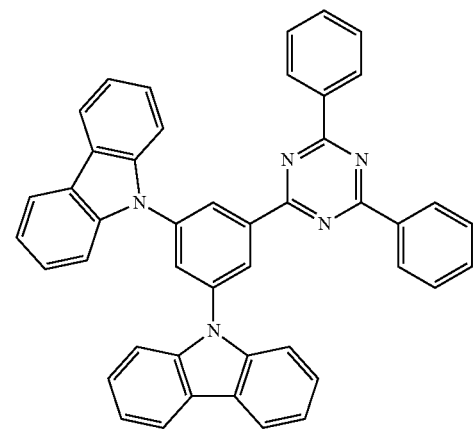
H38
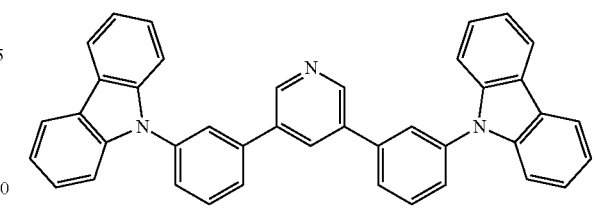
H39
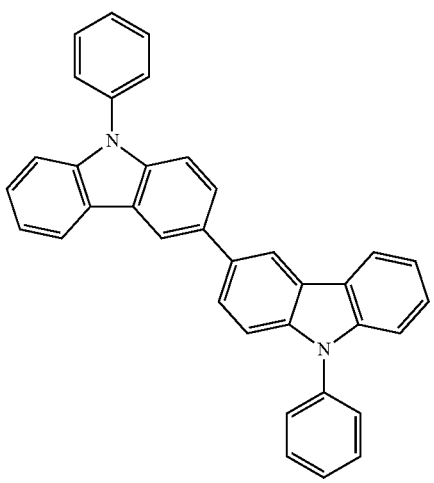
H40
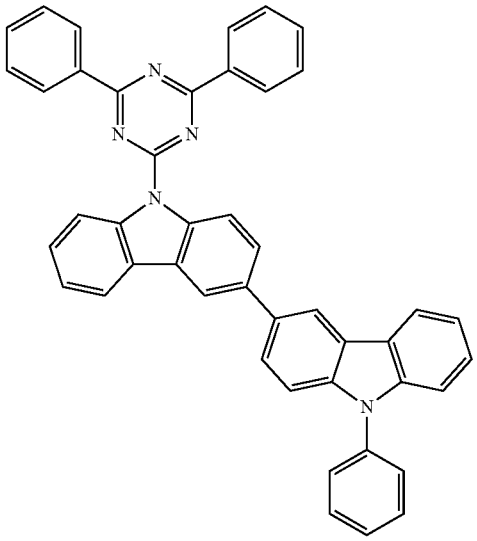

-continued
H41
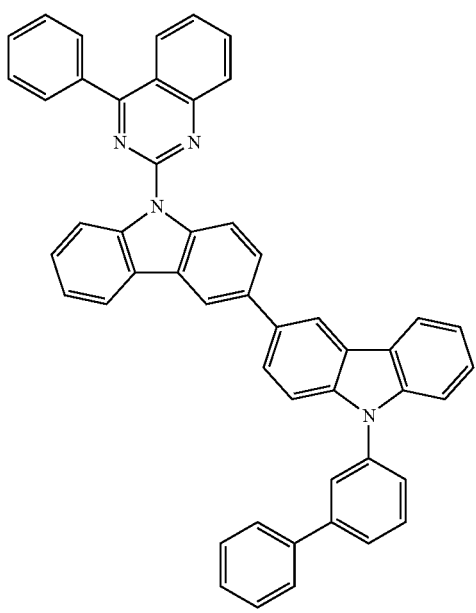
H42
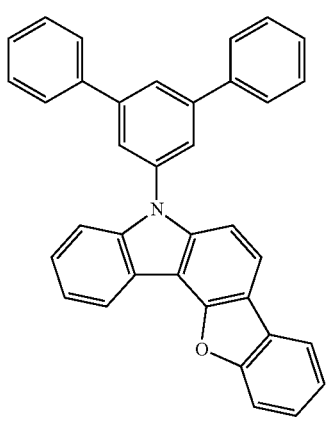
H43
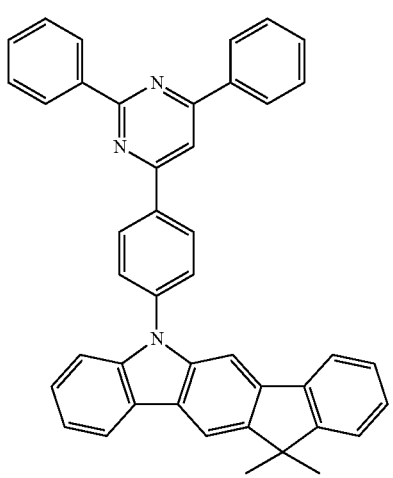
-continued
H44
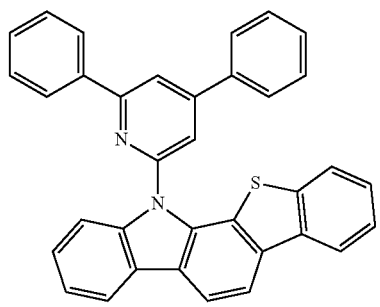
H45
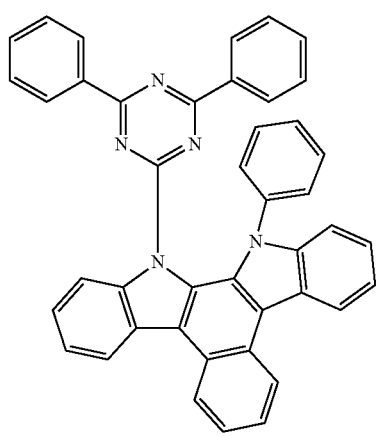
H46
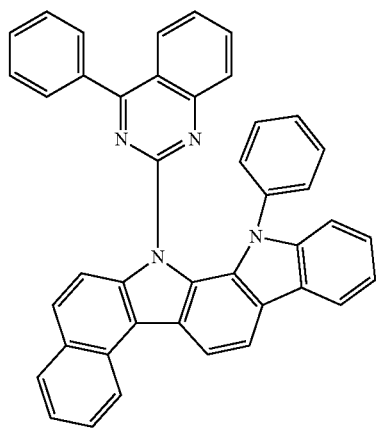
H47
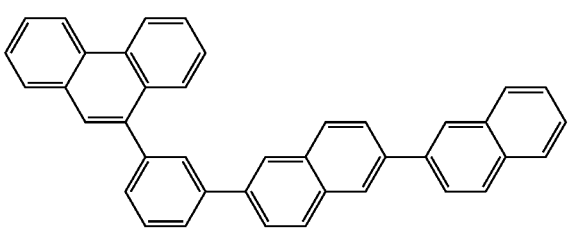
H48
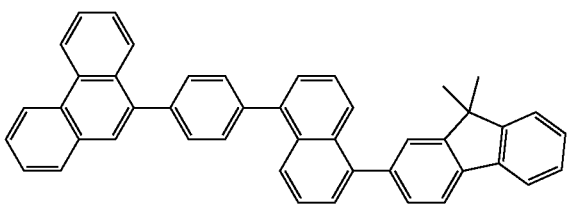

H49
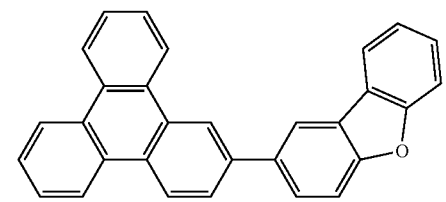

H50
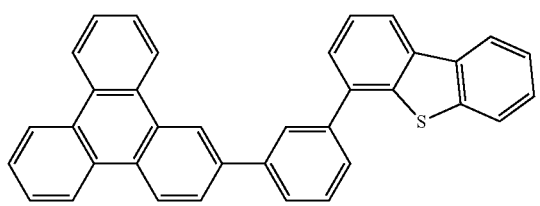

H51
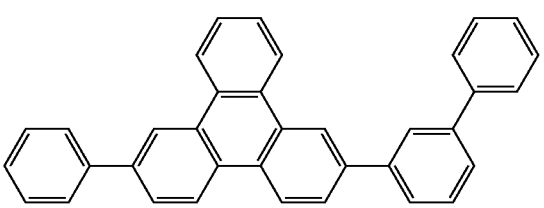

H52
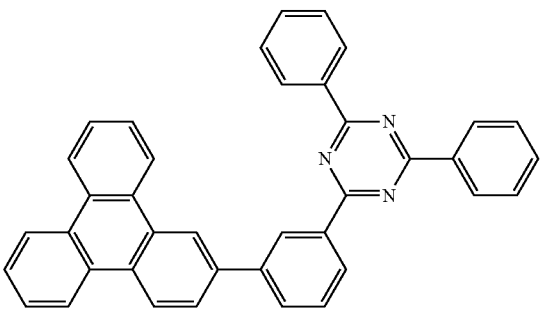

H53
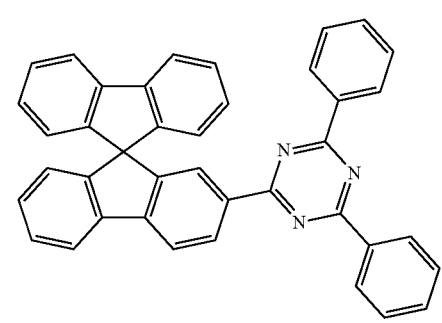

H54
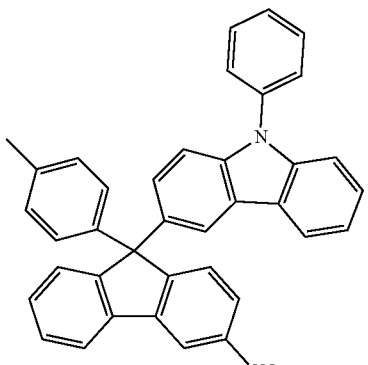

H55
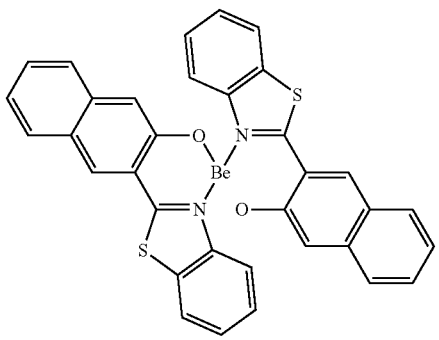

In some embodiments, the host may include at least one selected from a silicon-containing compound (e.g., BCPDS or the like used in Examples) and a phosphine oxide-containing compound (e.g., POPCPA or the like used in Examples).

The host may include one type (or kind) of compounds only or two or more different types (or kinds) of compounds (for example, the constituent hosts in Examples were BCPDS and POPCPA). As such, embodiments may be modified in various suitable ways.

In some embodiments, the host may not be any of Compound A, Compound B, Compound C ($Alq_3$), or Compound D (CBP):

A
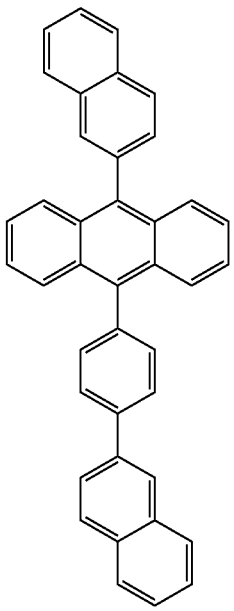

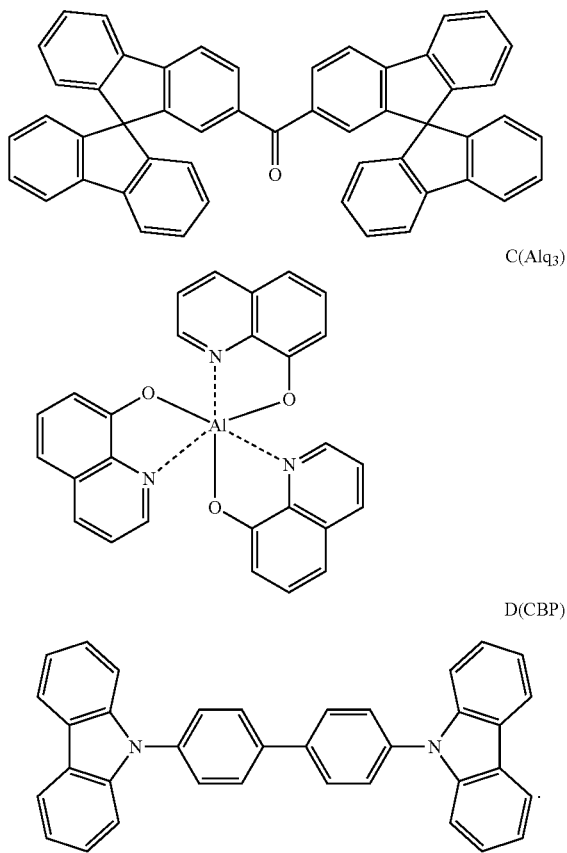

B

C(Alq₃)

D(CBP)

Electron Transport Region in Organic Layer 150

The electron transport region may have i) a single-layered structure consisting of a single layer consisting of a single material, ii) a single-layered structure consisting of a single layer including a plurality of different materials, or iii) a multi-layered structure each having a plurality of layers, each having a plurality of different materials.

The electron transport region may include at least one selected from a buffer layer, a hole blocking layer, an electron control layer, an electron transport layer, and an electron injection layer, but embodiments are not limited thereto.

In some embodiments, the electron transport region may have an electron transport layer/electron injection layer structure, a hole blocking layer/electron transport layer/electron injection layer structure, an electron control layer/electron transport layer/electron injection layer structure, or a buffer layer/electron transport layer/electron injection layer structure, wherein layers of each structure are sequentially stacked on the near-infrared light-emitting layer in each stated order, but embodiments are not limited thereto.

The electron transport region (for example, the hole blocking layer, the electron control layer, or the electron transport layer in the electron transport region) may include a metal-free compound including at least one π electron-depleted nitrogen-containing ring.

The term "π electron-depleted nitrogen-containing ring," as used herein, refers to a $C_1$-$C_{60}$ heterocyclic group having at least one *—N=*' moiety as a ring-forming moiety.

For example, the "π electron-depleted nitrogen-containing ring" may be i) a 5-membered to 7-membered hetero- monocyclic group having at least one *—N=*' moiety, ii) a heteropolycyclic group in which at least two 5-membered to 7-membered heteromonocyclic groups, each having at least one *—N=*' moiety, are condensed, or iii) a heteropolycyclic group in which at least one of a 5-membered to 7-membered heteromonocyclic group, each having at least one *—N=*' moiety, is condensed with (e.g., combined together with) at least one $C_5$-$C_{60}$ carbocyclic group.

Examples of the π electron-depleted nitrogen-containing ring may include an imidazole, a pyrazole, a thiazole, an isothiazole, an oxazole, an isoxazole, a pyridine, a pyrazine, a pyrimidine, a pyridazine, an indazole, a purine, a quinoline, an isoquinoline, a benzoquinoline, a phthalazine, a naphthyridine, a quinoxaline, a quinazoline, a cinnoline, a phenanthridine, an acridine, a phenanthroline, a phenazine, a benzimidazole, an iso-benzothiazole, a benzoxazole, an isobenzoxazole, a triazole, a tetrazole, an oxadiazole, a triazine, a thiadiazole, an imidazopyridine, an imidazopyrimidine, and an azacarbazole, but embodiments are not limited thereto.

In some embodiments, the electron transport region may include a compound represented by Formula 601:

$$[Ar_{601}]_{xe11}\text{-}[(L_{601})_{xe1}\text{-}R_{601}]_{xe21} \qquad \text{Formula 601}$$

wherein, in Formula 601, $Ar_{601}$ may be selected from a substituted or unsubstituted $C_5$-$C_{60}$ carbocyclic group and a substituted or unsubstituted $C_1$-$C_{60}$ heterocyclic group, xe11 may be 1, 2, or 3, $L_{601}$ may be selected from a substituted or unsubstituted $C_3$-$C_{10}$ cycloalkylene group, a substituted or unsubstituted $C_1$-$C_{10}$ heterocycloalkylene group, a substituted or unsubstituted $C_3$-$C_{10}$ cycloalkenylene group, a substituted or unsubstituted $C_1$-$C_{10}$ heterocycloalkenylene group, a substituted or unsubstituted $C_6$-$C_{60}$ arylene group, a substituted or unsubstituted $C_1$-$C_{60}$ heteroarylene group, a substituted or unsubstituted divalent non-aromatic condensed polycyclic group, and a substituted or unsubstituted divalent non-aromatic condensed heteropolycyclic group, xe1 may be an integer from 0 to 5, $R_{601}$ may be selected from a substituted or unsubstituted $C_3$-$C_{10}$ cycloalkyl group, a substituted or unsubstituted $C_1$-$C_{10}$ heterocycloalkyl group, a substituted or unsubstituted $C_3$-$C_{10}$ cycloalkenyl group, a substituted or unsubstituted $C_1$-$C_{10}$ heterocycloalkenyl group, a substituted or unsubstituted $C_6$-$C_{60}$ aryl group, a substituted or unsubstituted $C_6$-$C_{60}$ aryloxy group, a substituted or unsubstituted $C_6$-$C_{60}$ arylthio group, a substituted or unsubstituted $C_1$-$C_{60}$ heteroaryl group, a substituted or unsubstituted monovalent non-aromatic condensed polycyclic group, a substituted or unsubstituted monovalent non-aromatic condensed heteropolycyclic group, —Si($Q_{601}$)($Q_{602}$)($Q_{603}$), —C(=O)($Q_{601}$), —S(=O)$_2$($Q_{601}$), and —P(=O)($Q_{601}$)($Q_{602}$), wherein $Q_{601}$ to $Q_{603}$ may each independently be a $C_1$-$C_{10}$ alkyl group, a $C_1$-$C_{10}$ alkoxy group, a phenyl group, a biphenyl group, a terphenyl group, or a naphthyl group, and xe21 may be an integer from 1 to 5.

In an embodiment, at least one selected from $Ar_{601}$(s) in the number of xe11 and $R_{601}$(s) in the number of xe21 may include the π electron-depleted nitrogen-containing ring.

In an embodiment, in Formula 601, $Ar_{601}$ may be selected from a benzene group, a naphthalene group, a fluorene group, a spiro-bifluorene group, a benzofluorene group, a dibenzofluorene group, a phenalene group, a phenanthrene group, an anthracene group, a fluoranthene group, a triphenylene group, a pyrene group, a chrysene group, a naphthacene group, a picene group, a perylene group, a pentaphene group, an indenoanthracene group, a dibenzofuran group, a dibenzothiophene group, a carbazole group, an imidazole group, a pyrazole group, a thiazole group, an isothiazole group, an oxazole group, an isoxazole group, a pyridine group, a pyrazine group, a pyrimidine group, a pyridazine group, an indazole group, a purine group, a quinoline group, an isoquinoline group, a benzoquinoline group, a phthalazine group, a naphthyridine group, a quinoxaline group, a quinazoline group, a cinnoline group, a phenanthridine group, an acridine group, a phenanthroline group, a phenazine group, a benzimidazole group, an iso-benzothiazole group, a benzoxazole group, an isobenzoxazole group, a triazole group, a tetrazole group, an oxadiazole group, a triazine group, a thiadiazole group, an imidazopyridine group, an imidazopyrimidine group, and an azacarbazole group; and a benzene group, a naphthalene group, a fluorene group, a spiro-bifluorene group, a benzofluorene group, a dibenzofluorene group, a phenalene group, a phenanthrene group, an anthracene group, a fluoranthene group, a triphenylene group, a pyrene group, a chrysene group, a naphthacene group, a picene group, a perylene group, a pentaphene group, an indenoanthracene group, a dibenzofuran group, a dibenzothiophene group, a carbazole group, an imidazole group, a pyrazole group, a thiazole group, an isothiazole group, an oxazole group, an isoxazole group, a pyridine group, a pyrazine group, a pyrimidine group, a pyridazine group, an indazole group, a purine group, a quinoline group, an isoquinoline group, a benzoquinoline group, a phthalazine group, a naphthyridine group, a quinoxaline group, a quinazoline group, a cinnoline group, a phenanthridine group, an acridine group, a phenanthroline group, a phenazine group, a benzimidazole group, an iso-benzothiazole group, a benzoxazole group, an isobenzoxazole group, a triazole group, a tetrazole group, an oxadiazole group, a triazine group, a thiadiazole group, an imidazopyridine group, an imidazopyrimidine group, and an azacarbazole group, each substituted with at least one selected from deuterium, —F, —Cl, —Br, —I, a hydroxyl group, a cyano group, a nitro group, an amidino group, a hydrazino group, a hydrazono group, a $C_1$-$C_{20}$ alkyl group, a $C_1$-$C_{20}$ alkoxy group, a phenyl group, a biphenyl group, a terphenyl group, a naphthyl group, —Si($Q_{31}$)($Q_{32}$)($Q_{33}$), —S(=O)$_2$($Q_{31}$), and —P(=O)($Q_{31}$)($Q_{32}$), wherein $Q_{31}$ to $Q_{33}$ may each independently be selected from a $C_1$-$C_{10}$ alkyl group, a $C_1$-$C_{10}$ alkoxy group, a phenyl group, a biphenyl group, a terphenyl group, and a naphthyl group.

When xe11 in Formula 601 is 2 or greater, at least two $Ar_{601}$(s) may be bound via a single bond.

In one or more embodiments, $Ar_{601}$ in Formula 601 may be an anthracene group.

In some embodiments, the compound represented by Formula 601 may be represented by Formula 601-1:

Formula 601-1

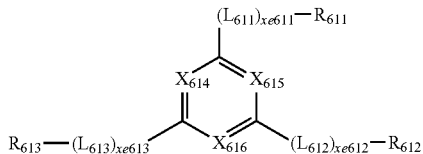

wherein, in Formula 601-1, $X_{614}$ may be N or C($R_{614}$), $X_{615}$ may be N or C($R_{615}$), $X_{616}$ may be N or C($R_{616}$), at least one selected from $X_{614}$ to $X_{616}$ may be N, $L_{611}$ to $L_{613}$ may each independently be understood by referring to the descriptions for $L_{601}$ provided herein, xe611 to xe613 may each independently be understood by referring to the descriptions for xe1 provided herein, $R_{611}$ to $R_{613}$ may each independently be understood by referring to the descriptions for $R_{601}$ provided herein, and $R_{614}$ to $R_{616}$ may each independently be selected from hydrogen, deuterium, —F, —Cl, —Br, —I, a hydroxyl group, a cyano group, a nitro group, an amidino group, a hydrazino group, a hydrazono group, a $C_1$-$C_{20}$ alkyl group, a $C_1$-$C_{20}$ alkoxy group, a phenyl group, a biphenyl group, a terphenyl group, and a naphthyl group.

In an embodiment, in Formulae 601 and 601-1, $L_{601}$ and $L_{611}$ to $L_{613}$ may each independently be selected from:

a phenylene group, a naphthylene group, a fluorenylene group, a spiro-bifluorenylene group, a benzofluorenylene group, a dibenzofluorenylene group, a phenanthrenylene group, an anthracenylene group, a fluoranthenylene group, a triphenylenylene group, a pyrenylene group, a chrysenylene group, a perylenylene group, a pentaphenylene group, a hexacenylene group, a pentacenylene group, a thiophenylene group, a furanylene group, a carbazolylene group, an indolylene group, an isoindolylene group, a benzofuranylene group, a benzothiophenylene group, a dibenzofuranylene group, a dibenzothiophenylene group, a benzocarbazolylene group, a dibenzocarbazolylene group, a dibenzosilolylene group, a pyridinylene group, an imidazolylene group, a pyrazolylene group, a thiazolylene group, an isothiazolylene group, an oxazolylene group, an isoxazolylene group, a thiadiazolylene group, an oxadiazolylene group, a pyrazinylene group, a pyrimidinylene group, a pyridazinylene group, a triazinylene group, a quinolinylene group, an isoquinolinylene group, a benzoquinolinylene group, a phthalazinylene group, a naphthyridinylene group, a quinoxalinylene group, a quinazolinylene group, a cinnolinylene group, a phenanthridinylene group, an acridinylene group, a phenanthrolinylene group, a phenazinylene group, a benzimidazolylene group, an isobenzothiazolylene group, a benzoxazolylene group, an isobenzoxazolylene group, a triazolylene group, a tetrazolylene group, an imidazopyridinylene group, an imidazopyrimidinylene group, and an azacarbazolylene group; and a phenylene group, a naphthylene group, a fluorenylene group, a spiro-bifluorenylene group, a benzofluorenylene group, a dibenzofluorenylene group, a phenanthrenylene group, an anthracenylene group, a fluoranthenylene group, a triphenylenylene group, a pyrenylene group, a chrysenylene group, a perylenylene group, a pentaphenylene group, a hexacenylene group, a pentacenylene group, a thiophenylene group, a furanylene group, a carbazolylene group, an indolylene group, an isoindolylene group, a benzofuranylene group, a benzothiophenylene group, a dibenzofuranylene group, a dibenzothiophenylene group, a benzocarbazolylene group, a dibenzocarbazolylene group, a dibenzosilolylene group, a pyridinylene group, an imidazolylene group, a pyrazolylene group, a thiazolylene group, an isothiazolylene group, an oxazolylene group, an isoxazolylene group, a thiadiazolylene group, an oxadiazolylene group, a pyrazinylene group, a pyrimidinylene group, a pyridazinylene group, a triazinylene group, a quinolinylene group, an isoquinolinylene group, a benzoquinolinylene group, a phthalazinylene group, a naphthyridinylene group, a quinoxalinylene group, a quinazolinylene group, a cinnolinylene group, a phenanthridinylene group, an acridinylene group, a phenanthrolinylene group, a phenazinylene group, a benzimidazolylene group, an isobenzothiazolylene group, a benzoxazolylene group, an isobenzoxazolylene group, a triazolylene group, a tetrazolylene group, an imidazopyridinylene group, an imidazopyrimidinylene group, and an azacarbazolylene group, each substituted with at least one selected from deuterium, —F, —Cl, —Br, —I, a hydroxyl group, a cyano group, a nitro group, an amidino group, a hydrazino group, a hydrazono group, a $C_1$-$C_{20}$ alkyl group, a $C_1$-$C_{20}$ alkoxy group, a phenyl group, a biphenyl group, a terphenyl group, a naphthyl group, a fluorenyl group, a spiro-bifluorenyl group, a benzofluorenyl group, a dibenzofluorenyl group, a phenanthrenyl group, an anthracenyl group, a fluoranthenyl group, a triphenylenyl group, a pyrenyl group, a chrysenyl group, a perylenyl group, a pentaphenyl group, a hexacenyl group, a pentacenyl group, a thiophenyl group, a furanyl group, a carbazolyl group, an indolyl group, an isoindolyl group, a benzofuranyl group, a benzothiophenyl group, a dibenzofuranyl group, a dibenzothiophenyl group, a benzocarbazolyl group, a dibenzocarbazolyl group, a dibenzosilolyl group, a pyridinyl group, an imidazolyl group, a pyrazolyl group, a thiazolyl group, an isothiazolyl group, an oxazolyl group, an isoxazolyl group, a thiadiazolyl group, an oxadiazolyl group, a pyrazinyl group, a pyrimidinyl group, a pyridazinyl group, a triazinyl group, a quinolinyl group, an isoquinolinyl group, a benzoquinolinyl group, a phthalazinyl group, a naphthyridinyl group, a quinoxalinyl group, a quinazolinyl group, a cinnolinyl group, a phenanthridinyl group, an acridinyl group, a phenanthrolinyl group, a phenazinyl group, a benzimidazolyl group, an isobenzothiazolyl group, a benzoxazolyl group, an isobenzoxazolyl group, a triazolyl group, a tetrazolyl group, an imidazopyridinyl group, an imidazopyrimidinyl group, and an azacarbazolyl group, but embodiments are not limited thereto.

In one or more embodiments, in Formulae 601 and 601-1, xe1 and xe611 to xe613 may each independently be 0, 1, or 2.

In one or more embodiments, in Formulae 601 and 601-1, $R_{601}$ and $R_{611}$ to $R_{613}$ may each independently be selected from:

a phenyl group, a biphenyl group, a terphenyl group, a naphthyl group, a fluorenyl group, a spiro-bifluorenyl group, a benzofluorenyl group, a dibenzofluorenyl group, a phenanthrenyl group, an anthracenyl group, a fluoranthenyl group, a triphenylenyl group, a pyrenyl group, a chrysenyl group, a perylenyl group, a pentaphenyl group, a hexacenyl group, a pentacenyl group, a thiophenyl group, a furanyl group, a carbazolyl group, an indolyl group, an isoindolyl group, a benzofuranyl group, a benzothiophenyl group, a dibenzofuranyl group, a dibenzothiophenyl group, a benzocarbazolyl group, a dibenzocarbazolyl group, a dibenzosilolyl group, a pyridinyl group, an imidazolyl group, a pyrazolyl group, a thiazolyl group, an isothiazolyl group, an oxazolyl group, an isoxazolyl group, a thiadiazolyl group, an oxadiazolyl group, a pyrazinyl group, a pyrimidinyl group, a pyridazinyl group, a triazinyl group, a quinolinyl group, an isoquinolinyl group, a benzoquinolinyl group, a phthalazinyl group, a naphthyridinyl group, a quinoxalinyl group, a quinazolinyl group, a cinnolinyl group, a phenanthridinyl group, an acridinyl group, a phenanthrolinyl group, a phenazinyl group, a benzimidazolyl group, an isobenzothiazolyl group, a benzoxazolyl group, an isobenzoxazolyl group, a triazolyl group, a tetrazolyl group, an imidazopyridinyl group, an imidazopyrimidinyl group, and an azacarbazolyl group;

a phenyl group, a biphenyl group, a terphenyl group, a naphthyl group, a fluorenyl group, a spiro-bifluorenyl group, a benzofluorenyl group, a dibenzofluorenyl group, a phenanthrenyl group, an anthracenyl group, a fluoranthenyl group, a triphenylenyl group, a pyrenyl group, a chrysenyl group, a perylenyl group, a pentaphenyl group, a hexacenyl group, a pentacenyl group, a thiophenyl group, a furanyl group, a carbazolyl group, an indolyl group, an isoindolyl group, a benzofuranyl group, a benzothiophenyl group, a dibenzofuranyl group, a dibenzothiophenyl group, a benzocarbazolyl group, a dibenzocarbazolyl group, a dibenzosilolyl group, a pyridinyl group, an imidazolyl group, a pyrazolyl group, a thiazolyl group, an isothiazolyl group, an oxazolyl group, an isoxazolyl group, a thiadiazolyl group, an oxadiazolyl group, a pyrazinyl group, a pyrimidinyl group, a pyridazinyl group, a triazinyl group, a quinolinyl group, an isoquinolinyl group, a benzoquinolinyl group, a phthalazinyl group, a naphthyridinyl group, a quinoxalinyl group, a quinazolinyl group, a cinnolinyl group, a phenanthridinyl group, an acridinyl group, a phenanthrolinyl group, a phenazinyl group, a benzimidazolyl group, an isobenzothiazolyl group, a benzoxazolyl group, an isobenzoxazolyl group, a triazolyl group, a tetrazolyl group, an imidazopyridinyl group, an imidazopyrimidinyl group, and an azacarbazolyl group, each substituted with at least one selected from deuterium, —F, —Cl, —Br, —I, a hydroxyl group, a cyano group, a nitro group, an amidino group, a hydrazino group, a hydrazono group, a $C_1$-$C_{20}$ alkyl group, a $C_1$-$C_{20}$ alkoxy group, a phenyl group, a biphenyl group, a terphenyl group, a naphthyl group, a fluorenyl group, a spiro-bifluorenyl group, a benzofluorenyl group, a dibenzofluorenyl group, a phenanthrenyl group, an anthracenyl group, a fluoranthenyl group, a triphenylenyl group, a pyrenyl group, a chrysenyl group, a perylenyl group, a pentaphenyl group, a hexacenyl group, a pentacenyl group, a thiophenyl group, a furanyl group, a carbazolyl group, an indolyl group, an isoindolyl group, a benzofuranyl group, a benzothiophenyl group, a dibenzofuranyl group, a dibenzothiophenyl group, a benzocarbazolyl group, a dibenzocarbazolyl group, a dibenzosilolyl group, a pyridinyl group, an imidazolyl group, a pyrazolyl group, a thiazolyl group, an isothiazolyl group, an oxazolyl group, an isoxazolyl group, a thiadiazolyl group, an oxadiazolyl group, a pyrazinyl group, a pyrimidinyl group, a pyridazinyl group, a triazinyl group, a quinolinyl group, an isoquinolinyl group, a benzoquinolinyl group, a phthalazinyl group, a naphthyridinyl group, a quinoxalinyl group, a quinazolinyl group, a cinnolinyl group, a phenanthridinyl group, an acridinyl group, a phenanthrolinyl group, a phenazinyl group, a benzimidazolyl group, an isobenzothiazolyl group, a benzoxazolyl group, an isobenzoxazolyl group, a triazolyl group, a tetrazolyl group, an imidazopyridinyl group, an imidazopyrimidinyl group, and an azacarbazolyl group; and —S(=O)$_2$(Q$_{601}$) and —P(=O)(Q$_{601}$)(Q$_{602}$), wherein Q$_{601}$ and Q$_{602}$ may each independently be understood by referring to the descriptions therefor provided herein.

The electron transport region may include at least one compound selected from Compounds ET1 to ET36, but embodiments are not limited thereto:

ET1

95
-continued
ET2
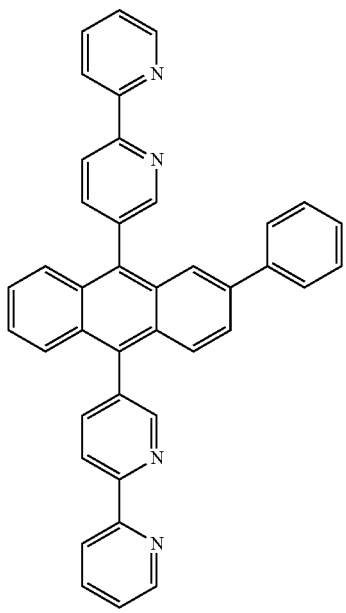
ET3
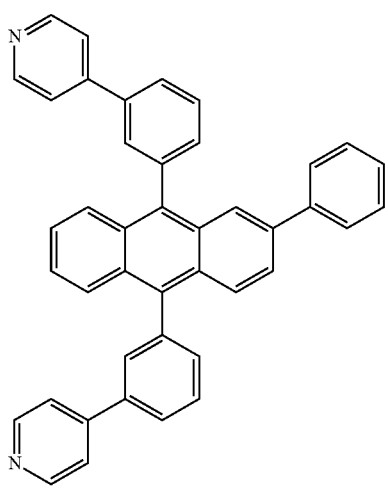
ET4
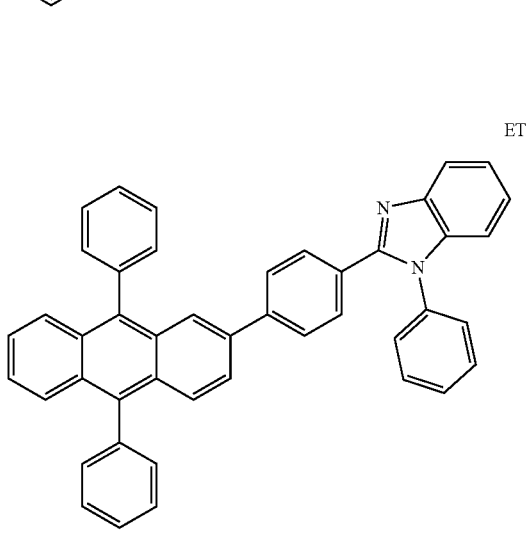
96
-continued
ET5
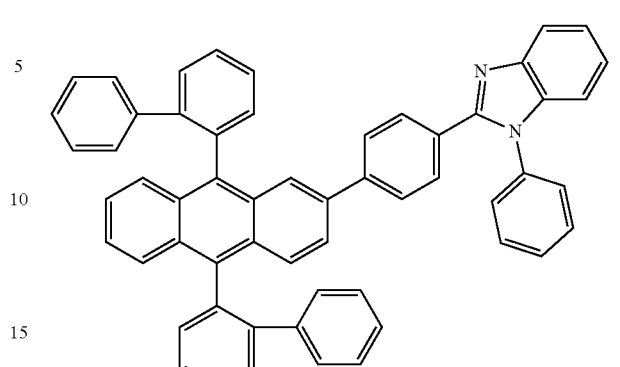
ET6
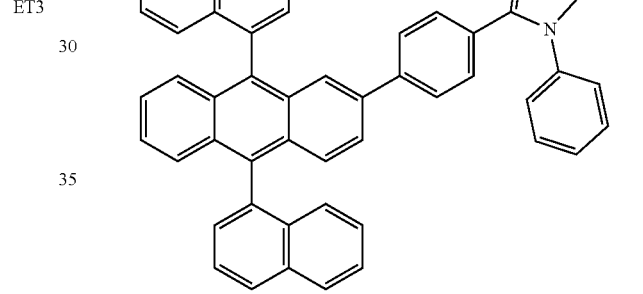
ET7
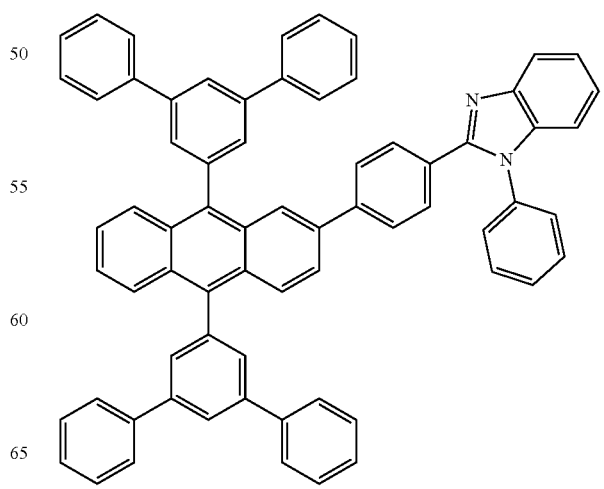

ET8
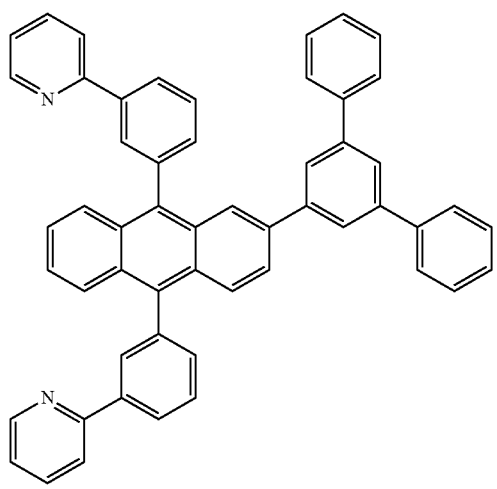
ET10
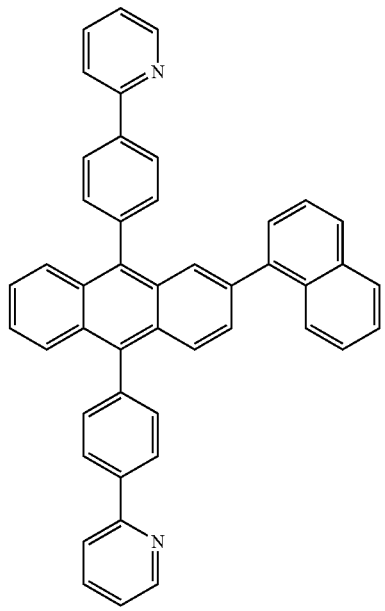
ET11
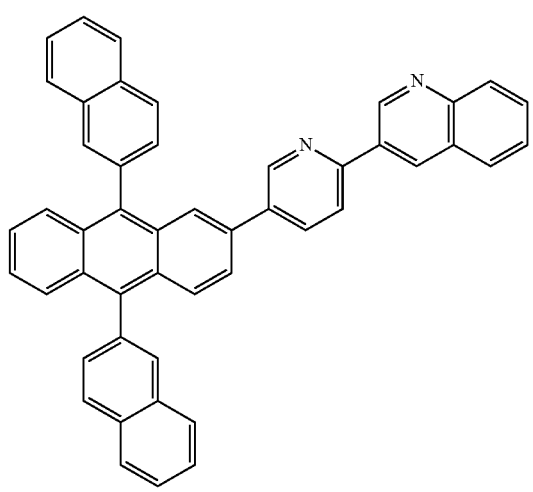
ET9
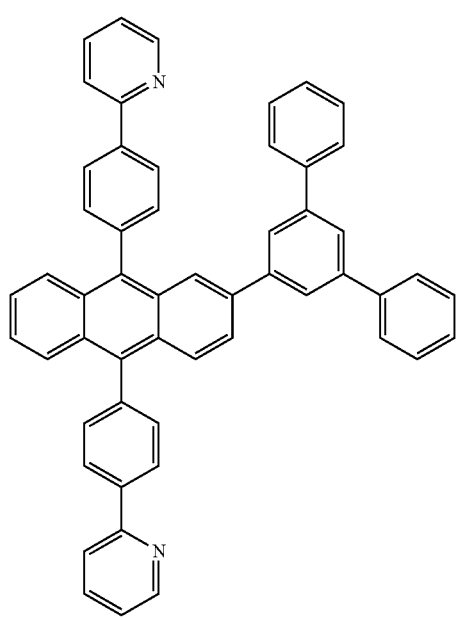
ET12
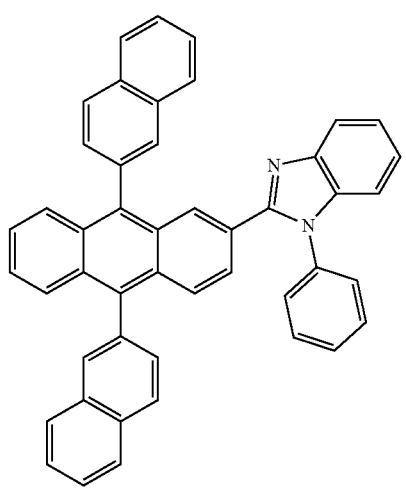

ET13
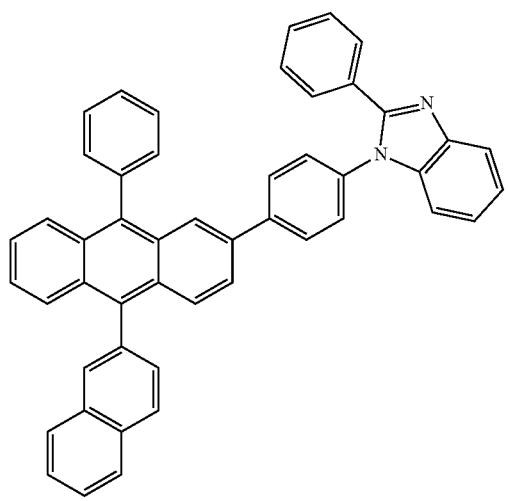
ET14
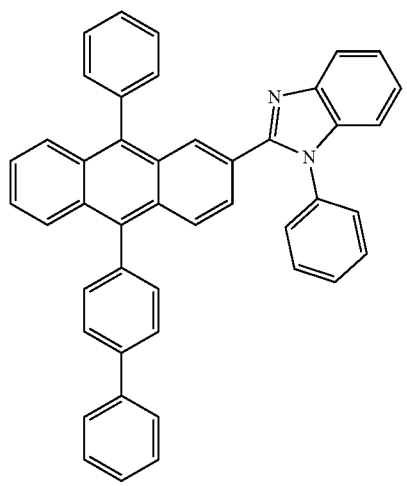
ET15
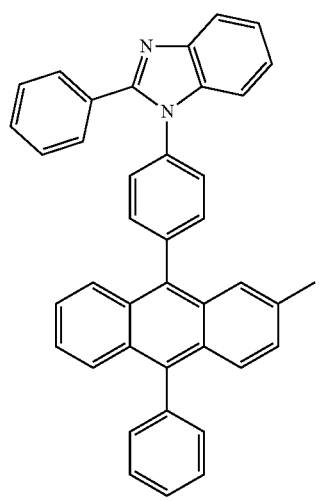
ET16
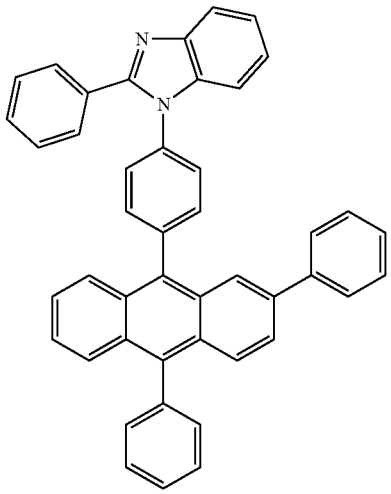
ET17
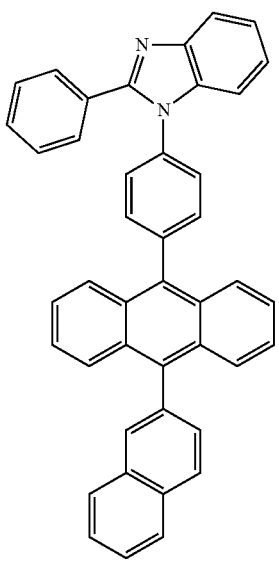
ET18
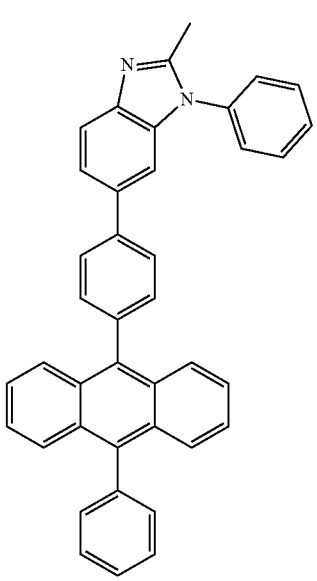

-continued
ET19
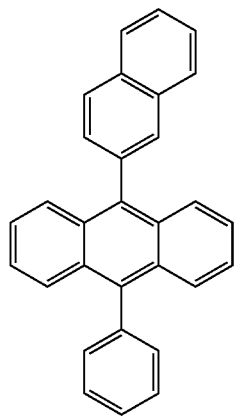
ET20
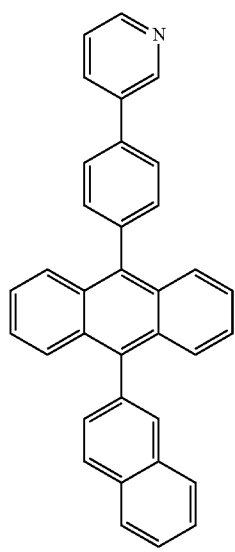
ET21
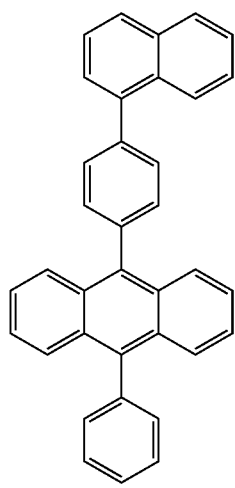
-continued
ET22
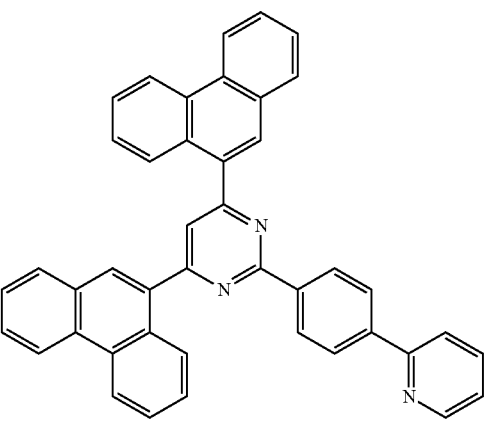
ET23
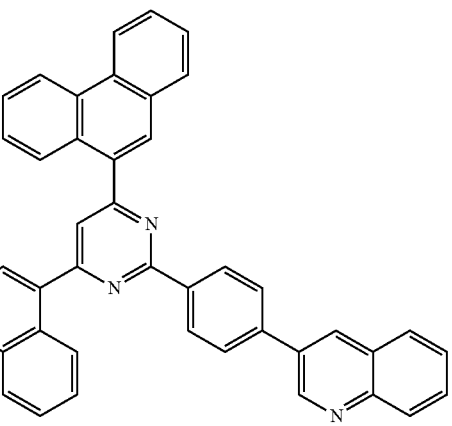
ET24
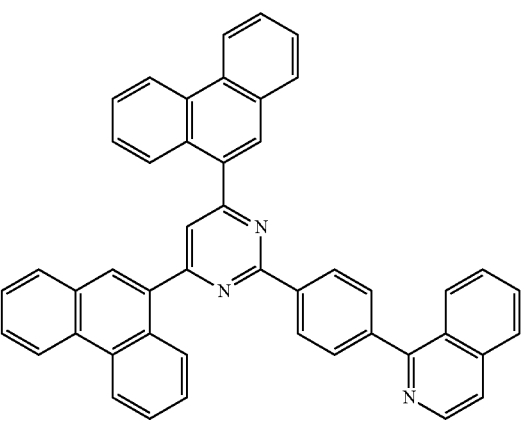

ET25
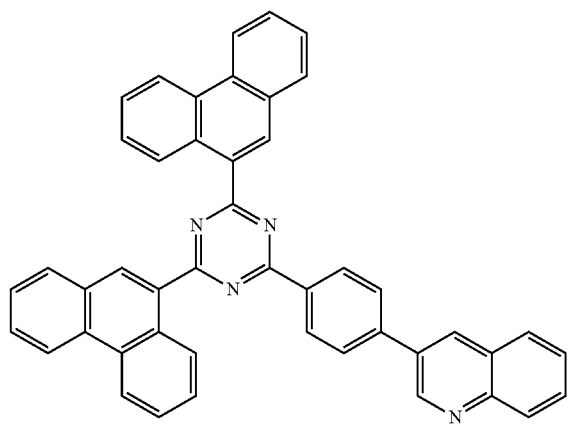
ET26
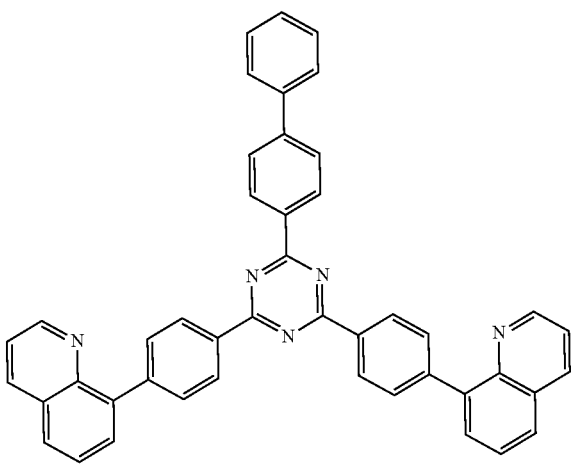
ET27
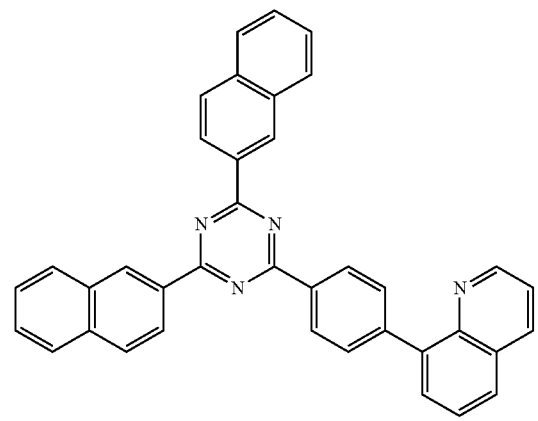
ET28
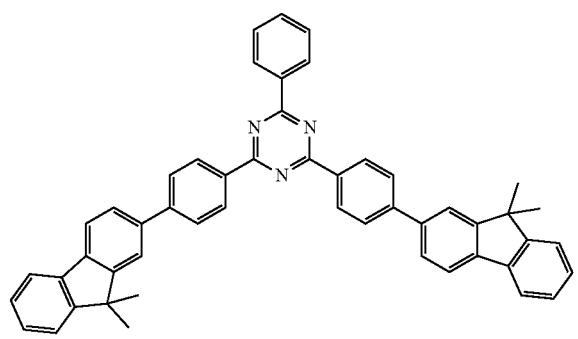
ET29
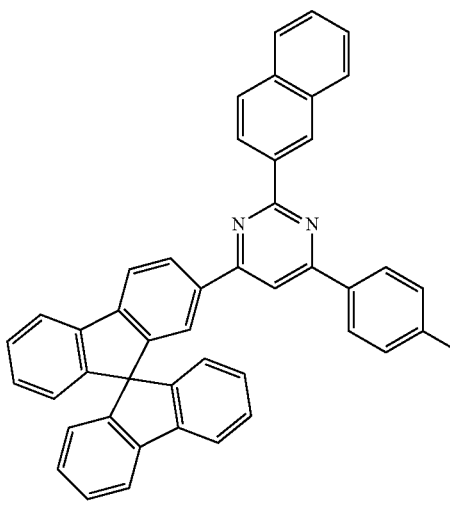
ET30
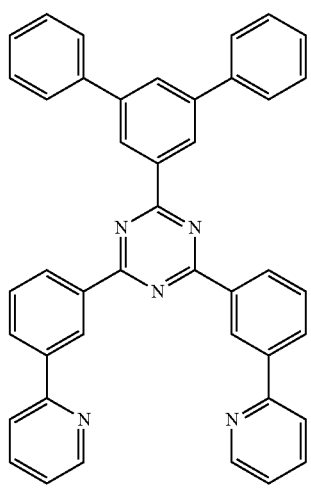

ET31
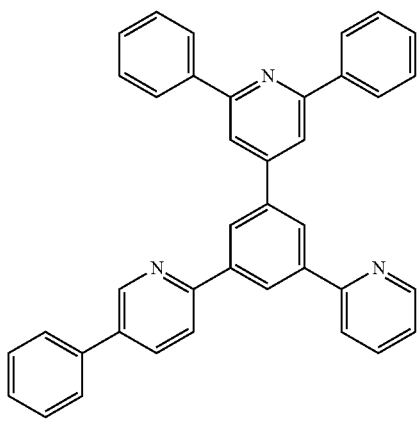
ET34
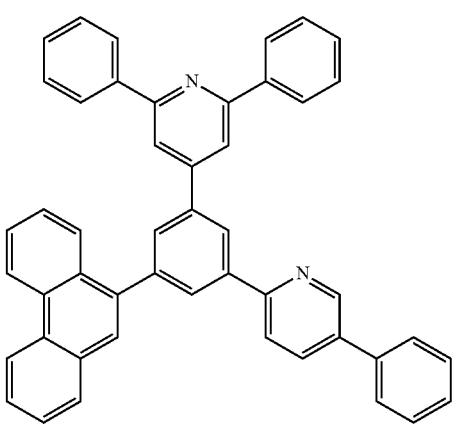
ET32
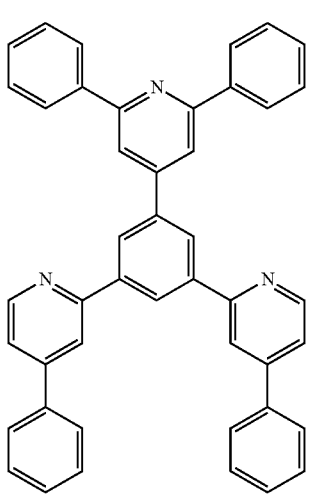
ET35
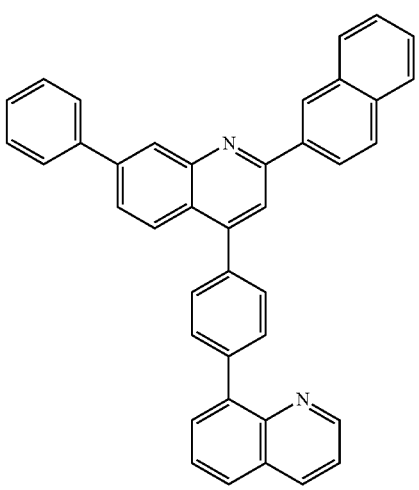
ET33
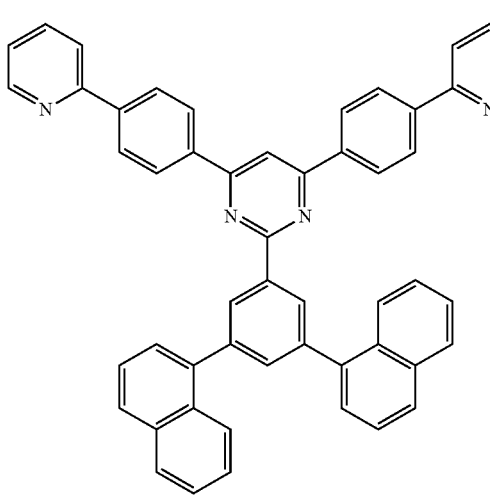
ET36
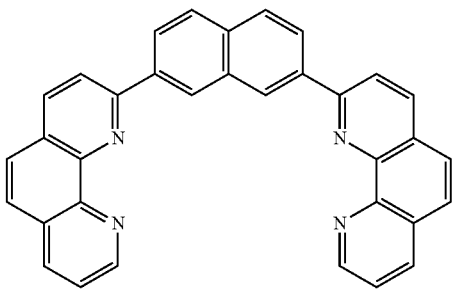
In one or more embodiments, the electron transport region may include at least one selected from 2,9-dimethyl-4,7-diphenyl-1,10-phenanthroline (BCP), 4,7-diphenyl-1,10-phenanthroline (Bphen), Alq₃, BAlq, 3-(biphenyl-4-yl)-5-(4-tert-butylphenyl)-4-phenyl-4H-1,2,4-triazole (TAZ), and NTAZ:

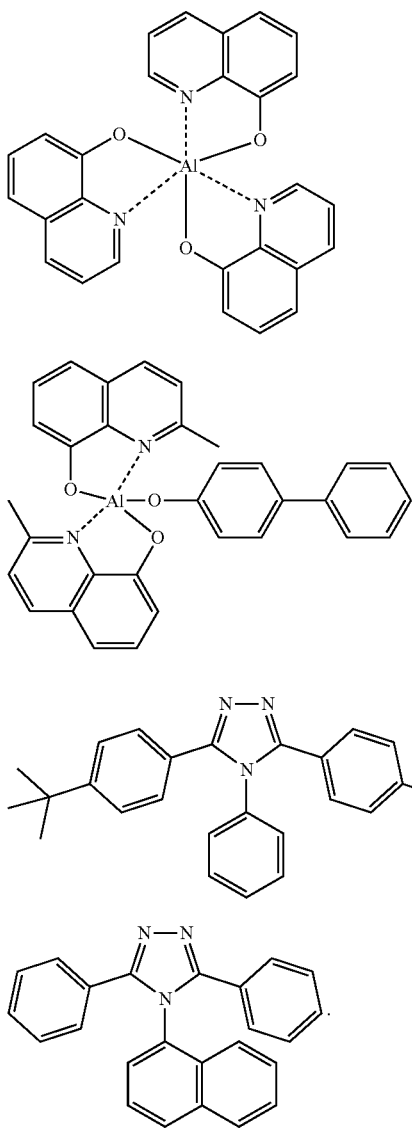

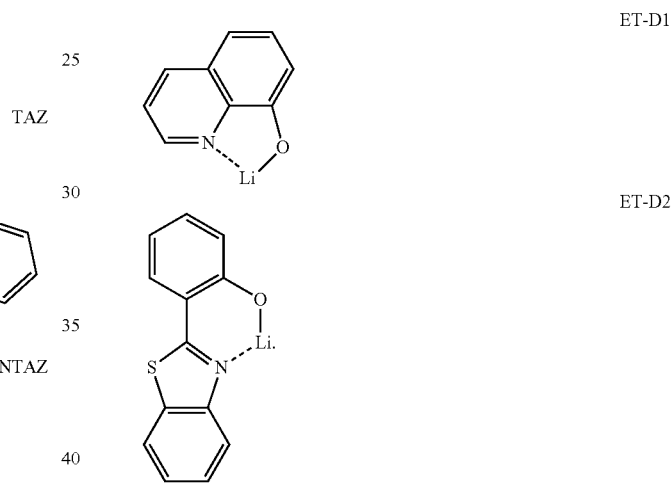

The thicknesses of the buffer layer, the hole blocking layer, or the electron control layer may each independently be in a range of about 20 Å to about 1,000 Å, and in some embodiments, about 30 Å to about 300 Å. When the thicknesses of the buffer layer, the hole blocking layer or the electron control layer are within any of these ranges, excellent hole blocking characteristics or excellent electron controlling characteristics may be obtained without a substantial increase in driving voltage.

The thickness of the electron transport layer may be in a range of about 100 Å to about 1,000 Å, and in some embodiments, about 150 Å to about 500 Å. When the thickness of the electron transport layer is within any of these ranges, excellent electron transport characteristics may be obtained without a substantial increase in driving voltage.

The electron transport region (for example, the electron transport layer in the electron transport region) may further include, in addition to the materials described above, a material including a metal.

The material including the metal may include at least one selected from an alkali metal complex and an alkaline earth metal complex. The alkali metal complex may include a metal ion selected from a lithium (Li) ion, a sodium (Na) ion, a potassium (K) ion, a rubidium (Rb) ion, and a cesium (Cs) ion. The alkaline earth metal complex may include a metal ion selected from a beryllium (Be) ion, a magnesium (Mg) ion, a calcium (Ca) ion, a strontium (Sr) ion, and a barium (Ba) ion. Each ligand coordinated with the metal ion of the alkali metal complex and the alkaline earth metal complex may independently be selected from a hydroxy quinoline, a hydroxy isoquinoline, a hydroxy benzoquinoline, a hydroxy acridine, a hydroxy phenanthridine, a hydroxy phenyloxazole, a hydroxy phenylthiazole, a hydroxy phenyloxadiazole, a hydroxy phenylthiadiazole, a hydroxy phenylpyridine, a hydroxy phenylbenzimidazole, a hydroxy phenylbenzothiazole, a bipyridine, a phenanthroline, and a cyclopentadiene, but embodiments are not limited thereto.

For example, the material including metal may include a Li complex. The Li complex may include, e.g., Compound ET-D1 (LiQ) or Compound ET-D2:

The electron transport region may include an electron injection layer that facilitates injection of electrons from the second electrode 190. The electron injection layer may be in direct contact (e.g., physical contact) with the second electrode 190.

The electron injection layer may have i) a single-layered structure consisting of a single layer consisting of a single material, ii) a single-layered structure consisting of a single layer including a plurality of different materials, or iii) a multi-layered structure having a plurality of layers, each including a plurality of different materials.

The electron injection layer may include an alkali metal, an alkaline earth metal, a rare earth metal, an alkali metal compound, an alkaline earth metal compound, a rare earth metal compound, an alkali metal complex, an alkaline earth metal complex, a rare earth metal complex, or a combination thereof.

In some embodiments, the electron injection layer may include Li, Na, K, Rb, Cs, Mg, Ca, Er, Tm, Yb, or any combination thereof, but embodiments are not limited thereto.

The alkali metal may be selected from Li, Na, K, Rb, and Cs. In an embodiment, the alkali metal may be Li, Na, or Cs. In one or more embodiments, the alkali metal may be Li or Cs, but embodiments are not limited thereto.

The alkaline earth metal may be selected from Mg, Ca, Sr, and Ba.

The rare earth metal may be selected from Sc, Y, Ce, Tb, Yb, and Gd.

The alkali metal compound, the alkaline earth metal compound, and the rare earth metal compound may each independently be selected from oxides and halides (e.g., fluorides, chlorides, bromides, or iodides) of the alkali metal, the alkaline earth metal, and the rare earth metal, respectively.

The alkali metal compound may be selected from alkali metal oxides, such as $Li_2O$, $Cs_2O$, or $K_2O$, and alkali metal halides, such as LiF, NaF, CsF, KF, LiI, NaI, CsI, or KI. In an embodiment, the alkali metal compound may be selected from LiF, $Li_2O$, NaF, LiI, NaI, CsI, and KI, but embodiments are not limited thereto.

The alkaline earth-metal compound may be selected from alkaline earth-metal oxides, such as BaO, SrO, CaO, $Ba_xSr_{1-x}O$ (wherein 0<x<1), and $Ba_xCa_{1-x}O$ (wherein 0<x<1). In an embodiment, the alkaline earth metal compound may be selected from BaO, SrO, and CaO, but embodiments are not limited thereto.

The rare earth metal compound may be selected from $YbF_3$, $ScF_3$, $ScO_3$, $Y_2O_3$, $Ce_2O_3$, $GdF_3$, and $TbF_3$. In an embodiment, the rare earth metal compound may be selected from $YbF_3$, $ScF_3$, $TbF_3$, $YbI_3$, $ScI_3$, and $TbI_3$, but embodiments are not limited thereto.

The alkali metal complex, the alkaline earth metal complex, and the rare earth metal complex may each include ions of the above-described alkali metal, alkaline earth metal, and rare earth metal. Each ligand coordinated with the metal ion of the alkali metal complex, the alkaline earth metal complex, and the rare earth metal complex may independently be selected from a hydroxy quinoline, a hydroxy isoquinoline, a hydroxy benzoquinoline, a hydroxy acridine, a hydroxy phenanthridine, a hydroxy phenyloxazole, a hydroxy phenylthiazole, a hydroxy phenyloxadiazole, a hydroxy phenylthiadiazole, a hydroxy phenylpyridine, a hydroxy phenylbenzimidazole, a hydroxy phenylbenzothiazole, a bipyridine, a phenanthroline, and a cyclopentadiene, but embodiments are not limited thereto.

The electron injection layer may consist of an alkali metal, an alkaline earth metal, a rare earth metal, an alkali metal compound, an alkaline earth metal compound, a rare earth metal compound, an alkali metal complex, an alkaline earth metal complex, a rare earth metal complex, or a combination thereof, as described above. In some embodiments, the electron injection layer may further include an organic material. When the electron injection layer further includes an organic material, the alkali metal, the alkaline earth metal, the rare earth metal, the alkali metal compound, the alkaline earth metal compound, the rare earth metal compound, the alkali metal complex, the alkaline earth metal complex, the rare earth metal complex, or a combination thereof may be homogeneously or non-homogeneously dispersed in a matrix including the organic material.

The thickness of the electron injection layer may be in a range of about 1 Å to about 100 Å, and in some embodiments, about 3 Å to about 90 Å. When the thickness of the electron injection layer is within any of these ranges, excellent electron injection characteristics may be obtained without a substantial increase in driving voltage.

In an embodiment, the electron transport region in the near-infrared light-emitting diode 10 may include a buffer layer, an electron transport layer, and an electron injection layer, and At least one of the electron transport layer and the electron injection layer may include an alkali metal, an alkaline earth metal, a rare earth metal, an alkali metal compound, an alkaline earth metal compound, a rare earth metal compound, an alkali metal complex, an alkaline earth metal complex, a rare earth metal complex, or a combination thereof.

Second Electrode 190

The second electrode 190 may be on the organic layer 150. In an embodiment, the second electrode 190 may be a cathode that is an electron injection electrode. In this embodiment, a material for forming the second electrode 190 may be a material having a low work function, for example, a metal, an alloy, an electrically conductive compound, or a mixture thereof.

The second electrode 190 may include at least one selected from lithium (Li), silver (Ag), magnesium (Mg), aluminum (Al), aluminum-lithium (Al—Li), calcium (Ca), magnesium-indium (Mg—In), magnesium-silver (Mg—Ag), ITO, and IZO, but embodiments are not limited thereto. The second electrode 190 may be a transmissive electrode, a semi-transmissive electrode, or a reflective electrode.

The second electrode 190 may have a single-layered structure, or a multi-layered structure including two or more layers.

In an embodiment, at least one of the hole transport region, the near-infrared light-emitting layer, and the electron transport region (for example, the hole transport region and the near-infrared light-emitting layer) may include a carbazole-containing compound.

In some embodiments, the organic layer 150 may include a visible light-emitting layer that may emit visible light. Accordingly, the near-infrared light-emitting diode 10 may emit visible light (e.g., red light, green light, and/or blue light), in addition to near-infrared light. In some embodiments, the organic layer 150 may further include, in addition to the near-infrared light-emitting layer described herein, a red emission layer patterned with red sub-pixels, a green emission layer patterned with green sub-pixels, and a blue emission layer patterned with blue sub-pixels.

Layers constituting the organic layer 150 may be formed in a certain region by using one or more suitable methods selected from vacuum deposition, spin coating, casting, Langmuir-blodgett (LB) deposition, ink-jet printing, laser printing, and laser-induced thermal imaging (LITI).

When layers included in the organic layer 150 are each independently formed by vacuum deposition, the vacuum deposition may be performed at a deposition temperature in a range of about 100° C. to about 500° C., at a vacuum degree in a range of about $10^{-8}$ torr to about $10^{-3}$ torr, and at a deposition rate in a range of about 0.01 Angstroms per second (Å/sec) to about 100 Å/sec, depending on the compound to be included in each layer and the structure of each layer to be formed.

When layers included in the organic layer 150 are each independently formed by spin coating, the spin coating may be performed at a coating rate of about 2,000 revolutions per minute (rpm) to about 5,000 rpm and at a heat treatment temperature of about 80° C. to about 200° C., depending on the compound to be included in each layer and the structure of each layer to be formed.

Device

The aforementioned near-infrared light-emitting diode may be applicable to various suitable devices. Accordingly, according to one or more embodiments, a device may include the near-infrared light-emitting diode.

In an embodiment, the device may further include a visible light-emitting diode including a first electrode, a second electrode, and a visible light-emitting layer between the first electrode and the second electrode, in addition to the near-infrared light-emitting diode.

In one or more embodiments, the device may further include a sensor configured to identify near-infrared light reflected from a subject exposed to at least a portion of near-infrared light emitted from the near-infrared light-emitting diode.

In an embodiment, the subject may be a part of a human body (e.g., a fingertip, a pupil, or the like).

In one or more embodiments, the device may further include a thin film transistor (TFT) including a source electrode and a drain electrode, in addition to the near-infrared light-emitting diode described above. One of the source electrode and the drain electrode of the TFT may be electrically coupled to one of a first electrode and a second electrode of the near-infrared light-emitting diode.

Such a device may be applicable to various suitable uses. In some embodiments, the device may be an emission device, an authentication device, or an electronic device.

The emission device may be used in various suitable displays, light sources, or the like.

The authentication device may be, for example, a biometric authentication device that identifies an individual according biometric information (e.g., a fingertip, a pupil, or the like).

The authentication device may further include a biometric information collecting unit (e.g., a sensor configured to identify near-infrared light reflected from a subject exposed to at least a portion of near-infrared light emitted from the near-infrared light-emitting diode).

The electronic device may be applicable to a personal computer (e.g., a mobile personal computer), a cellphone, a digital camera, an electronic note, an electronic dictionary, an electronic game console, a medical device (e.g., an electronic thermometer, a blood pressure meter, a glucometer, a pulse measuring device, a pulse wave measuring device, an electrocardiograph recorder, an ultrasonic diagnosis device, an endoscope display device), a fish finder, various suitable measurement devices, gauges (e.g., gauges of an automobile, an airplane, a ship), a projector, but embodiments are not limited thereto.

General Definitions of at Least Some of the Substituents

The term "$C_1$-$C_{60}$ alkyl group," as used herein, refers to a linear or branched aliphatic hydrocarbon monovalent group having 1 to 60 carbon atoms. Examples thereof include a methyl group, an ethyl group, a propyl group, an iso-butyl group, a sec-butyl group, a tert-butyl group, a pentyl group, an iso-amyl group, and a hexyl group. The term "$C_1$-$C_{60}$ alkylene group," as used herein, refers to a divalent group having substantially the same structure as the $C_1$-$C_{60}$ alkyl group.

The term "$C_2$-$C_{60}$ alkenyl group," as used herein, refers to a hydrocarbon group having at least one carbon-carbon double bond at a main chain (e.g., in the middle) or at a terminal end (e.g., at the terminus) of the $C_2$-$C_{60}$ alkyl group. Examples thereof include an ethenyl group, a propenyl group, and a butenyl group. The term "$C_2$-$C_{60}$ alkenylene group," as used herein, refers to a divalent group having substantially the same structure as the $C_2$-$C_{60}$ alkenyl group.

The term "$C_2$-$C_{60}$ alkynyl group," as used herein, refers to a hydrocarbon group having at least one carbon-carbon triple bond at a main chain (e.g., in the middle) or at a terminal end (e.g., at the terminus) of the $C_2$-$C_{60}$ alkyl group. Examples thereof include an ethynyl group and a propynyl group. The term "$C_2$-$C_{60}$ alkynylene group," as used herein, refers to a divalent group having substantially the same structure as the $C_2$-$C_{60}$ alkynyl group.

The term "$C_1$-$C_{60}$ alkoxy group," as used herein, refers to a monovalent group represented by —$OA_{101}$ (wherein $A_{101}$ is a $C_1$-$C_1$ alkyl group). Examples thereof include a methoxy group, an ethoxy group, and an isopropyloxy group.

The term "$C_3$-$C_{10}$ cycloalkyl group," as used herein, refers to a monovalent saturated hydrocarbon monocyclic group including 3 to 10 carbon atoms. Examples thereof include a cyclopropyl group, a cyclobutyl group, a cyclopentyl group, a cyclohexyl group, and a cycloheptyl group. The term "$C_3$-$C_{10}$ cycloalkylene group," as used herein, refers to a divalent group having substantially the same structure as the $C_3$-$C_{10}$ cycloalkyl group.

The term "$C_1$-$C_{10}$ heterocycloalkyl group," as used herein, refers to a monovalent monocyclic group including at least one heteroatom selected from N, O, Si, P, and S as a ring-forming atom and 1 to 10 carbon atoms. Examples thereof include a 1,2,3,4-oxatriazolidinyl group, a tetrahydrofuranyl group, and a tetrahydrothiophenyl group. The term "$C_1$-$C_{10}$ heterocycloalkylene group," as used herein, refers to a divalent group having substantially the same structure as the $C_1$-$C_{10}$ heterocycloalkyl group.

The term "$C_3$-$C_{10}$ cycloalkenyl group," as used herein, refers to a monovalent monocyclic group that has 3 to 10 carbon atoms and at least one double bond in its ring, and is not aromatic (e.g., the ring and/or group is not aromatic). Examples thereof include a cyclopentenyl group, a cyclohexenyl group, and a cycloheptenyl group. The term "$C_3$-$C_{10}$ cycloalkenylene group," as used herein, refers to a divalent group having substantially the same structure as the $C_3$-$C_{10}$ cycloalkenyl group.

The term "$C_1$-$C_{10}$ heterocycloalkenyl group," as used herein, refers to a monovalent monocyclic group including at least one heteroatom selected from N, O, Si, P, and S as a ring-forming atom, 1 to 10 carbon atoms, and at least one double bond in its ring. Examples of the $C_1$-$C_{10}$ heterocycloalkenyl group include a 4,5-dihydro-1,2,3,4-oxatriazolyl group, a 2,3-dihydrofuranyl group, and a 2,3-dihydrothiophenyl group. The term "$C_1$-$C_{10}$ heterocycloalkylene group," as used herein, refers to a divalent group having substantially the same structure as the $C_1$-$C_{10}$ heterocycloalkyl group.

The term "$C_6$-$C_{60}$ aryl group," as used herein, refers to a monovalent group having a carbocyclic aromatic system having 6 to 6 carbon atoms. The term "$C_6$-$C_{60}$ arylene group," as used herein, refers to a divalent group having a carbocyclic aromatic system having 6 to 60 carbon atoms. Examples of the $C_6$-$C_{60}$ aryl group include a phenyl group, a naphthyl group, an anthracenyl group, a phenanthrenyl group, a pyrenyl group, and a chrysenyl group. When the $C_6$-$C_{60}$ aryl group and the $C_6$-$C_{60}$ arylene group each independently include two or more rings, the respective rings may be fused (e.g., combined together).

The term "$C_1$-$C_{60}$ heteroaryl group," as used herein, refers to a monovalent group having a heterocyclic aromatic system having at least one heteroatom selected from N, O, Si, P, and S as a ring-forming atom and 1 to 60 carbon atoms. The term "$C_1$-$C_{60}$ heteroarylene group," as used herein, refers to a divalent group having a heterocyclic aromatic system having at least one heteroatom selected from N, O, Si, P, and S as a ring-forming atom and 1 to 60 carbon atoms. Examples of the $C_1$-$C_{60}$ heteroaryl group include a pyridinyl group, a pyrimidinyl group, a pyrazinyl group, a pyridazinyl group, a triazinyl group, a quinolinyl group, and an isoquinolinyl group. When the $C_1$-$C_{60}$ heteroaryl group and the $C_1$-$C_{60}$ heteroarylene group each independently include two or more rings, the respective rings may be fused (e.g., combined together).

The term "$C_6$-$C_{60}$ aryloxy group," as used herein, is represented by —$OA_{102}$ (wherein $A_{102}$ is the $C_6$-$C_{60}$ aryl group). The term "$C_6$-$C_{60}$ arylthio group," as used herein, is represented by —$SA_{103}$ (wherein $A_{103}$ is the $C_6$-$C_{60}$ aryl group).

The term "monovalent non-aromatic condensed polycyclic group," as used herein, refers to a monovalent group that has two or more rings condensed (e.g., combined together) and only carbon atoms as ring forming atoms (e.g., 8 to 60 carbon atoms), wherein the entire molecular structure is non-aromatic. An example of the monovalent non-aromatic condensed polycyclic group may be a fluorenyl group. The term "divalent non-aromatic condensed polycyclic group," as used herein, refers to a divalent group having substantially the same structure as the monovalent non-aromatic condensed polycyclic group.

The term "monovalent non-aromatic condensed heteropolycyclic group," as used herein, refers to a monovalent group that has two or more condensed rings and at least one heteroatom selected from N, O, Si, P, and S, in addition to carbon atoms (e.g., 1 to 60 carbon atoms), as a ring-forming atom, wherein the entire molecular structure is non-aromatic. An example of the monovalent non-aromatic condensed heteropolycyclic group is a carbazolyl group. The term "divalent non-aromatic condensed heteropolycyclic group," as used herein, refers to a divalent group having substantially the same structure as the monovalent non-aromatic condensed heteropolycyclic group.

The term "$C_5$-$C_{60}$ carbocyclic group," as used herein, refers to a monocyclic or polycyclic group having 5 to 60 carbon atoms only as ring-forming atoms. The $C_5$-$C_{60}$ carbocyclic group may be an aromatic carbocyclic group or a non-aromatic carbocyclic group. The term "$C_5$-$C_{60}$ carbocyclic group," as used herein, refers to a ring (e.g., a benzene group), a monovalent group (e.g., a phenyl group), or a divalent group (e.g., a phenylene group). Also, depending on the number of substituents connected to the $C_5$-$C_{60}$ carbocyclic group, the $C_5$-$C_{60}$ carbocyclic group may be a trivalent group or a quadrivalent group.

The term "$C_1$-$C_{60}$ heterocyclic group," as used herein, refers to a group having substantially the same structure as the $C_5$-$C_{60}$ carbocyclic group, except that at least one heteroatom selected from N, O, Si, P, and S is used as a ring-forming atom, in addition to carbon atoms (e.g., 1 to 60 carbon atoms).

In the present specification, at least one substituent of the substituted $C_5$-$C_{60}$ carbocyclic group, the substituted $C_1$-$C_{60}$ heterocyclic group, the substituted $C_3$-$C_{10}$ cycloalkylene group, the substituted $C_1$-$C_{10}$ heterocycloalkylene group, the substituted $C_3$-$C_{10}$ cycloalkenylene group, the substituted $C_1$-$C_{10}$ heterocycloalkenylene group, the substituted $C_6$-$C_{60}$ arylene group, the substituted $C_1$-$C_{60}$ heteroarylene group, the substituted divalent non-aromatic condensed polycyclic group, the substituted divalent non-aromatic condensed heteropolycyclic group, the substituted $C_1$-$C_{60}$ alkyl group, the substituted $C_2$-$C_{60}$ alkenyl group, the substituted $C_2$-$C_{60}$ alkynyl group, the substituted $C_1$-$C_{60}$ alkoxy group, the substituted $C_3$-$C_{10}$ cycloalkyl group, the substituted $C_1$-$C_{10}$ heterocycloalkyl group, the substituted $C_3$-$C_{10}$ cycloalkenyl group, the substituted $C_1$-$C_{10}$ heterocycloalkenyl group, the substituted $C_6$-$C_{60}$ aryl group, the substituted $C_6$-$C_{60}$ aryloxy group, the substituted $C_6$-$C_{60}$ arylthio group, the substituted $C_1$-$C_{60}$ heteroaryl group, the substituted monovalent non-aromatic condensed polycyclic group, and the substituted monovalent non-aromatic condensed heteropolycyclic group may be selected from:

deuterium, —F, —Cl, —Br, —I, a hydroxyl group, a cyano group, a nitro group, an amidino group, a hydrazino group, a hydrazono group, a $C_1$-$C_{60}$ alkyl group, a $C_2$-$C_{60}$ alkenyl group, a $C_2$-$C_{60}$ alkynyl group, and a $C_1$-$C_{60}$ alkoxy group;

a $C_1$-$C_{60}$ alkyl group, a $C_2$-$C_{60}$ alkenyl group, a $C_2$-$C_{60}$ alkynyl group, and a $C_1$-$C_{60}$ alkoxy group, each substituted with at least one selected from deuterium, —F, —Cl, —Br, —I, a hydroxyl group, a cyano group, a nitro group, an amidino group, a hydrazino group, a hydrazono group, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, a monovalent non-aromatic condensed heteropolycyclic group, —Si($Q_{11}$)($Q_{12}$)($Q_{13}$), —N($Q_{11}$)($Q_{12}$), —B($Q_{11}$)($Q_{12}$), —C(=O)($Q_{11}$), —S(=O)$_2$($Q_{11}$), and —P(=O)($Q_{11}$)($Q_{12}$);

a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, a monovalent non-aromatic condensed heteropolycyclic group, a biphenyl group, and a terphenyl group;

a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, and a monovalent non-aromatic condensed heteropolycyclic group, each substituted with at least one selected from deuterium, —F, —Cl, —Br, —I, a hydroxyl group, a cyano group, a nitro group, an amidino group, a hydrazino group, a hydrazono group, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, a monovalent non-aromatic condensed heteropolycyclic group, —Si($Q_{21}$)($Q_{22}$)($Q_{23}$), —N($Q_{21}$)($Q_{22}$), —B($Q_{21}$)($Q_{22}$), —C(=O)($Q_{21}$), —S(=O)$_2$($Q_{21}$), and —P(=O)($Q_{21}$)($Q_{22}$); and —Si($Q_{31}$)($Q_{32}$)($Q_{33}$), —N($Q_{31}$)($Q_{32}$), —B($Q_{31}$)($Q_{32}$), —C(=O)($Q_{31}$), —S(=O)$_2$($Q_{31}$), and —P(=O)($Q_{31}$)($Q_{32}$), wherein $Q_1$ to $Q_3$, $Q_{11}$ to $Q_{13}$, $Q_{21}$ to $Q_{23}$, and $Q_{31}$ to $Q_{33}$ may each independently be selected from hydrogen, deuterium, —F, —Cl, —Br, —I, a hydroxyl group, a cyano group, a nitro group, an amidino group, a hydrazino group, a hydrazono group, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryl group substituted with a $C_1$-$C_{60}$ alkyl group, a $C_6$-$C_{60}$ aryl group substituted with a $C_6$-$C_{60}$ aryl group, a terphenyl group, a $C_1$-$C_{60}$ heteroaryl group, a $C_1$-$C_{60}$ heteroaryl group substituted with a $C_1$-$C_{60}$ alkyl group, a $C_1$-$C_{60}$ heteroaryl group substituted with a $C_6$-$C_{60}$ aryl group, a monovalent non-aromatic condensed polycyclic group, and a monovalent non-aromatic condensed heteropolycyclic group.

The term "Ph," as used herein, represents a phenyl group, the term "Me," as used herein, represents a methyl group, the term "Et," as used herein, represents an ethyl group, the term "ter-Bu" or "Bu$^t$," as used herein, represents a tert-butyl group, and the term "OMe," as used herein, represents a methoxy group.

The term "biphenyl group," as used herein, refers to a phenyl group substituted with at least one phenyl group. The "biphenyl group" belongs to "a substituted phenyl group" having a "$C_6$-$C_{60}$ aryl group" as a substituent.

The term "terphenyl group," as used herein, refers to a phenyl group substituted with at least one phenyl group. The "terphenyl group" belongs to "a substituted phenyl group" having a "$C_6$-$C_{60}$ aryl group substituted with a $C_6$-$C_{60}$ aryl group" as a substituent.

The symbols * and *' as used herein, unless defined otherwise, refer to a binding site to an adjacent atom in the formula.

Hereinafter, compounds and an organic light-emitting device according to one or more embodiments will be described in more detail with reference to Synthesis Examples and Examples. The wording "B was used instead of A" used in describing Synthesis Examples means that an identical number of molar equivalents of B were used in place of A.

EXAMPLES

Example 1

An indium tin oxide (ITO) film (anode) was formed on a glass substrate to a thickness of 120 nm. Then, the anode was ultrasonically washed and pre-treated (UV—$O_3$ treatment and heat treatment).

Compound HT5 was deposited on the anode to form a hole transport layer having a thickness of 120 nm.

Subsequently, a host (Alq$_3$) and a dopant (Compound 3, 1 wt %) were co-deposit to form a near-infrared light-emitting layer having a thickness of 30 nm.

Next, BAlq was deposited on the near-infrared light-emitting layer to form a buffer layer having a thickness of 5 nm. Then, Alq$_3$ was deposited on the buffer layer to form an electron transport layer having a thickness of 25 nm. LiF was then deposited on the electron transport layer to form an electron injection layer having a thickness of 0.5 nm. Lastly, aluminum (Al) was deposited on the electron injection layer to form a cathode having a thickness of 150 nm, thereby completing the manufacture of an light-emitting device having a structure of glass/ITO (120 nm)/HT5 (120 nm)/host:dopant (1 wt %, 30 nm)/BAlq (5 nm)/Alq$_3$ (25 nm)/LiF (0.5 nm)/Al (150 nm).

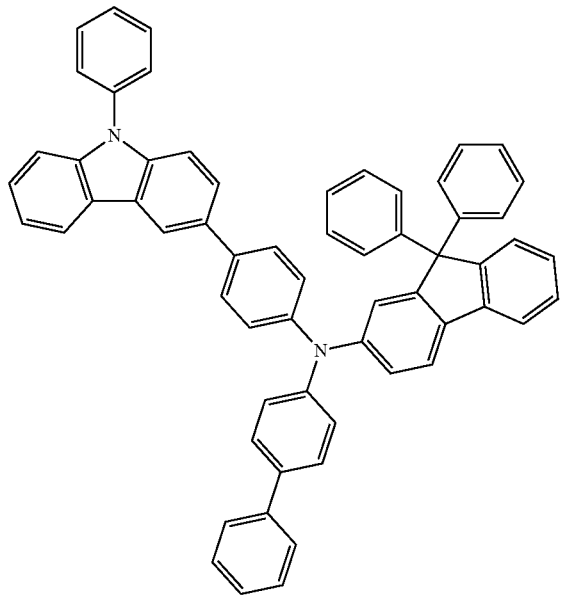

HT5

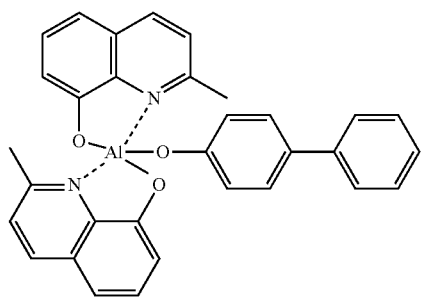

BAlq

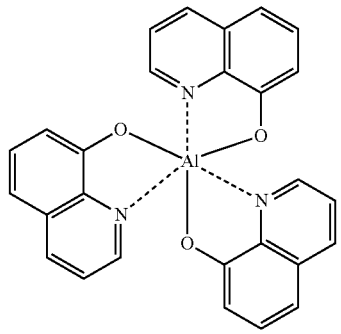

Alq$_3$

Examples 2 to 6 and Comparative Example B

Light-emitting devices according to Examples 2 to 6 and Comparative Example B were manufactured in substantially the same manner as in Example 1, except that dopant materials shown in Table 1 were used in each near-infrared light-emitting layer.

Evaluation Example 1

The lifespan ($T_{95}$) and maximum emission wavelength of each of the light-emitting devices prepared according to Examples 1 to 6 and Comparative Example B at a current density of 5 mA/cm$^2$ were evaluated using a Keithley 236 source-measure unit (SMU) and a PR650 luminance meter.

The results thereof are shown in Table 1. The lifespan ($T_{95}$) indicates a time (hour) for the luminance of each light-emitting device to decline to 95% of its initial luminance.

TABLE 1

|  | Dopant (1 wt %) | Lifespan ($T_{95}$) (h) | Maximum emission wavelength (nm) |
|---|---|---|---|
| Example 1 | 3 | >100 | ≤670 |
| Example 2 | 9 | >100 | ≤670 |
| Example 3 | 12 | >100 | ≤670 |
| Example 4 | 17 | >100 | ≤670 |
| Example 5 | 28 | >100 | ≤670 |
| Example 6 | 37 | >100 | ≤670 |
| Comparative Example B | Mixture of B1 and B2 (weight raio = 1:1) | <50 | <600 |

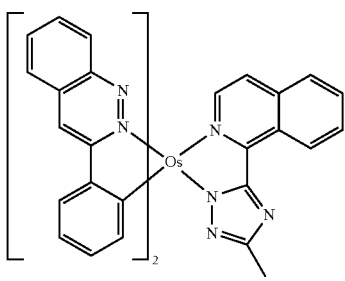

3

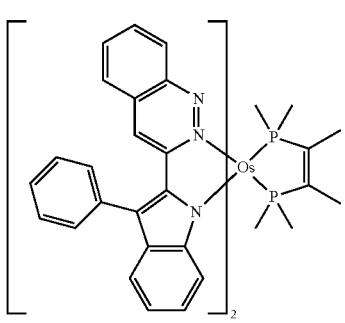

9

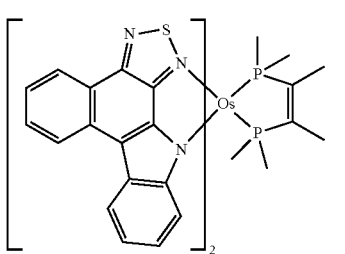

12

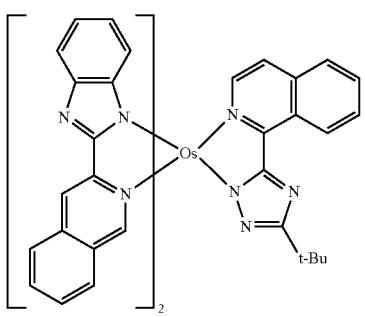

17

TABLE 1-continued

| Dopant (1 wt %) | Lifespan ($T_{95}$) (h) | Maximum emission wavelength (nm) |
|---|---|---|

28

37

B1

B2

Referring to Table 1, the light-emitting devices according to Examples 1 to 6 were found to emit near-infrared light, while having a long lifespan, as compared with the light-emitting device according to Comparative Example B.

As apparent from the foregoing description, the near-infrared light-emitting diode may emit near-infrared light and have a long lifespan.

It should be understood that embodiments described herein should be considered in a descriptive sense only and not for purposes of limitation. Descriptions of features or aspects within each embodiment should be considered as available for other similar features or aspects in other embodiments.

It will be understood that, although the terms "first," "second," "third," etc., may be used herein to describe various elements, components, regions, layers and/or sections, these elements, components, regions, layers and/or sections should not be limited by these terms. These terms are used to distinguish one element, component, region, layer or section from another element, component, region, layer or section. Thus, a first element, component, region, layer or section described below could be termed a second element, component, region, layer or section, without departing from the spirit and scope of the present disclosure.

Spatially relative terms, such as "beneath," "below," "lower," "under," "above," "upper," and the like, may be used herein for ease of explanation to describe one element or feature's relationship to another element(s) or feature(s) as illustrated in the figures. It will be understood that the spatially relative terms are intended to encompass different orientations of the device in use or in operation, in addition to the orientation depicted in the figures. For example, if the device in the figures is turned over, elements described as "below" or "beneath" or "under" other elements or features would then be oriented "above" the other elements or features. Thus, the example terms "below" and "under" can encompass both an orientation of above and below. The device may be otherwise oriented (e.g., rotated 90 degrees or at other orientations) and the spatially relative descriptors used herein should be interpreted accordingly.

It will be understood that when an element or layer is referred to as being "on," "connected to," or "coupled to" another element or layer, it can be directly on, connected to, or coupled to the other element or layer, or one or more intervening elements or layers may be present. In addition, it will also be understood that when an element or layer is referred to as being "between" two elements or layers, it can be the only element or layer between the two elements or layers, or one or more intervening elements or layers may also be present.

The terminology used herein is for the purpose of describing particular embodiments only and is not intended to be limiting of the present disclosure. As used herein, the singular forms "a" and "an" are intended to include the plural forms as well, unless the context clearly indicates otherwise. It will be further understood that the terms "comprises," "comprising," "includes," and "including," when used in this specification, specify the presence of the stated features, integers, acts, operations, elements, and/or components, but do not preclude the presence or addition of one or more other features, integers, acts, operations, elements, components, and/or groups thereof.

As used herein, the terms "substantially," "about," and similar terms are used as terms of approximation and not as terms of degree, and are intended to account for the inherent deviations in measured or calculated values that would be recognized by those of ordinary skill in the art. Further, the use of "may" when describing embodiments of the present disclosure refers to "one or more embodiments of the present disclosure." As used herein, the terms "use," "using," and "used" may be considered synonymous with the terms "utilize," "utilizing," and "utilized," respectively. Also, the term "exemplary" is intended to refer to an example or illustration.

Also, any numerical range recited herein is intended to include all subranges of the same numerical precision subsumed within the recited range. For example, a range of "1.0 to 10.0" is intended to include all subranges between (and including) the recited minimum value of 1.0 and the recited maximum value of 10.0, that is, having a minimum value equal to or greater than 1.0 and a maximum value equal to or less than 10.0, such as, for example, 2.4 to 7.6. Any maximum numerical limitation recited herein is intended to include all lower numerical limitations subsumed therein, and any minimum numerical limitation recited in this specification is intended to include all higher numerical limitations subsumed therein. Accordingly, Applicant reserves the right to amend this specification, including the claims, to expressly recite any sub-range subsumed within the ranges expressly recited herein.

While one or more embodiments have been described with reference to the accompanying drawing, it will be understood by those of ordinary skill in the art that various changes in form and details may be made therein without departing from the spirit and scope as defined by the following claims, and equivalents thereof.

What is claimed is:

1. A near-infrared light-emitting diode comprising:
a first electrode;
a second electrode; and
an organic layer between the first electrode and the second electrode,
wherein the organic layer comprises a near-infrared light-emitting layer, the near-infrared light-emitting layer comprises an osmium (Os)-containing organometallic compound, and the osmium (Os)-containing organometallic compound is configured to emit near-infrared light,
wherein the osmium (Os)-containing organometallic compound is represented by Formula 1:

$$M(L_1)_{n1}(L_2)_{n2} \qquad \text{Formula 1}$$

wherein, in Formula 1,
M is Os,
$L_1$ is selected from ligands represented by Formula 1-1:

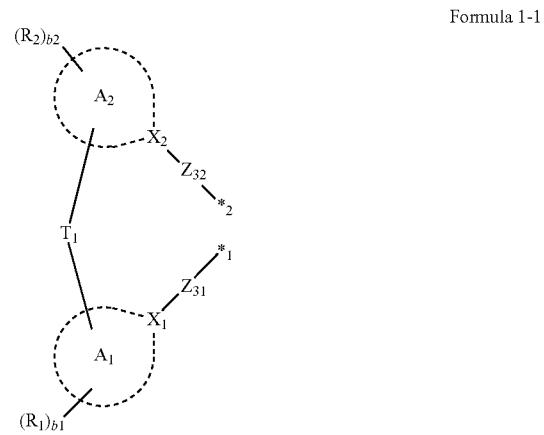

n1 is an integer from 1 to 4; and when n1 is 2 or greater, at least two $L_1$(s) are identical to or different from each other,
$L_2$ is an organic ligand,
n2 is an integer from 0 to 4; and when n2 is 2 or greater, at least two $L_2$(s) are identical to or different from each other,
i) at least two selected from $L_1$(s) in the number of n1, ii) at least two selected from $L_2$(s) in the number of n2, or iii) at least one selected from Li (s) in the number of n1 and at least one selected from $L_2$(s) in the number of n2 are optionally bound via a single bond, a double bond,

*=N—*', *—N=*', *=C[(L₃)ₐ₃-(R₃)]—*', *—C[(L₃)ₐ₃-(R₃)]=*', *—N[(L₃)ₐ₃-(R₃)]—*', *—B(R₃)—*', *—P(R₃)—*', *—C(R₃)(R₄)—*', *—Si(R₃)(R₄)—*', *—Ge(R₃)(R₄)—*', *—S—*', *—Se—*', *—O—*', *—C(=O)—*', *—S(=O)—*', *—S(=O)₂—*', *—C(R₃)=*', *=C(R₃)—*', *—C(R₃)=C(R₄)—*', *—C(=S)—*', or *—C≡C—*' to form a tridentate ligand, a tetradentate ligand, a pentadentate ligand, or a hexadentate ligand, and * and *' each indicate a binding site to an adjacent atom, wherein, in Formula 1-1, ring $A_1$ and ring $A_2$ are each independently a $C_5$-$C_{30}$ carbocyclic group or a $C_1$-$C_{30}$ heterocyclic group, $Z_{31}$ and $Z_{32}$ are each independently a covalent bond, a coordinate bond, O, S, $C(R_7)(R_8)$, $Si(R_7)(R_8)$, $N(R_7)$, $P(R_7)$, $C(R_7)(R_8)(R_9)$, $Si(R_7)(R_8)(R_9)$, $N(R_7)(R_8)$, or $P(R_7)(R_8)$, $X_1$ and $X_2$ are each independently C or N, ring $A_1$ and $T_1$; and $T_1$ and ring $A_2$ are each independently bound via a single bond or a double bond, $T_1$ is a single bond, a double bond, *=N—*', *—N=*', *=C[(L₅)ₐ₅-(R₅)]—*', *—C[(L₅)ₐ₅-(R₅)]=*', *—N[(L₅)ₐ₅-(R₅)]—*', *—B(R₅)—*', *—P(R₅)—*', *—C(R₅)(R₆)—*', *—Si(R₅)(R₆)—*', *—Ge(R₅)(R₆)—*', *—S—*', *—Se—*', *—O—*', *—C(=O)—*', *—S(=O)—*', *—S(=O)₂—*', *—C(R₅)=*', *=C(R₅)—*', *—C(R₅)=C(R₆)—*', *—C(=S)—*', or *—C≡C—*', wherein * and *' each indicate a binding site to an adjacent atom, $L_3$ and $L_5$ are each independently a single bond, a $C_5$-$C_{30}$ carbocyclic group unsubstituted or substituted with at least one $R_{10}$, or a $C_1$-$C_{30}$ heterocyclic group unsubstituted or substituted with at least one $R_{10}$, a3 and a5 are each independently an integer from 1 to 5, $R_1$ to $R_{10}$ are each independently hydrogen, deuterium, —F, —Cl, —Br, —I, a hydroxyl group, a cyano group, a nitro group, an amidino group, a hydrazine group, a hydrazone group, a substituted or unsubstituted $C_1$-$C_{60}$ alkyl group, a substituted or unsubstituted $C_2$-$C_{60}$ alkenyl group, a substituted or unsubstituted $C_2$-$C_{60}$ alkynyl group, a substituted or unsubstituted $C_1$-$C_{60}$ alkoxy group, a substituted or unsubstituted $C_3$-$C_{10}$ cycloalkyl group, a substituted or unsubstituted $C_1$-$C_{10}$ heterocycloalkyl group, a substituted or unsubstituted $C_3$-$C_{10}$ cycloalkenyl group, a substituted or unsubstituted $C_1$-$C_{10}$ heterocycloalkenyl group, a substituted or unsubstituted $C_6$-$C_{60}$ aryl group, a substituted or unsubstituted $C_6$-$C_{60}$ aryloxy group, a substituted or unsubstituted $C_6$-$C_{60}$ arylthio group, a substituted or unsubstituted $C_1$-$C_{60}$ heteroaryl group, a substituted or unsubstituted monovalent non-aromatic condensed polycyclic group, a substituted or unsubstituted monovalent non-aromatic condensed heteropolycyclic group, —$Si(Q_1)(Q_2)(Q_3)$, —$N(Q_1)(Q_2)$, —$B(Q_1)(Q_2)$, —$C(=O)_2(Q_1)$, —$S(=O)_2(Q_1)$, or —$P(=O)(Q_1)(Q_2)$, two adjacent groups selected from $R_1$ to $R_{10}$ are optionally bound to form a $C_5$-$C_{30}$ carbocyclic group unsubstituted or substituted with at least one $R_{10a}$ or a $C_1$-$C_{30}$ heterocyclic group unsubstituted or substituted with at least one $R_{10a}$, $R_{10a}$ is defined the same as $R_{10}$, b1 and b2 are each independently an integer from 0 to 10,

*¹ and *² each indicate a binding site to M in Formula 1, a bond between M and $Z_{31}$ or $X_1$ in Formula 1-1 and a bond between M and $Z_{32}$ or $X_2$ in Formula 1-1 are each independently a covalent bond or a coordinate bond, and at least one substituent of the substituted $C_1$-$C_{60}$ alkyl group, the substituted $C_2$-$C_{60}$ alkenyl group, the substituted $C_2$-$C_{60}$ alkynyl group, the substituted $C_1$-$C_{60}$ alkoxy group, the substituted $C_3$-$C_{10}$ cycloalkyl group, the substituted $C_1$-$C_{10}$ heterocycloalkyl group, the substituted $C_3$-$C_{10}$ cycloalkenyl group, the substituted $C_1$-$C_{10}$ heterocycloalkenyl group, the substituted $C_6$-$C_{60}$ aryl group, the substituted $C_6$-$C_{60}$ aryloxy group, the substituted $C_6$-$C_{60}$ arylthio group, the substituted $C_1$-$C_{60}$ heteroaryl group, the substituted monovalent non-aromatic condensed polycyclic group, and the substituted monovalent non-aromatic condensed heteropolycyclic group is selected from:

deuterium, —F, —Cl, —Br, —I, a hydroxyl group, a cyano group, a nitro group, an amidino group, a hydrazine group, a hydrazone group, a $C_1$-$C_{60}$ alkyl group, a $C_2$-$C_{60}$ alkenyl group, a $C_2$-$C_{60}$ alkynyl group, and a $C_1$-$C_{60}$ alkoxy group;

a $C_1$-$C_{60}$ alkyl group, a $C_2$-$C_{60}$ alkenyl group, a $C_2$-$C_{60}$ alkynyl group, and a $C_1$-$C_{60}$ alkoxy group, each substituted with at least one selected from deuterium, —F, —Cl, —Br, —I, a hydroxyl group, a cyano group, a nitro group, an amidino group, a hydrazine group, a hydrazone group, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, a monovalent non-aromatic condensed heteropolycyclic group, —$Si(Q_{11})(Q_{12})(Q_{13})$, —$N(Q_{11})(Q_{12})$, —$B(Q_{11})(Q_{12})$, —$C(=O)_2(Q_{11})$, —$S(=O)_2(Q_{11})$, and —$P(=O)(Q_{11})(Q_{12})$;

a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, a monovalent non-aromatic condensed heteropolycyclic group, a biphenyl group, and a terphenyl group;

a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, and a monovalent non-aromatic condensed heteropolycyclic group, each substituted with at least one selected from deuterium, —F, —Cl, —Br, —I, a hydroxyl group, a cyano group, a nitro group, an amidino group, a hydrazine group, a hydrazone group, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, a monovalent non-aromatic condensed heteropolycyclic group, —$Si(Q_{21})(Q_{22})(Q_{23})$, —$N(Q_{21})(Q_{22})$, —$B(Q_{21})(Q_{22})$, —$C(=O)_2(Q_{21})$, —$S(=O)_2(Q_{21})$, and —$P(=O)(Q_{21})(Q_{22})$; and —Si(Q$_{31}$)(Q$_{32}$)(Q$_{33}$), —N(Q$_{31}$)(Q$_{32}$), —B(Q$_{31}$)(Q$_{32}$), —C(=O)$_2$(Q$_{31}$), —S(=O)$_2$(Q$_{31}$), and —P(=O)(Q$_{31}$)(Q$_{32}$), wherein Q$_1$ to Q$_3$, Q$_{11}$ to Q$_{13}$, Q$_{21}$ to Q$_{23}$, and 031 to Q$_{33}$ are each independently selected from hydrogen, deuterium, —F, —Cl, —Br, —I, a hydroxyl group, a cyano group, a nitro group, an amidino group, a hydrazine group, a hydrazone group, a C$_1$-C$_{60}$ alkyl group, a C$_2$-C$_{60}$ alkenyl group, a C$_2$-C$_{60}$ alkynyl group, a C$_1$-C$_{60}$ alkoxy group, a C$_3$-C$_{10}$ cycloalkyl group, a C$_1$-C$_{10}$ heterocycloalkyl group, a C$_3$-C$_{10}$ cycloalkenyl group, a C$_1$-C$_{10}$ heterocycloalkenyl group, a C$_6$-C$_{60}$ aryl group, a C$_6$-C$_{60}$ aryl group substituted with at least one C$_1$-C$_{60}$ alkyl group, a C$_6$-C$_{60}$ aryl group substituted with at least one C$_6$-C$_{60}$ aryl group, a terphenyl group, a C$_1$-C$_{60}$ heteroaryl group, a C$_1$-C$_{60}$ heteroaryl group substituted with at least one C$_1$-C$_{60}$ alkyl group, a C$_1$-C$_{60}$ heteroaryl group substituted with at least one C$_6$-C$_{60}$ aryl group, a monovalent non-aromatic condensed polycyclic group, and a monovalent non-aromatic condensed heteropolycyclic group, and wherein, a moiety represented by

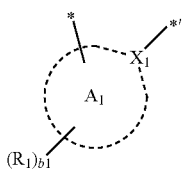

in Formula 1-1 is selected from groups represented by Formulae A$_1$-1 to A$_1$-51 and A$_1$-54 to A$_1$-56, and wherein a moiety represented by

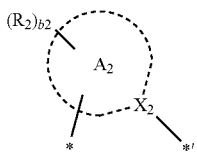

in Formula 1-1 is selected from groups represented by Formulae A2-1 to A2-32, A2-34, A2-35, A2-37 and A2-41 to A2-50:

A1-1

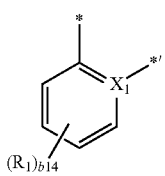

A1-2

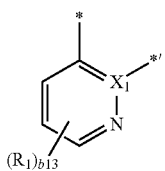

-continued

A1-3

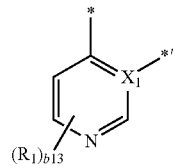

A1-4

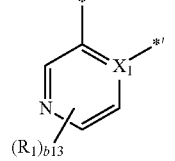

A1-5

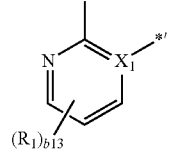

A1-6

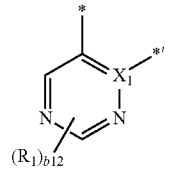

A1-7

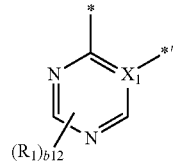

A1-8

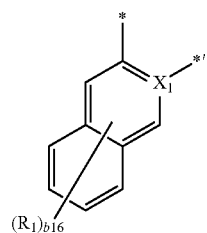

A1-9

A1-10

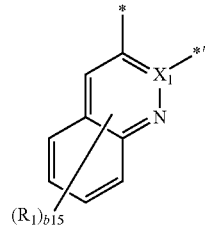

-continued
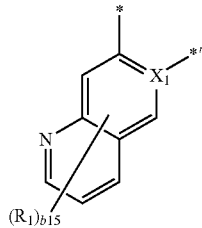
A1-11
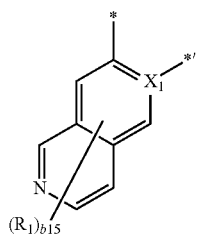
A1-12
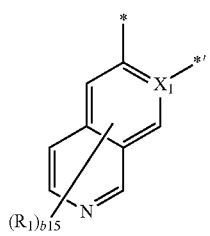
A1-13
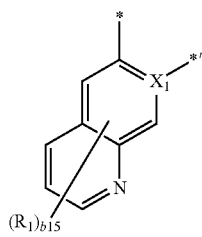
A1-14
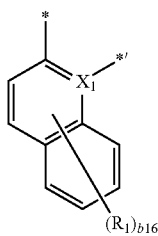
A1-15
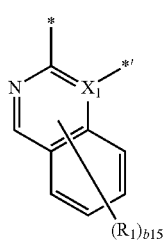
A1-16
-continued
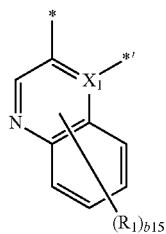
A1-17
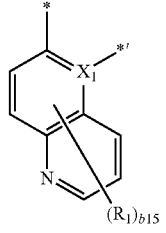
A1-18
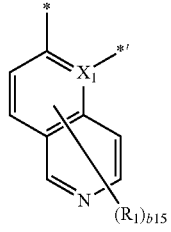
A1-19
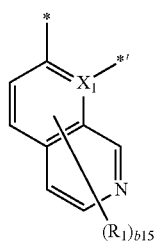
A1-20
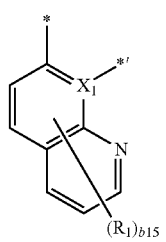
A1-21
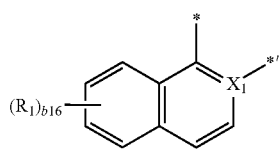
A1-22
A1-23

A1-24 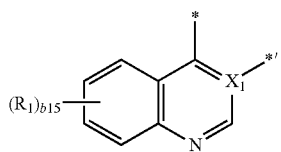
A1-25 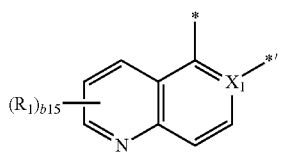
A1-26 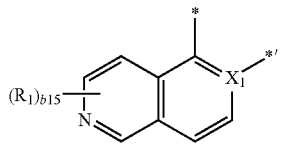
A1-27 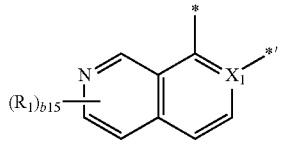
A1-28 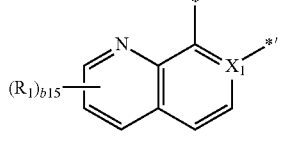
A1-29 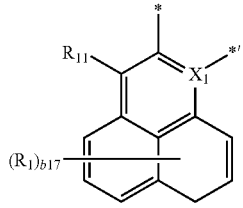
A1-30 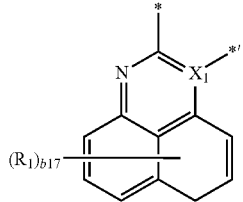
A1-31 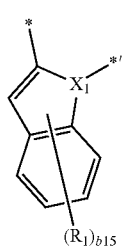
A1-32 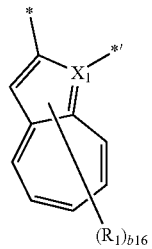
A1-33 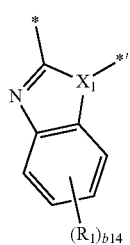
A1-34 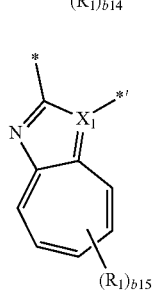
A1-35 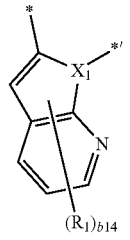
A1-36 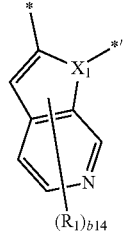
A1-37 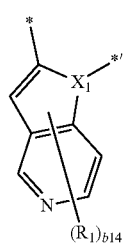

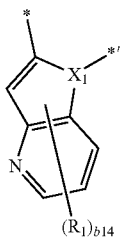 A1-38
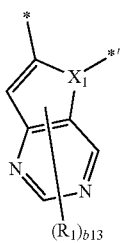 A1-39
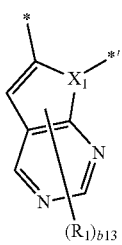 A1-40
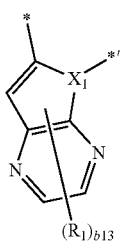 A1-41
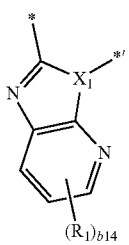 A1-42
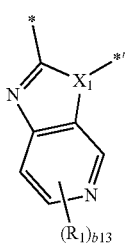 A1-43
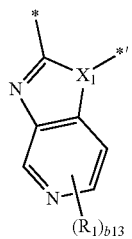 A1-44
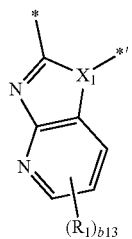 A1-45
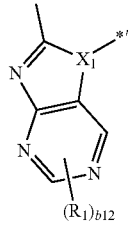 A1-46
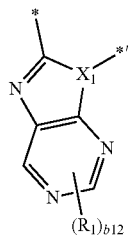 A1-47
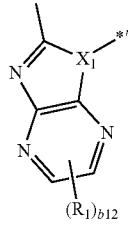 A1-48
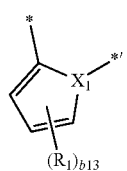 A1-49
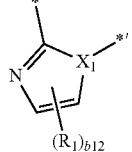 A1-50

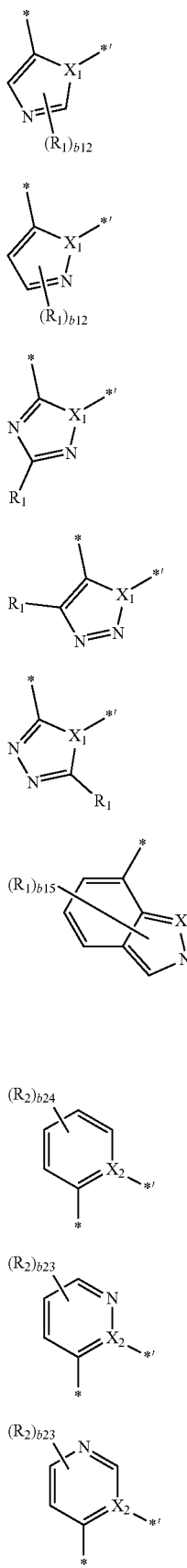
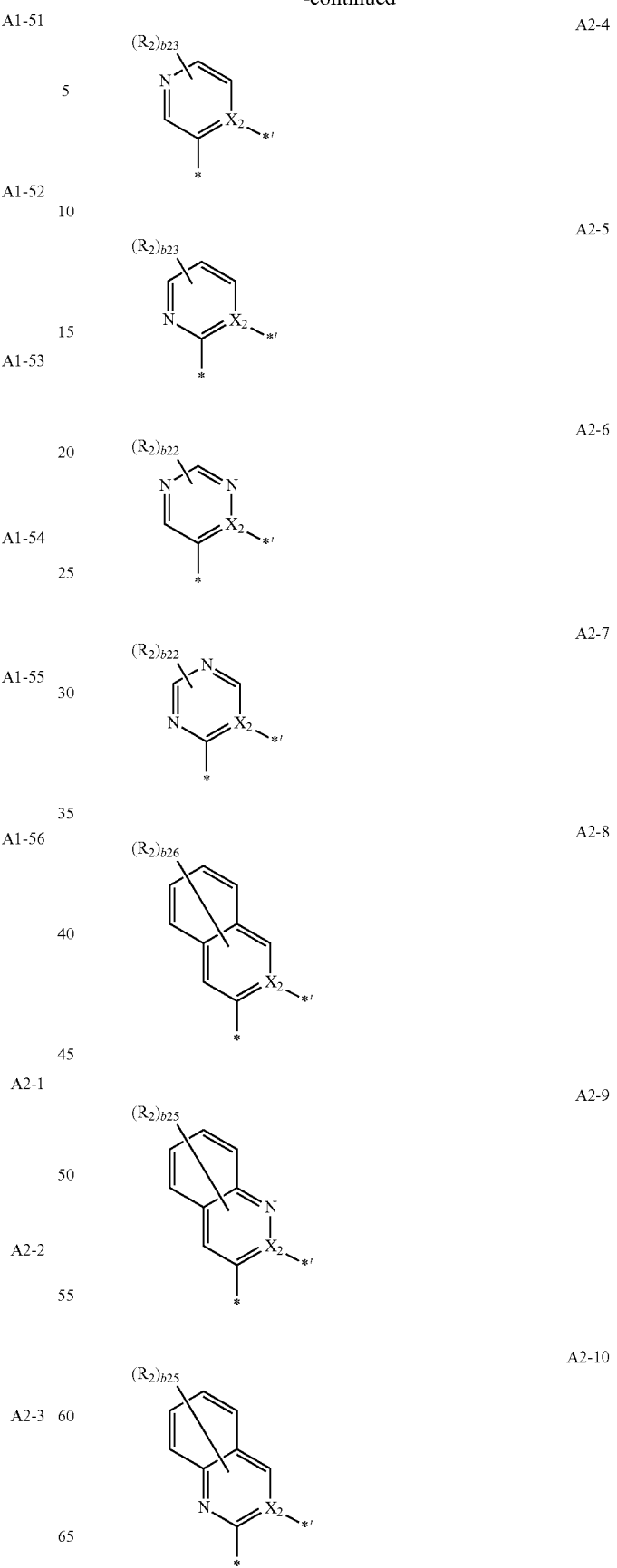

-continued
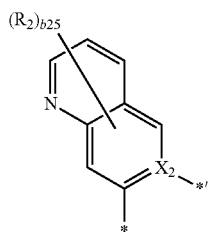
A2-11
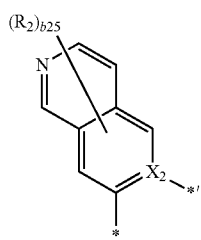
A2-12
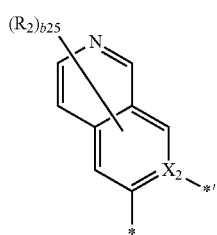
A2-13
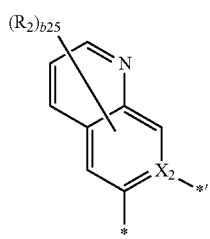
A2-14
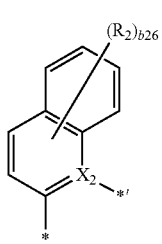
A2-15
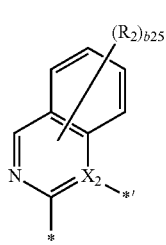
A2-16
-continued
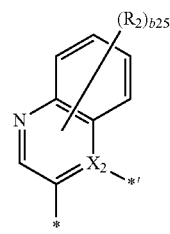
A2-17
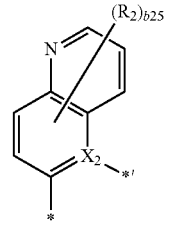
A2-18
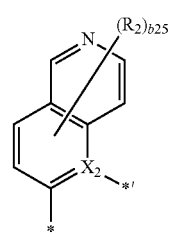
A2-19
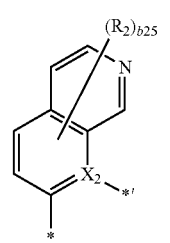
A2-20
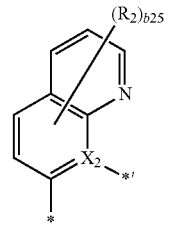
A2-21
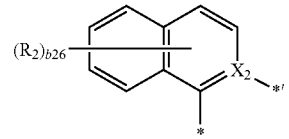
A2-22
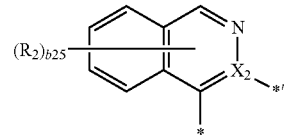
A2-23
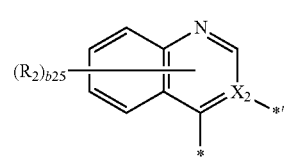
A2-24

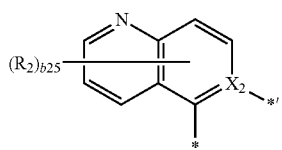 A2-25
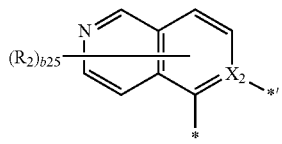 A2-26
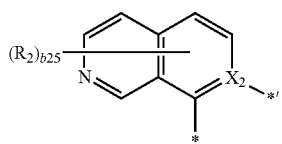 A2-27
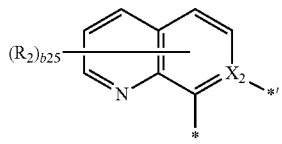 A2-28
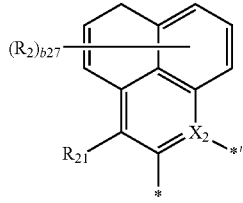 A2-29
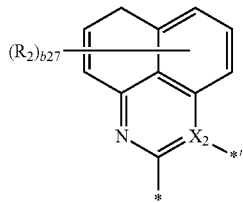 A2-30
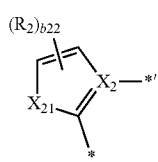 A2-31
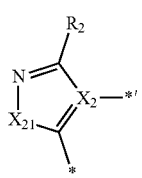 A2-32
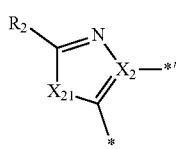 A2-33
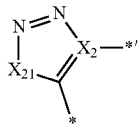 A2-34
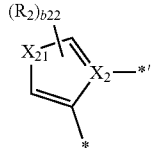 A2-35
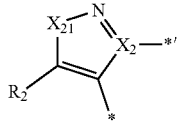 A2-36
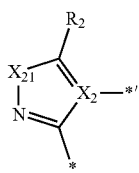 A2-37
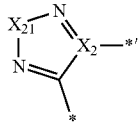 A2-38
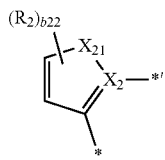 A2-39
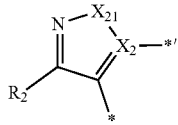 A2-40
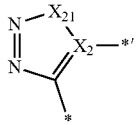 A2-41
A2-42
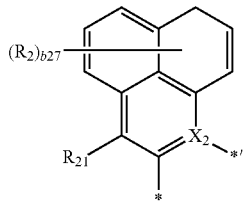 A2-43

-continued

A2-44
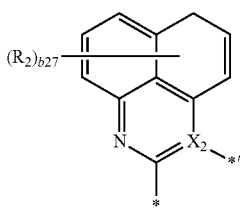

A2-45
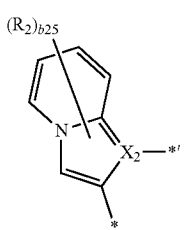

A2-46
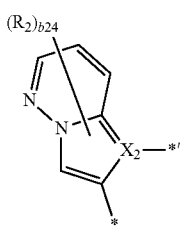

A2-47
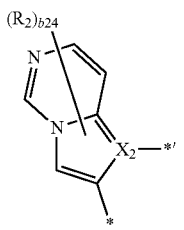

A2-48
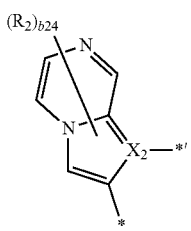

A2-49
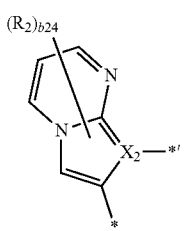

A2-50
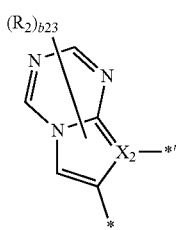

wherein in Formulae A1-1 to A1-51 and A1-54 to A1-56,
$X_1$ and $R_1$ are respectively the same as those defined in Formula 1-1,
b12 is an integer from 0 to 2,
b13 is an integer from 0 to 3,
b14 is an integer from 0 to 4,
b15 is an integer from 0 to 5,
b16 is an integer from 0 to 6,
b17 is an integer from 0 to 7,
*' indicates a binding site to $Z_{31}$ in Formula 1-1, and
*indicates a binding site to $T_1$ in Formula 1-1,
wherein in Formulae A2-1 to A2-32, A2-34, A2-35, A2-37 and A2-41 to A2-50,
$X_2$ and $R_2$ are respectively the same as those defined with respect to Formula 1-1,
$X_{21}$ is selected from O, S, $N(R_{21})$, $C(R_{21})(R_{22})$, and $Si(R_{21})(R_{22})$,
$R_{21}$ and $R_{22}$ are each defined the same as $R_2$,
b22 is an integer from 0 to 2,
b23 is an integer from 0 to 3,
b24 is an integer from 0 to 4,
b25 is an integer from 0 to 5,
b26 is an integer from 0 to 6,
b27 is an integer from 0 to 7,
*' indicates a binding site to $Z_{32}$ in Formula 1-1, and
* indicates a binding site to $T_1$ in Formula 1-1,
wherein $L_2$ is selected from ligands represented by Formulae 4-1 to 4-5:

4-1
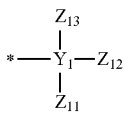

4-2
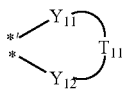

4-3

4-4
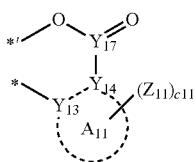

4-5
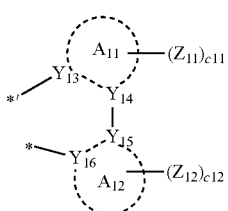

wherein, in Formulae 4-1 to 4-5,
$Y_1$ is C, P, or As,
$Y_{11}$ is O, N, $N(Z_{10})$, $P(Z_{13})(Z_{14})$, or $As(Z_{13})(Z_{14})$,
$Y_{12}$ is O, N, $N(Z_{15})$, $P(Z_{15})(Z_{16})$, or $As(Z_{15})(Z_{16})$,
$T_{11}$ is a single bond, a double bond, *—$C(Z_{11})(Z_{12})$—*', *—$C(Z_{11})(Z_{12})$—$C(Z_{13})(Z_{14})$—*', *—$C(Z_{11})$=$C(Z_{12})$—*', *=$C(Z_{11})$—*', *—$C(Z_{11})$=*', *=C $(Z_{11})$—C$(Z_{12})$=C$(Z_{10})$—*', *—C$(Z_{11})$=C$(Z_{12})$—C$(Z_{13})$=*', or *—N$(Z_{11})$—*', wherein * and *' each indicate a binding site to an adjacent atom, $Z_{11}$ and $Z_{12}$ in *—C$(Z_{11})$=C$(Z_{12})$—*' are optionally bound to form a $C_5$-$C_{30}$ carbocyclic group unsubstituted or substituted with at least one $R_{10a}$ or a $C_1$-$C_{30}$ heterocyclic group unsubstituted or substituted with at least one $R_{10a}$, and $R_{10a}$ is defined the same as defined above, $Y_{13}$ to $Y_{16}$ are each independently C or N, $Y_{17}$ is C, N$(Z_{17})$, or P$(Z_{17})$, ring $A_{11}$ and ring $A_{12}$ are each independently a $C_5$-$C_{30}$ carbocyclic group or a $C_1$-$C_{30}$ heterocyclic group, $Z_{11}$ to $Z_{17}$ are each defined the same as $R_1$, c11 and c12 are each independently an integer from 0 to 10, and

* and *' each independently indicate a binding site to M in Formula 1.

2. The near-infrared light-emitting diode of claim 1, wherein the osmium (Os)-containing organometallic compound is neutral and configured to emit near-infrared light having a maximum emission wavelength in a range of 700 nm or greater and 850 nm or less.

3. The near-infrared light-emitting diode of claim 1, wherein the ring $A_1$ and ring $A_2$ are each independently i) a first ring, ii) a second ring, iii) a condensed ring in which at least two first rings are condensed, iv) a condensed ring in which at least two second rings are condensed, or v) a condensed ring in which at least one first ring and at least one second ring are condensed, the first ring is a cyclopentane group, a cyclopentadiene group, a furan group, a thiophene group, a pyrrole group, a silole group, an indene group, a benzofuran group, a benzothiophene group, an indole group, a benzosilole group, an oxazole group, an isoxazole group, an oxadiazole group, an isoxadiazole group, an oxatriazole group, an isoxatriazole group, a thiazole group, an isothiazole group, a thiadiazole group, an iso-thiadiazole group, a thiatriazole group, an isothiatriazole group, a pyrazole group, an imidazole group, a triazole group, a tetrazole group, an azasilole group, a diazasilole group, or a triazasilole group, and the second ring is an adamantane group, a norbornane group, a norbornene group, a cyclohexane group, a cyclohexene group, a cycloheptane group, a cycloheptadiene group, a cycloheptatriene group, a benzene group, a pyridine group, a pyrimidine group, a pyrazine group, a pyridazine group, a triazine group, an oxasiline group, a thiasiline group, a dihydroazasiline group, a dihydrodisiline group, a dihydrosiline group, a dioxin group, an oxathiine group, an oxazine group, a pyran group, a dithiine group, a thiazine group, a thiopyran group, a cyclohexadiene group, a dihydropyridine group, or a dihydropyrazine group.

4. The near-infrared light-emitting diode of claim 1, wherein $T_1$ is a single bond.

5. The near-infrared light-emitting diode of claim 1, wherein $R_1$ to $R_6$ and $R_{10}$ are each independently:

hydrogen, deuterium, —F, —Cl, —Br, —I, a hydroxyl group, a cyano group, a nitro group, an amidino group, a hydrazine group, or a hydrazone group;

a $C_1$-$C_{10}$ alkyl group, a $C_2$-$C_{10}$ alkenyl group, a $C_2$-$C_{10}$ alkynyl group, or a $C_1$-$C_{10}$ alkoxy group, each unsubstituted or substituted with at least one selected from deuterium, —F, —Cl, —Br, —I, —CD$_3$, —CD$_2$H, —CDH$_2$, —CF$_3$, —CF$_2$H, —CFH$_2$, a hydroxyl group, a cyano group, a nitro group, an amidino group, a hydrazine group, a hydrazone group, a cyclopentyl group, a cyclohexyl group, a cycloheptyl group, a cyclooctyl group, an adamantanyl group, a norbornanyl group, a norbornenyl group, a cyclopentenyl group, a cyclohexenyl group, a cycloheptenyl group, a tetrahydro-2H-pyranyl group, a morpholinyl group, a phenyl group, a ($C_1$-$C_{10}$ alkyl)phenyl group, a di($C_1$-$C_{10}$ alkyl)phenyl group, a biphenyl group, a di(phenyl)phenyl group, a terphenyl group, a naphthyl group, a pyridinyl group, a pyrimidinyl group, —O$(Q_{31})$, —S$(Q_{31})$, —Si$(Q_{31})(Q_{32})(Q_{33})$, —N$(Q_{31})(Q_{32})$, —B$(Q_{31})(Q_{32})$, —P$(Q_{31})(Q_{32})$, —C(=O)$(Q_{31})$, —S(=O)$_2(Q_{31})$, and —P(=O)$(Q_{31})(Q_{32})$;

a cyclopentyl group, a cyclohexyl group, a cycloheptyl group, a cyclooctyl group, an adamantanyl group, a norbornanyl group, a norbornenyl group, a cyclopentenyl group, a cyclohexenyl group, a cycloheptenyl group, a tetrahydro-2H-pyranyl group, a morpholinyl group, a dioxanyl group, a phenyl group, a ($C_1$-$C_{10}$ alkyl)phenyl group, a di($C_1$-$C_{10}$ alkyl)phenyl group, a biphenyl group, a di(phenyl)phenyl group, a terphenyl group, a naphthyl group, a fluorenyl group, a phenanthrenyl group, an anthracenyl group, a fluoranthenyl group, a triphenylenyl group, a pyrenyl group, a chrysenyl group, a pyrrolyl group, a thiophenyl group, a furanyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, an isoindolyl group, an indolyl group, an indazolyl group, a purinyl group, a quinolinyl group, an isoquinolinyl group, a benzoquinolinyl group, a quinoxalinyl group, a quinazolinyl group, a cinnolinyl group, a carbazolyl group, a phenanthrolinyl group, a benzimidazolyl group, a benzofuranyl group, a benzothiophenyl group, an isobenzothiazolyl group, a benzoxazolyl group, an isobenzoxazolyl group, a triazolyl group, a tetrazolyl group, an oxadiazolyl group, a triazinyl group, a dibenzofuranyl group, a dibenzothiophenyl group, a benzocarbazolyl group, a dibenzocarbazolyl group, an imidazopyridinyl group, an imidazopyrimidinyl group, a 2,3-dihydro-1H-indenyl group, a 1,2,3,4-tetrahydronaphthalenyl group, a 2,3-dihydrobenzodioxinyl group, or a benzodioxanyl group, each unsubstituted or substituted with at least one selected from deuterium, —F, —Cl, —Br, —I, —CD$_3$, —CD$_2$H, —CDH$_2$, —CF$_3$, —CF$_2$H, —CFH$_2$, a hydroxyl group, a cyano group, a nitro group, an amidino group, a hydrazine group, a hydrazone group, a $C_1$-$C_{10}$ alkyl group, a $C_2$-$C_{10}$ alkenyl group, a $C_2$-$C_{10}$ alkynyl group, a $C_1$-$C_{10}$ alkoxy group, a cyclopentyl group, a cyclohexyl group, a cycloheptyl group, a cyclooctyl group, an adamantanyl group, a norbornanyl group, a norbornenyl group, a cyclopentenyl group, a cyclohexenyl group, a cycloheptenyl group, a tetrahydro-2H-pyranyl group, a morpholinyl group, a dioxanyl group, a phenyl group, a ($C_1$-$C_{10}$ alkyl)phenyl group, a di($C_1$-$C_{10}$ alkyl)phenyl group, a biphenyl group, a di(phenyl)phenyl group, a terphenyl group, a naphthyl group, a fluorenyl group, a phenanthrenyl group, an anthracenyl group, a fluoranthenyl group, a triphenylenyl group, a pyrenyl group, a chrysenyl group, a pyrrolyl group, a thiophenyl group, a furanyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, an isoindolyl group, an indolyl group, an indazolyl group, a purinyl group, a quinolinyl group, an isoquinolinyl group, a benzoquinolinyl group, a quinoxalinyl group, a quinazolinyl group, a cinnolinyl group, a carbazolyl group, a phenanthrolinyl group, a benzimidazolyl group, a benzofuranyl group, a benzothiophenyl group, an isobenzothiazolyl group, a benzoxazolyl group, an isobenzoxazolyl group, a triazolyl group, a tetrazolyl group, an oxadiazolyl group, a triazinyl group, a dibenzofuranyl group, a dibenzothiophenyl group, a benzocarbazolyl group, a dibenzocarbazolyl group, an imidazopyridinyl group, an imidazopyrimidinyl group, a 2,3-dihydro-1H-indenyl group, a 1,2,3,4-tetrahydronaphthalenyl group, a 2,3-dihydrobenzodioxinyl group, a benzodioxanyl group, —O($Q_{31}$), —S($Q_{31}$), —Si($Q_{31}$)($Q_{32}$)($Q_{33}$), —N($Q_{31}$)($Q_{32}$), —B($Q_{31}$)($Q_{32}$), —P($Q_{31}$)($Q_{32}$), —C(=O)($Q_{31}$), —S(=O)$_2$($Q_{31}$), and —P(=O)($Q_{31}$)($Q_{32}$); or —O($Q_1$), —S($Q_1$), —Si($Q_1$)($Q_2$)($Q_3$), —N($Q_1$)($Q_2$), -B($Q_1$)($Q_2$), —P($Q_1$)($Q_2$), —C(=O)($Q_1$), —S(=O)$_2$($Q_1$), or —P(=O)($Q_1$)($Q_2$), wherein $Q_1$ to $Q_3$ and $Q_{31}$ to $Q_{33}$ are each independently hydrogen, deuterium, —F, —Cl, —Br, —I, —CD$_3$, —CD$_2$H, —CDH$_2$, —CF$_3$, —CF$_2$H, —CFH$_2$, a hydroxyl group, a cyano group, a nitro group, an amidino group, a hydrazine group, a hydrazone group, a $C_1$-$C_{10}$ alkyl group, a $C_2$-$C_{10}$ alkenyl group, a $C_2$-$C_{10}$ alkynyl group, a $C_1$-$C_{10}$ alkoxy group, a cyclopentyl group, a cyclohexyl group, a cycloheptyl group, a cyclooctyl group, an adamantanyl group, a norbornanyl group, a norbornenyl group, a cyclopentenyl group, a cyclohexenyl group, a cycloheptenyl group, a tetrahydro-2H-pyranyl group, a morpholinyl group, a dioxanyl group, a phenyl group, a ($C_1$-$C_{10}$ alkyl)phenyl group, a di($C_1$-$C_{10}$ alkyl)phenyl group, a biphenyl group, a di(phenyl)phenyl group, a terphenyl group, a naphthyl group, a fluorenyl group, a phenanthrenyl group, an anthracenyl group, a fluoranthenyl group, a triphenylenyl group, a pyrenyl group, a chrysenyl group, a pyrrolyl group, a thiophenyl group, a furanyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, an isoindolyl group, an indolyl group, an indazolyl group, a purinyl group, a quinolinyl group, an isoquinolinyl group, a benzoquinolinyl group, a quinoxalinyl group, a quinazolinyl group, a cinnolinyl group, a carbazolyl group, a phenanthrolinyl group, a benzimidazolyl group, a benzofuranyl group, a benzothiophenyl group, an isobenzothiazolyl group, a benzoxazolyl group, an isobenzoxazolyl group, a triazolyl group, a tetrazolyl group, an oxadiazolyl group, a triazinyl group, a dibenzofuranyl group, a dibenzothiophenyl group, a benzocarbazolyl group, a dibenzocarbazolyl group, an imidazopyridinyl group, an imidazopyrimidinyl group, a 2,3-dihydro-1H-indenyl group, a 1,2,3,4-tetrahydronaphthalenyl group, a 2,3-dihydrobenzodioxinyl group, or a benzodioxanyl group.

6. A near-infrared light-emitting diode comprising:
a first electrode;
a second electrode; and
an organic layer between the first electrode and the second electrode,
wherein the organic layer comprises a near-infrared light-emitting layer, the near-infrared light-emitting layer comprises an osmium (Os)-containing organometallic compound, and the osmium (Os)-containing organometallic compound is configured to emit near-infrared light,
wherein the osmium (Os)-containing organometallic compound is represented by Formula 1:

$$M(L_1)_{n1}(L_2)_{n2} \qquad \text{Formula 1}$$

wherein, in Formula 1,
M is Os,
wherein $L_1$ is selected from ligands represented by Formula 1-1(1):

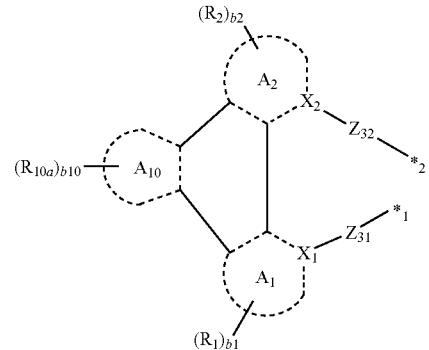

Formula 1-1(1)

wherein, in Formula 1-1(1),
ring $A_1$, ring $A_2$ and ring $A_{10}$ are each independently a $C_5$-$C_{30}$ carbocyclic group or a $C_1$-$C_{30}$ heterocyclic group,
$Z_{31}$ and $Z_{32}$ are each independently a covalent bond, a coordinate bond, O, S, C($R_7$)($R_8$), Si($R_7$)($R_8$), N($R_7$), P($R_7$), C($R_7$)($R_8$)($R_9$), Si($R_7$)($R_8$)($R_9$), N($R_7$)($R_8$), or P($R_7$)($R_8$),
$X_1$ and $X_2$ are each independently C or N,
$R_1$, $R_2$ and $R_7$ to $R_9$ are each independently hydrogen, deuterium, —F, —Cl, —Br, —I, a hydroxyl group, a cyano group, a nitro group, an amidino group, a hydrazine group, a hydrazone group, a substituted or unsubstituted $C_1$-$C_{60}$ alkyl group, a substituted or unsubstituted $C_2$-$C_{60}$ alkenyl group, a substituted or unsubstituted $C_2$-$C_{60}$ alkynyl group, a substituted or unsubstituted $C_1$-$C_{60}$ alkoxy group, a substituted or unsubstituted $C_3$-$C_{10}$ cycloalkyl group, a substituted or unsubstituted $C_1$-$C_{10}$ heterocycloalkyl group, a substituted or unsubstituted $C_3$-$C_{10}$ cycloalkenyl group, a substituted or unsubstituted $C_1$-$C_{10}$ heterocycloalkenyl group, a substituted or unsubstituted $C_6$-$C_{60}$ aryl group, a substituted or unsubstituted $C_6$-$C_{60}$ aryloxy group, a substituted or unsubstituted $C_6$-$C_{60}$ arylthio group, a substituted or unsubstituted $C_1$-$C_{60}$ heteroaryl group, a substituted or unsubstituted monovalent non-aromatic condensed polycyclic group, a substituted or unsubstituted monovalent non-aromatic condensed heteropolycyclic group, —Si($Q_1$)($Q_2$)($Q_3$), —N($Q_1$)($Q_2$), —B($Q_1$)($Q_2$), —C(=O)$_2$($Q_1$), —S(=O)$_2$($Q_1$), or —P(=O)($Q_1$)($Q_2$),
two adjacent groups selected from $R_1$, $R_2$ and $R_7$ to $R_9$ are optionally bound to form a $C_5$-$C_{30}$ carbocyclic group unsubstituted or substituted with at least one $R_{10a}$ or a $C_1$-$C_{30}$ heterocyclic group unsubstituted or substituted with at least one $R_{10a}$,

143

$R_{10a}$ is defined the same as $R_1$,
b1, b2 and b10 are each independently an integer from 0 to 10,
*¹ and *² each indicate a binding site to M in Formula 1,
a bond between M and $Z_{31}$ or $X_1$ in Formula 1-1(1) and a bond between M and $Z_{32}$ or $X_2$ in Formula 1-1(1) are each independently a covalent bond or a coordinate bond and
at least one substituent of the substituted $C_1$-$C_{60}$ alkyl group, the substituted $C_2$-$C_{60}$ alkenyl group, the substituted $C_2$-$C_{60}$ alkynyl group, the substituted $C_1$-$C_{60}$ alkoxy group, the substituted $C_3$-$C_{10}$ cycloalkyl group, the substituted $C_1$-$C_{10}$ heterocycloalkyl group, the substituted $C_3$-$C_{10}$ cycloalkenyl group, the substituted $C_1$-$C_{10}$ heterocycloalkenyl group, the substituted $C_6$-$C_{60}$ aryl group, the substituted $C_6$-$C_{60}$ aryloxy group, the substituted $C_6$-$C_{60}$ arylthio group, the substituted $C_1$-$C_{60}$ heteroaryl group, the substituted monovalent non-aromatic condensed polycyclic group, and the substituted monovalent non-aromatic condensed heteropolycyclic group is selected from:
deuterium, —F, —Cl, —Br, —I, a hydroxyl group, a cyano group, a nitro group, an amidino group, a hydrazine group, a hydrazone group, a $C_1$-$C_{60}$ alkyl group, a $C_2$-$C_{60}$ alkenyl group, a $C_2$-$C_{60}$ alkynyl group, and a $C_1$-$C_{60}$ alkoxy group;
a $C_1$-$C_{60}$ alkyl group, a $C_2$-$C_{60}$ alkenyl group, a $C_2$-$C_{60}$ alkynyl group, and a $C_1$-$C_{60}$ alkoxy group, each substituted with at least one selected from deuterium, —F, —Cl, —Br, —I, a hydroxyl group, a cyano group, a nitro group, an amidino group, a hydrazine group, a hydrazone group, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, a monovalent non-aromatic condensed heteropolycyclic group, —Si($Q_{11}$)($Q_{12}$)($Q_{13}$), —N($Q_{11}$)($Q_{12}$), —B($Q_{11}$)($Q_{12}$), —C(=O)$_2$($Q_{11}$), —S(=O)$_2$($Q_{11}$), and —P(=O)($Q_{11}$)($Q_{12}$);
a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, a monovalent non-aromatic condensed heteropolycyclic group, a biphenyl group, and a terphenyl group;
a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, and a monovalent non-aromatic condensed heteropolycyclic group, each substituted with at least one selected from deuterium, —F, —Cl, —Br, —I, a hydroxyl group, a cyano group, a nitro group, an amidino group, a hydrazine group, a hydrazone group, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, a monovalent non-aromatic condensed het-

144 eropolycyclic WOW), —Si($Q_{21}$)($Q_{22}$)($Q_{23}$), —N($Q_{21}$)($Q_{22}$), —B($Q_{21}$)($Q_{22}$), —C(=O)$_2$($Q_{21}$), —S(=O)$_2$($Q_{21}$), and —P(=O)($Q_{21}$)($Q_{22}$); and
—Si($Q_{31}$)($Q_{32}$)($Q_{33}$), —N($Q_{31}$)($Q_{32}$), —B($Q_{31}$)($Q_{32}$), —C(=O)$_2$($Q_{31}$), —S(=O)$_2$($Q_{31}$), and —P(=O)($Q_{31}$)($Q_{32}$),
wherein $Q_1$ to $Q_3$, $Q_{11}$ to $Q_{13}$, $Q_{21}$ to $Q_{23}$, and $Q_{31}$ to $Q_{33}$ are each independently selected from hydrogen, deuterium, —F, —Cl, —Br, —I, a hydroxyl group, a cyano group, a nitro group, an amidino group, a hydrazine group, a hydrazone group, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryl group substituted with at least one $C_1$-$C_{60}$ alkyl group, a $C_6$-$C_{60}$ aryl group substituted with at least one $C_6$-$C_{60}$ aryl group, a terphenyl group, a $C_1$-$C_{60}$ heteroaryl group, a $C_1$-$C_{60}$ heteroaryl group substituted with at least one $C_1$-$C_{60}$ alkyl group, a $C_1$-$C_{60}$ heteroaryl group substituted with at least one $C_6$-$C_{60}$ aryl group, a monovalent non-aromatic condensed polycyclic group, and a monovalent non-aromatic condensed heteropolycyclic group, and
wherein, a moiety represented by

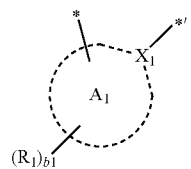

in Formula 1-1(1) is selected from groups represented by Formulae A1-1 to A1-51 and A1-54 to A1-56, and
wherein a moiety represented by

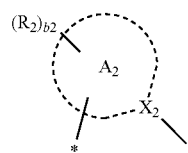

in Formula 1-1(1) is selected from groups represented by Formulae A2-1 to A2-32, A2-34, A2-35, A2-37 and A2-41 to A2-50:

A1-1

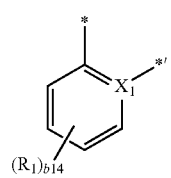

A1-2

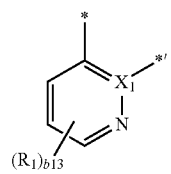

-continued

A1-3

A1-4

A1-5

A1-6

A1-7

A1-8

A1-9

A1-10

-continued

A1-11

A1-12

A1-13

A1-14

A1-15

A1-16

A1-17
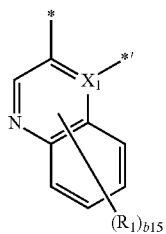
A1-18
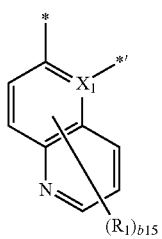
A1-19
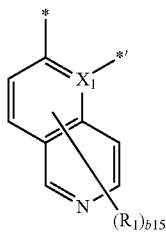
A1-20
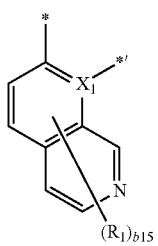
A1-21
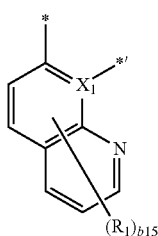
A1-22
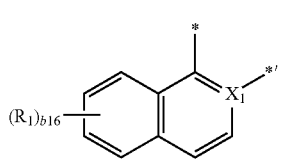
A1-23
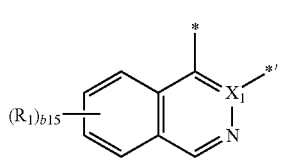
A1-24
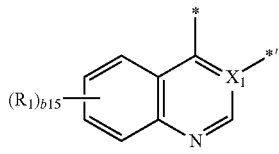
A1-25
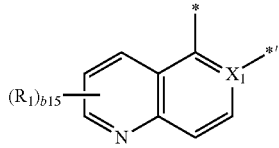
A1-26
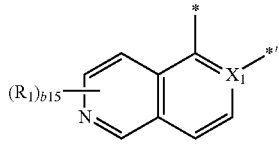
A1-27
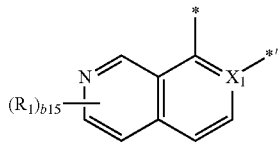
A1-28
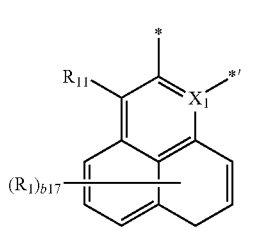
A1-29
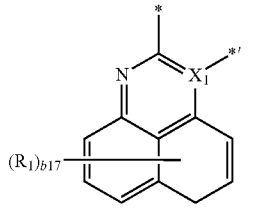
A1-30
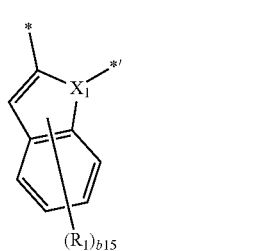
A1-31

A1-32 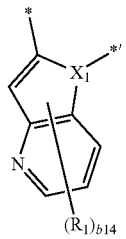
A1-33 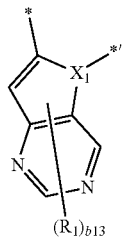
A1-34 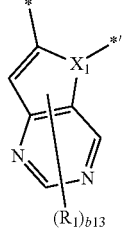
A1-35 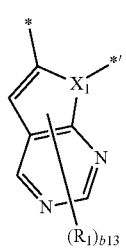
A1-36 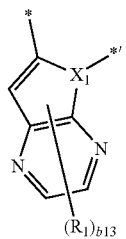
A1-37 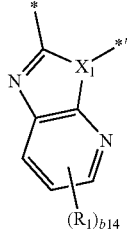
A1-38 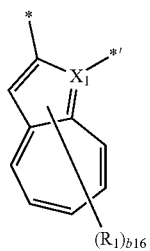
A1-39 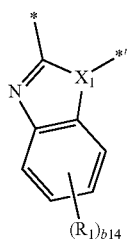
A1-40 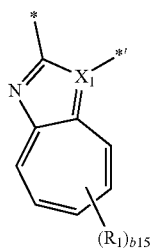
A1-41 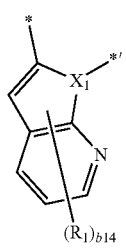
A1-42 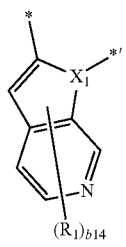
A1-43 

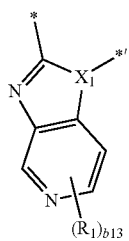
A1-44
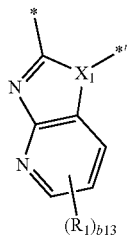
A1-45
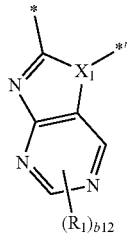
A1-46
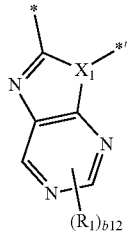
A1-47
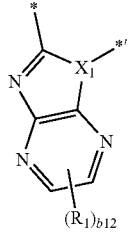
A1-48
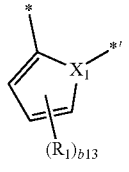
A1-49
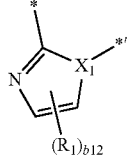
A1-50
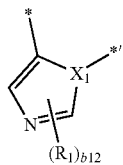
A1-51
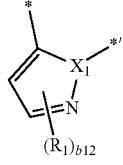
A1-52
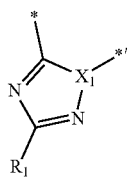
A1-53
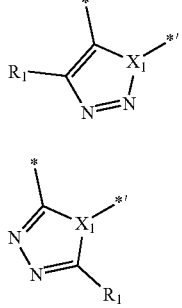
A1-54
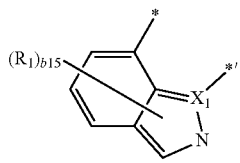
A1-55
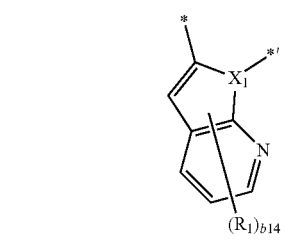
A1-56
A1-35
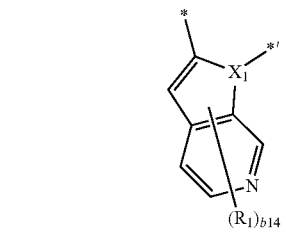
A1-36

-continued
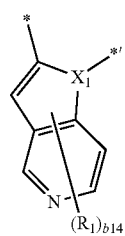
A1-37
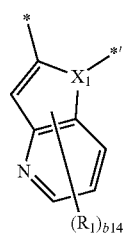
A1-38
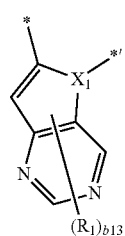
A1-39
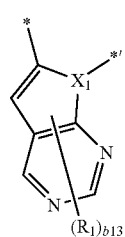
A1-40
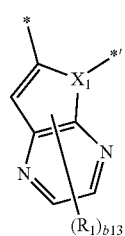
A1-41
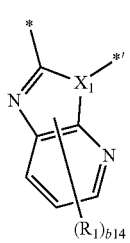
A1-42
-continued
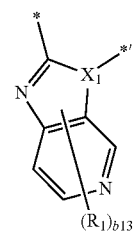
A1-43
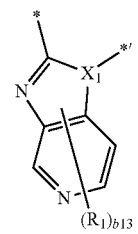
A1-44
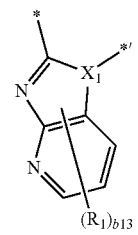
A1-45
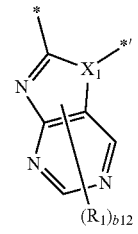
A1-46
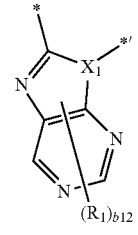
A1-47
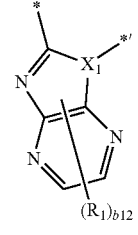
A1-48
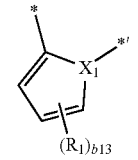
A1-49

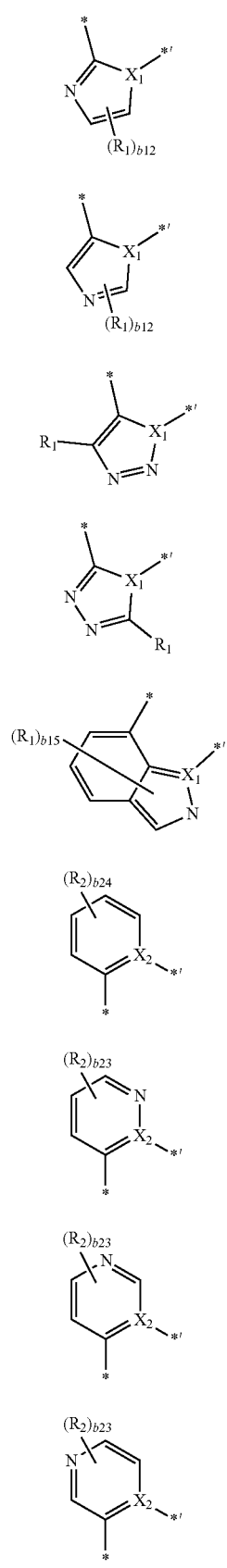
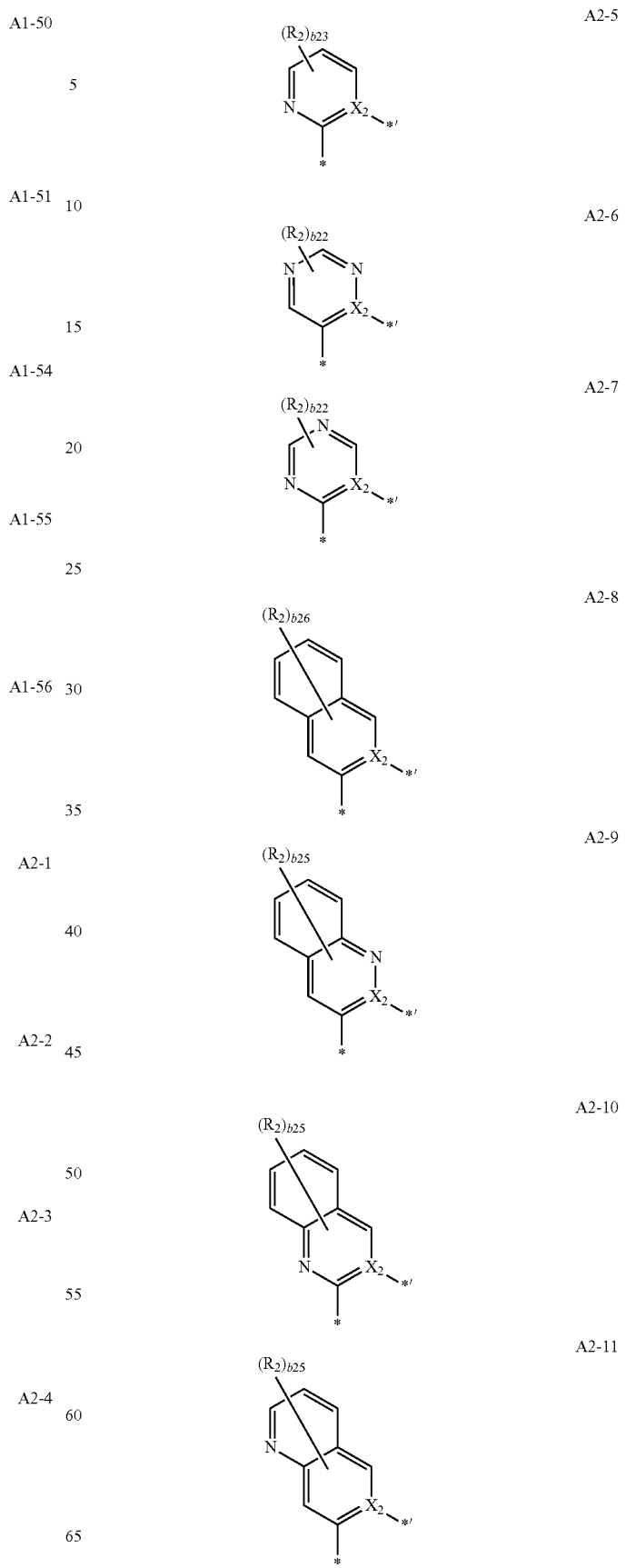

-continued
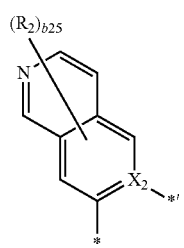
A2-12
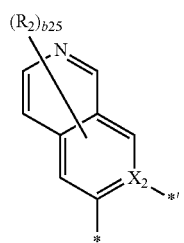
A2-13
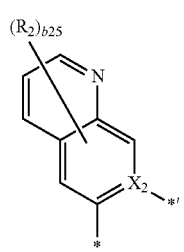
A2-14
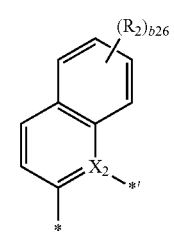
A2-15
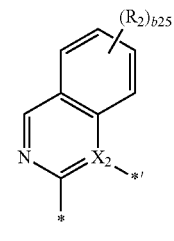
A2-16
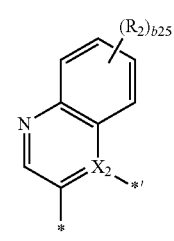
A2-17
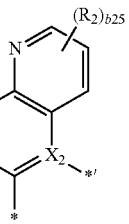
A2-18
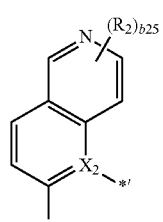
A2-19
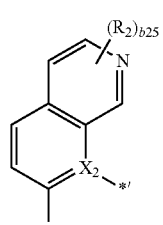
A2-20
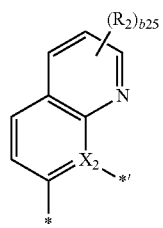
A2-21
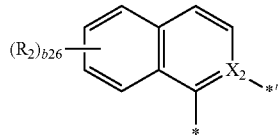
A2-22
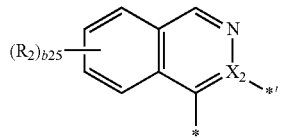
A2-23
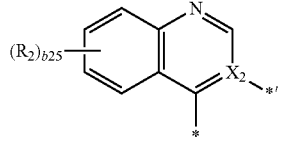
A2-24
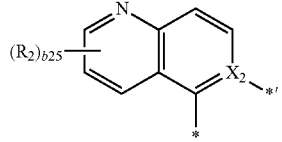
A2-25

-continued
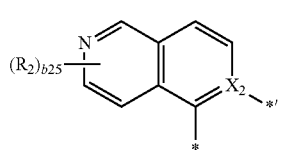 A2-26
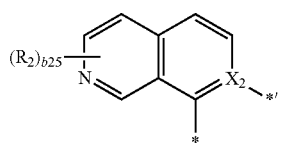 A2-27
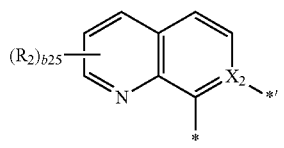 A2-28
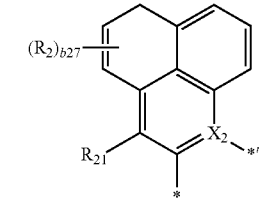 A2-29
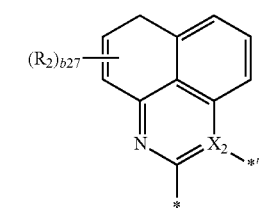 A2-30
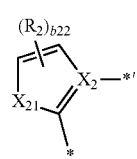 A2-31
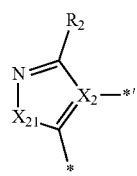 A2-32
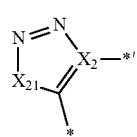 A2-34
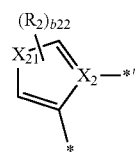 A2-35
-continued
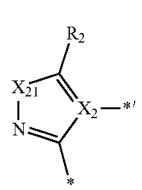 A2-37
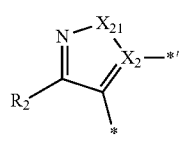 A2-41
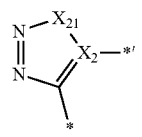 A2-42
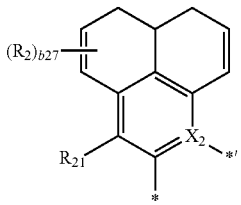 A2-43
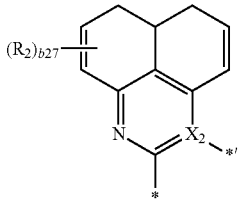 A2-44
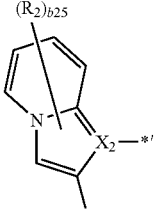 A2-45
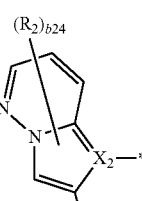 A2-46
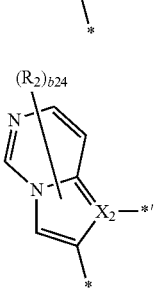 A2-47

-continued

A2-48

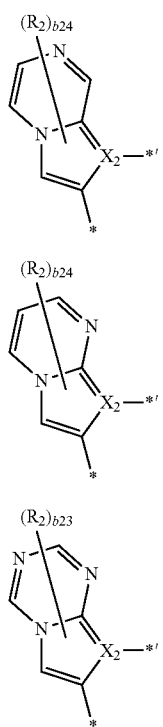

A2-49

A2-50 wherein in Formulae A1-1 to A1-51 and A1-54 to A1-56,
$X_1$ and $R_1$ are respectively the same as those defined in Formula 1-1(1),
b12 is an integer from 0 to 2,
b13 is an integer from 0 to 3,
b14 is an integer from 0 to 4,
b15 is an integer from 0 to 5,
b16 is an integer from 0 to 6,
b17 is an integer from 0 to 7,
*' indicates a binding site to $Z_{31}$ in Formula 1-1(1), and
* indicates a binding site to $T_1$ in Formula 1-1(1),
wherein in Formulae A2-1 to A2-32, A2-34, A2-35, A2-37 and A2-41 to A2-50,
$X_2$ and $R_2$ are respectively the same as those defined with respect to Formula 1-1(1),
$X_{21}$ is selected from O, S, $N(R_{21})$, $C(R_{21})(R_{22})$, and $Si(R_{21})(R_{22})$,
$R_{21}$ and $R_{22}$ are each defined the same as $R_2$,
b22 is an integer from 0 to 2,
b23 is an integer from 0 to 3,
b24 is an integer from 0 to 4,
b25 is an integer from 0 to 5,
b26 is an integer from 0 to 6,
b27 is an integer from 0 to 7,
*' indicates a binding site to $Z_{32}$ in Formula 1-1(1), and
* indicates a binding site to $T_1$ in Formula 1-1(1).

7. The near-infrared light-emitting diode of claim 1, wherein the osmium (Os)-containing organometallic compound is selected from Compounds 1 to 15, 17 to 20 and 24 to 42:

1

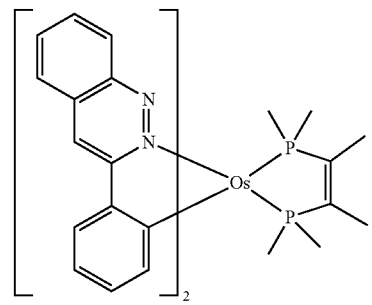

2

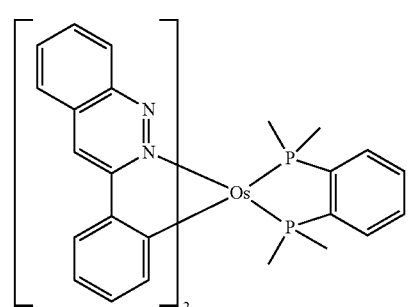

3

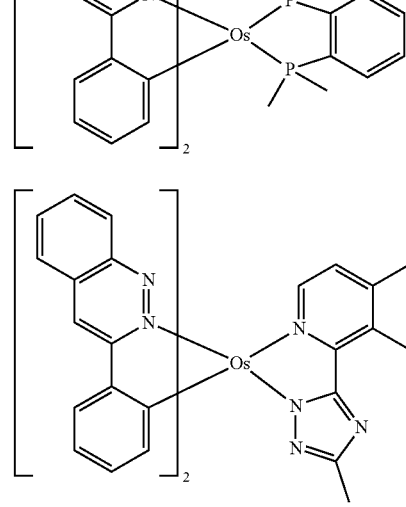

4

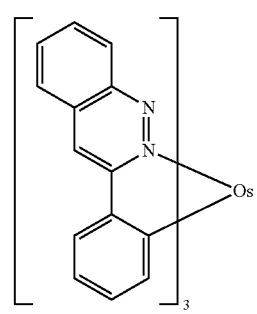

5

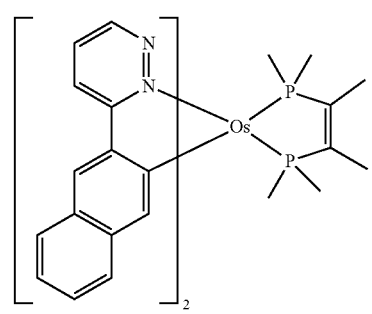

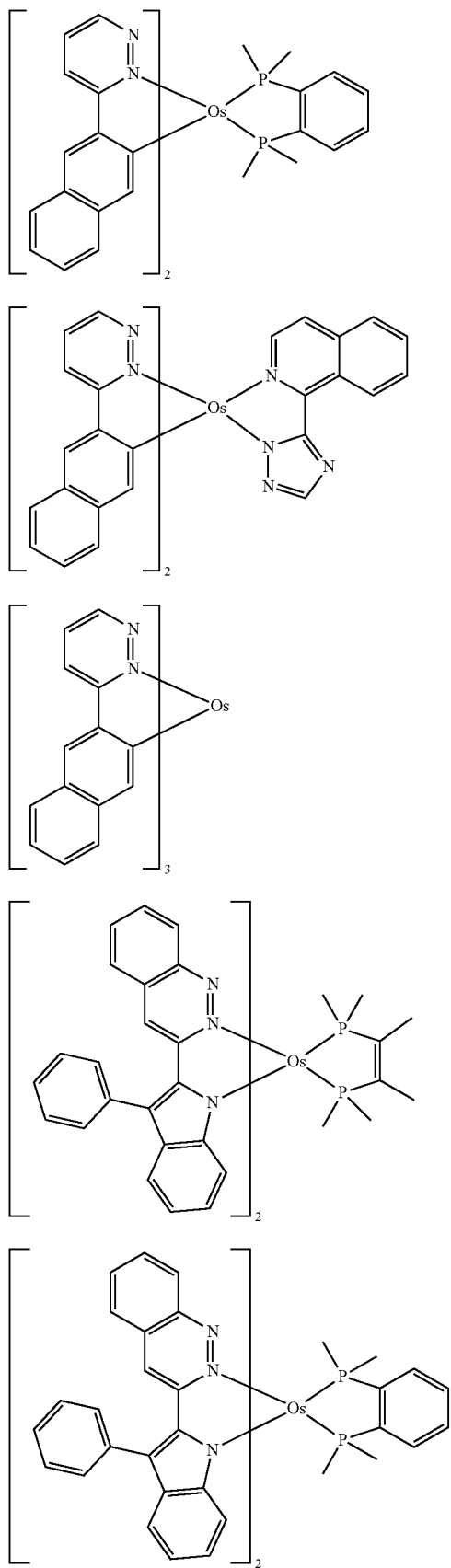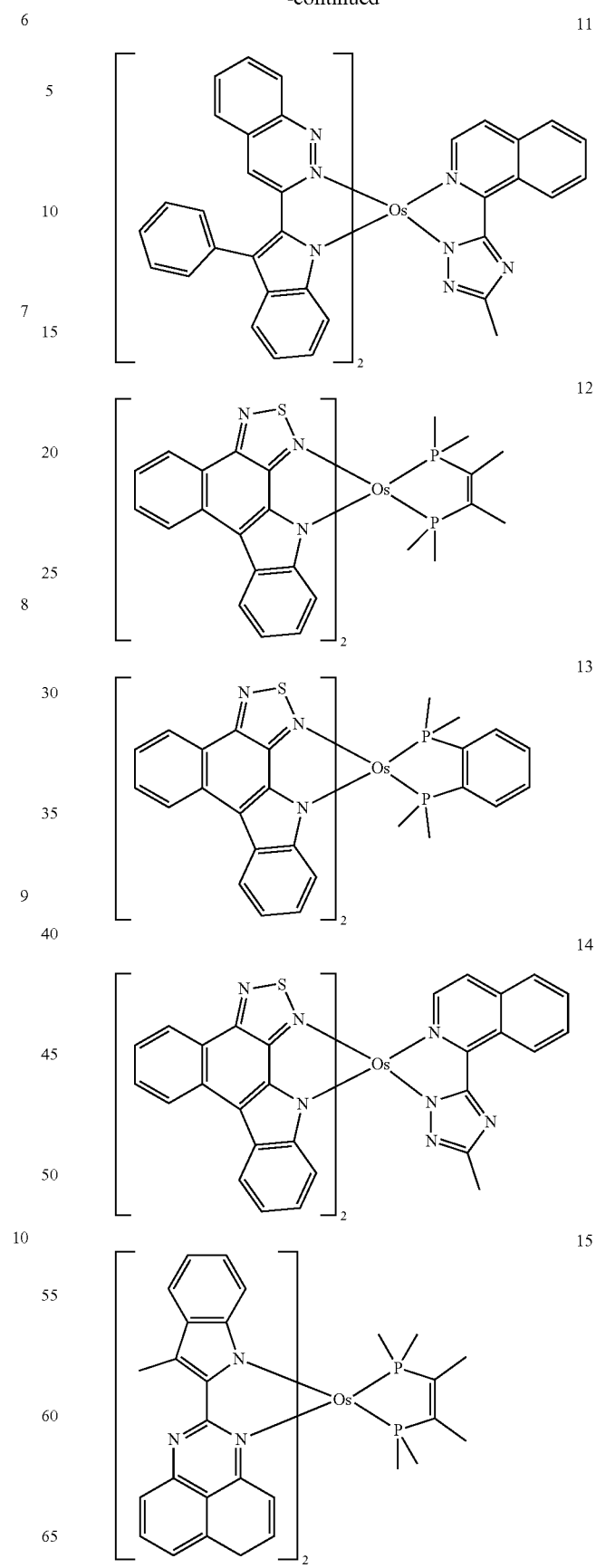

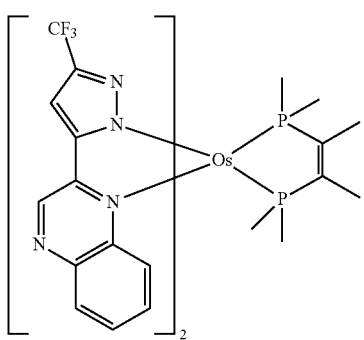
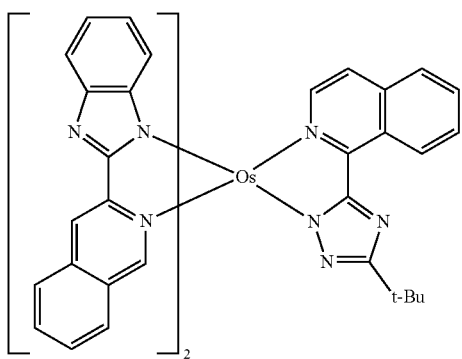
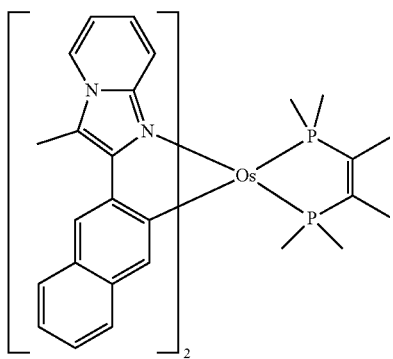
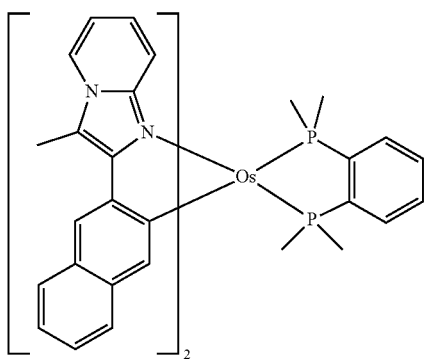
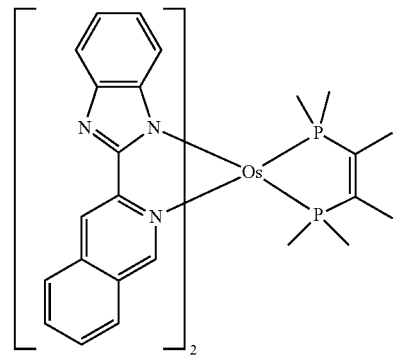
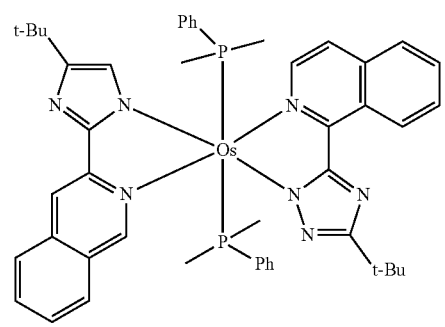
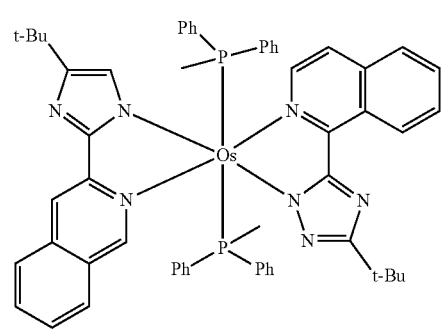
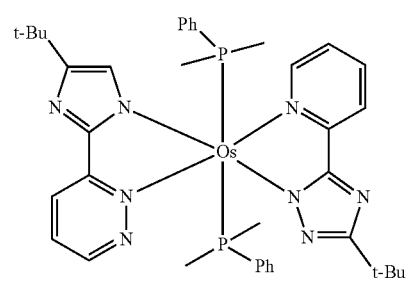
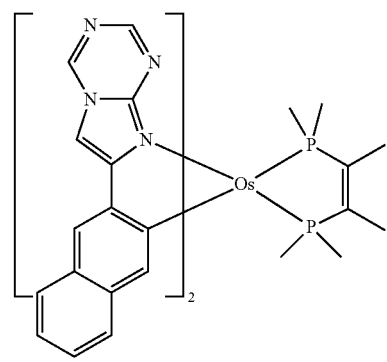

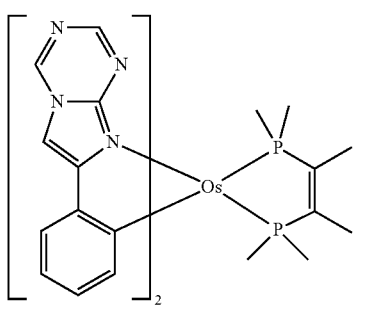
25
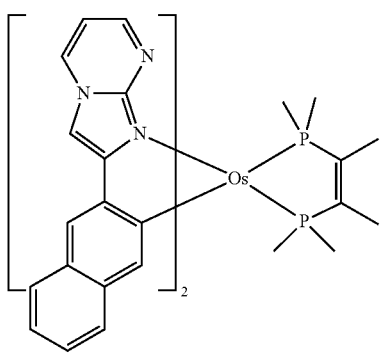
26
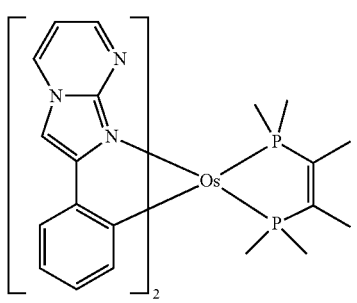
27
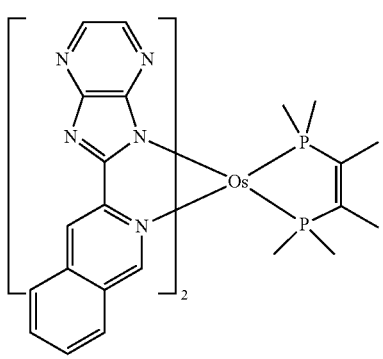
28
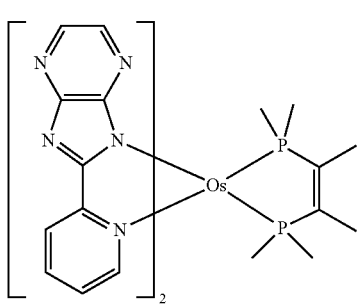
29
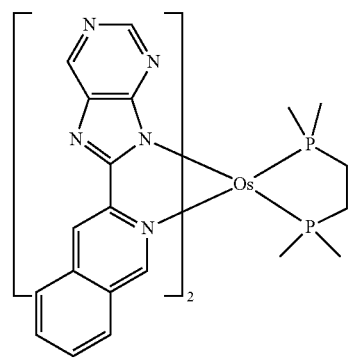
30
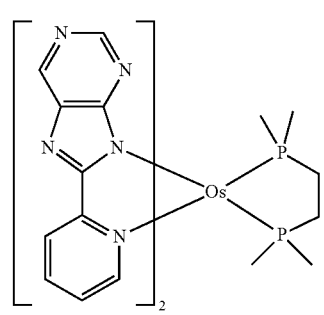
31
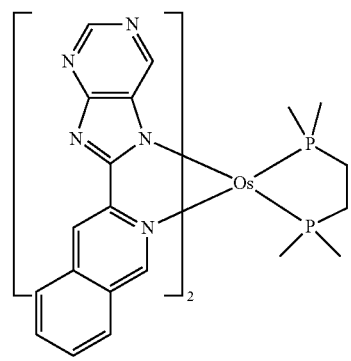
32
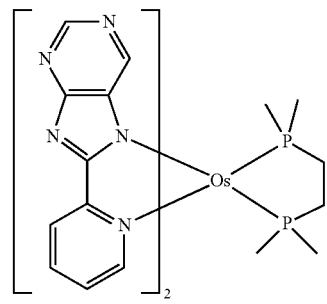
33

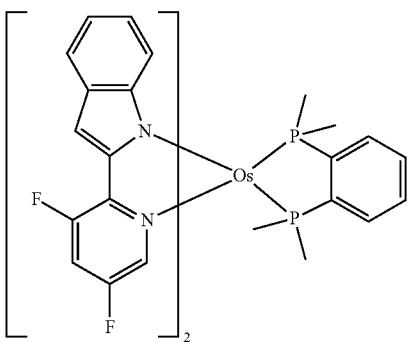
34
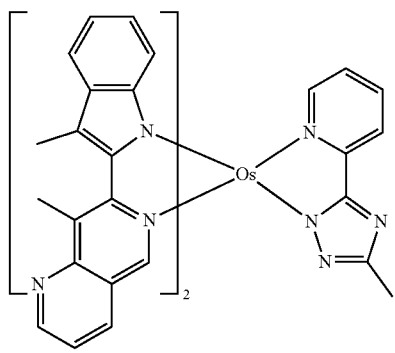
38
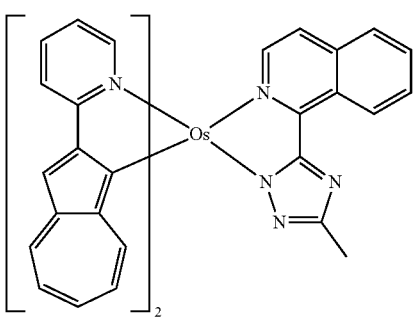
35
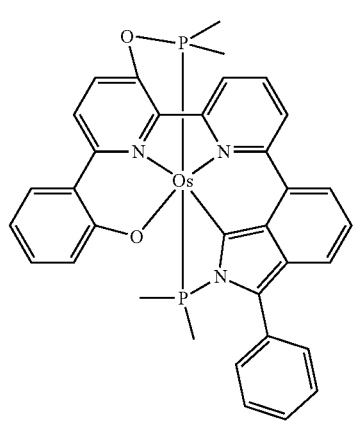
39
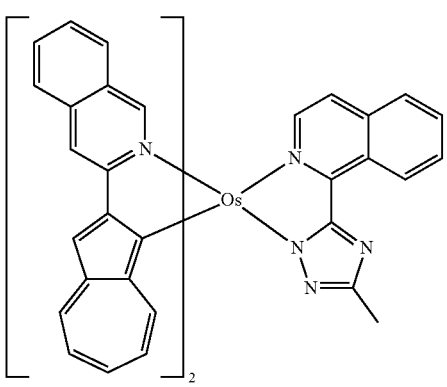
36
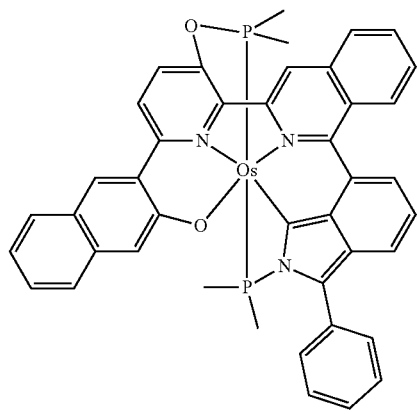
40
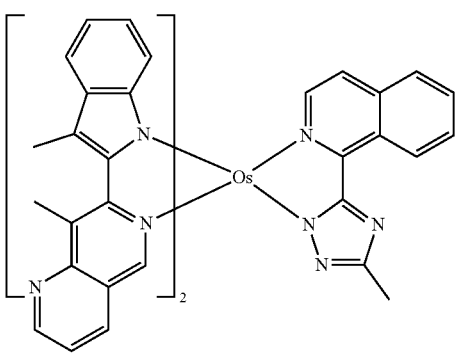
37
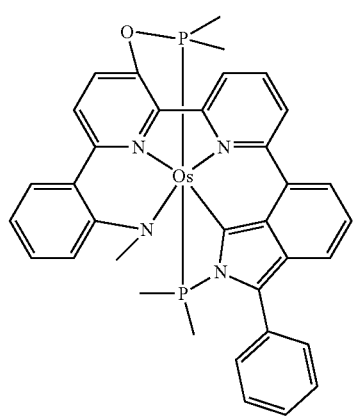
41

-continued

42

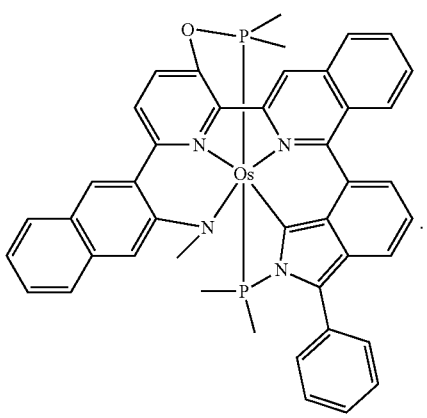

8. The near-infrared light-emitting diode of claim 1, wherein the near-infrared light-emitting layer further comprises a host.

9. The near-infrared light-emitting diode of claim 1, wherein the organic layer further comprises a hole transport region between the first electrode and the near-infrared light-emitting layer and an electron transport region between the near-infrared light-emitting layer and the second electrode.

10. The near-infrared light-emitting diode of claim 9, wherein at least one selected from the hole transport region, the near-infrared light-emitting layer, and the electron transport region comprises a carbazole-containing compound.

11. A near-infrared light-emitting diode comprising:
a first electrode;
a second electrode; and
an organic layer between the first electrode and the second electrode,
wherein the organic layer comprises a near-infrared light-emitting layer, the near-infrared light-emitting layer comprises an osmium (Os)-containing organometallic compound, and the osmium (Os)-containing organometallic compound is configured to emit near-infrared light,
wherein the osmium (Os)-containing organometallic compound is represented by Formula 1:

M(L$_1$)$_{n1}$(L$_2$)$_{n2}$    Formula 1 wherein, in Formula 1,
M is Os,
L$_1$ is selected from ligands represented by Formula 1-1:

Formula 1-1

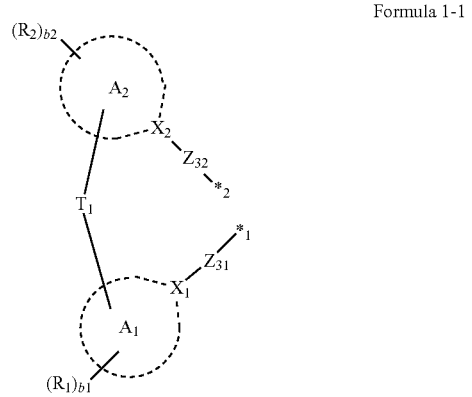

n1 is an integer from 1 to 4; and when n1 is 2 or greater, at least two L$_1$(s) are identical to or different from each other,
L$_2$ is an organic ligand,
n2 is an integer from 0 to 4; and when n2 is 2 or greater, at least two L$_2$(s) are identical to or different from each other,
i) at least two selected from L$_1$(s) in the number of n1, ii) at least two selected from L$_2$(s) in the number of n2, or iii) at least one selected from Li (s) in the number of n1 and at least one selected from L$_2$(s) in the number of n2 are optionally bound via a single bond, a double bond, *=N—*', *—N=*', *=C[(L$_3$)$_{a3}$-(R$_3$)]—*', *-C[(L$_3$)$_{a3}$-(R$_3$)]=*', *—N[(L$_3$)$_{a3}$-(R$_3$)]—*', *—B(R$_3$)—*', *—P(R$_3$)—*', *—C(R$_3$)(R$_4$)—*', *—Si(R$_3$)(R$_4$)—*', *—Ge(R$_3$)(R$_4$)—*', *—S—*', *—Se—*', *—O—*', *—C(=O)—*', *—S(=O)—*', *—S(=O)$_2$—*', *—C(R$_3$)=*', *=C(R$_3$)—*', *—C(R$_3$)=C(R$_4$)—*', *—C(=S)—*', or *—C≡C—*' to form a tridentate ligand, a tetradentate ligand, a pentadentate ligand, or a hexadentate ligand, and * and *' each indicate a binding site to an adjacent atom,
wherein, in Formula 1-1,
ring A$_1$ and ring A$_2$ are each independently a C$_5$-C$_{30}$ carbocyclic group or a C$_1$-C$_{30}$ heterocyclic group,
Z$_{31}$ and Z$_{32}$ are each independently a covalent bond, a coordinate bond, O, S, C(R$_7$)(R$_8$), Si(R$_7$)(R$_8$), N(R$_7$), P(R$_7$), C(R$_7$)(R$_8$)(R$_9$), Si(R$_7$)(R$_8$)(R$_9$), N(R$_7$)(R$_8$), or P(R$_7$)(R$_8$),
X$_1$ and X$_2$ are each independently C or N,
ring A$_1$ and T$_1$; and T$_1$ and ring A$_2$ are each independently bound via a single bond or a double bond,
T$_1$ is a single bond, a double bond, *=N—*', *—N=*', *=C[(L$_5$)$_{a5}$-(R)]-', *=C[(L$_5$)$_{a5}$-(R$_5$)]=*', *—N[(L$_5$)$_{a5}$-(R$_5$)]—*', *—B(R$_5$)—*', *—P(R$_5$)—*', *—C(R$_5$)(R$_6$)—*', *—Si(R$_5$)(R$_6$)—*', *—Ge(R$_5$)(R$_6$)—*', *-5-*', *—Se—*', *—O—*', *—C(=O)—*', *-5(=O)—', *—S(=O)$_2$—*', *—C(R$_5$)=*', *=C(R$_5$)—*', *—C(R$_5$)=C(R$_6$)—*', *—C(=S)—*', or *—C≡C—*', wherein * and *' each indicate a binding site to an adjacent atom,
L$_3$ and L$_5$ are each independently a single bond, a C$_5$-C$_{30}$ carbocyclic group unsubstituted or substituted with at least one R$_{10}$, or a C$_1$-C$_{30}$ heterocyclic group unsubstituted or substituted with at least one R$_{10}$,
a3 and a5 are each independently an integer from 1 to 5,
R$_1$ to R$_{10}$ are each independently hydrogen, deuterium, —F, —Cl, —Br, —I, a hydroxyl group, a cyano group, a nitro group, an amidino group, a hydrazine group, a hydrazone group, a substituted or unsubstituted C$_1$-C$_{60}$ alkyl group, a substituted or unsubstituted C$_2$-C$_{60}$ alkenyl group, a substituted or unsubstituted C$_2$-C$_{60}$ alkynyl group, a substituted or unsubstituted C$_1$-C$_{60}$ alkoxy group, a substituted or unsubstituted C$_3$-C$_{10}$ cycloalkyl group, a substituted or unsubstituted C$_1$-C$_{10}$ heterocycloalkyl group, a substituted or unsubstituted C$_3$-C$_{10}$ cycloalkenyl group, a substituted or unsubstituted C$_1$-C$_{10}$ heterocycloalkenyl group, a substituted or unsubstituted C$_6$-C$_{60}$ aryl group, a substituted or unsubstituted C$_6$-C$_{60}$ aryloxy group, a substituted or unsubstituted C$_6$-C$_{60}$ arylthio group, a substituted or unsubstituted C$_1$-C$_{60}$ heteroaryl group, a substituted or unsubstituted monovalent non-aromatic condensed polycyclic group, a substituted or unsubstituted monovalent non-aromatic condensed heteropolycyclic group, —Si(Q$_1$)(Q$_2$)(Q$_3$), —N(Q$_1$)(Q$_2$), —B(Q$_1$)(Q$_2$), —C(=O)$_2$(Q$_1$), —S(=O)$_2$(Q$_1$), or —P(=O)(Q$_1$)(Q$_2$), two adjacent groups selected from R$_1$ to R$_{10}$ are optionally bound to form a C$_5$-C$_{30}$ carbocyclic group unsubstituted or substituted with at least one R$_{10a}$ or a C$_1$-C$_{30}$ heterocyclic group unsubstituted or substituted with at least one R$_{10a}$, R$_{10a}$ is defined the same as R$_{10}$, b1 and b2 are each independently an integer from 0 to 10,

*$^1$ and *$^2$ each indicate a binding site to M in Formula 1, a bond between M and Z$_{31}$ or X$_1$ in Formula 1-1 and a bond between M and Z$_{32}$ or X$_2$ in Formula 1-1 are each independently a covalent bond or a coordinate bond, and at least one substituent of the substituted C$_1$-C$_{60}$ alkyl group, the substituted C$_2$-C$_{60}$ alkenyl group, the substituted C$_2$-C$_{60}$ alkynyl group, the substituted C$_1$-C$_{60}$ alkoxy group, the substituted C$_3$-C$_{10}$ cycloalkyl group, the substituted C$_1$-C$_{10}$ heterocycloalkyl group, the substituted C$_3$-C$_{10}$ cycloalkenyl group, the substituted C$_1$-C$_{10}$ heterocycloalkenyl group, the substituted C$_6$-C$_{60}$ aryl group, the substituted C$_6$-C$_{60}$ aryloxy group, the substituted C$_6$-C$_{60}$ arylthio group, the substituted C$_1$-C$_{60}$ heteroaryl group, the substituted monovalent non-aromatic condensed polycyclic group, and the substituted monovalent non-aromatic condensed heteropolycyclic group is selected from:

deuterium, —F, —Cl, —Br, —I, a hydroxyl group, a cyano group, a nitro group, an amidino group, a hydrazine group, a hydrazone group, a C$_1$-C$_{60}$ alkyl group, a C$_2$-C$_{60}$ alkenyl group, a C$_2$-C$_{60}$ alkynyl group, and a C$_1$-C$_{60}$ alkoxy group;

a C$_1$-C$_{60}$ alkyl group, a C$_2$-C$_{60}$ alkenyl group, a C$_2$-C$_{60}$ alkynyl group, and a C$_1$-C$_{60}$ alkoxy group, each substituted with at least one selected from deuterium, —F, —Cl, —Br, —I, a hydroxyl group, a cyano group, a nitro group, an amidino group, a hydrazine group, a hydrazone group, a C$_3$-C$_{10}$ cycloalkyl group, a C$_1$-C$_{10}$ heterocycloalkyl group, a C$_3$-C$_{10}$ cycloalkenyl group, a C$_1$-C$_{10}$ heterocycloalkenyl group, a C$_6$-C$_{60}$ aryl group, a C$_6$-C$_{60}$ aryloxy group, a C$_6$-C$_{60}$ arylthio group, a C$_1$-C$_{60}$ heteroaryl group, a monovalent non-aromatic condensed polycyclic group, a monovalent non-aromatic condensed heteropolycyclic group, —Si(Q$_{11}$)(Q$_{12}$)(Q$_{13}$), —N(Q$_{11}$)(Q$_{12}$), —B(Q$_{11}$)(Q$_{12}$), —C(=O)$_2$(Q$_{11}$), —S(=O)$_2$(Q$_{11}$), and —P(=O)(Q$_{11}$)(Q$_{12}$);

a C$_3$-C$_{10}$ cycloalkyl group, a C$_1$-C$_{10}$ heterocycloalkyl group, a C$_3$-C$_{10}$ cycloalkenyl group, a C$_1$-C$_{10}$ heterocycloalkenyl group, a C$_6$-C$_{60}$ aryl group, a C$_6$-C$_{60}$ aryloxy group, a C$_6$-C$_{60}$ arylthio group, a C$_1$-C$_{60}$ heteroaryl group, a monovalent non-aromatic condensed polycyclic group, a monovalent non-aromatic condensed heteropolycyclic group, a biphenyl group, and a terphenyl group;

a C$_3$-C$_{10}$ cycloalkyl group, a C$_1$-C$_{10}$ heterocycloalkyl group, a C$_3$-C$_{10}$ cycloalkenyl group, a C$_1$-C$_{10}$ heterocycloalkenyl group, a C$_6$-C$_{60}$ aryl group, a C$_6$-C$_{60}$ aryloxy group, a C$_6$-C$_{60}$ arylthio group, a C$_1$-C$_{60}$ heteroaryl group, a monovalent non-aromatic condensed polycyclic group, and a monovalent non-aromatic condensed heteropolycyclic group, each substituted with at least one selected from deuterium, —F, —Cl, —Br, —I, a hydroxyl group, a cyano group, a nitro group, an amidino group, a hydrazine group, a hydrazone group, a C$_1$-C$_{60}$ alkyl group, a C$_2$-C$_{60}$ alkenyl group, a C$_2$-C$_{60}$ alkynyl group, a C$_1$-C$_{60}$ alkoxy group, a C$_3$-C$_{10}$ cycloalkyl group, a C$_1$-C$_{10}$ heterocycloalkyl group, a C$_3$-C$_{10}$ cycloalkenyl group, a C$_1$-C$_{10}$ heterocycloalkenyl group, a C$_6$-C$_{60}$ aryl group, a C$_6$-C$_{60}$ aryloxy group, a C$_6$-C$_{60}$ arylthio group, a C$_1$-C$_{60}$ heteroaryl group, a monovalent non-aromatic condensed polycyclic group, a monovalent non-aromatic condensed heteropolycyclic group, —Si(Q$_{21}$)(Q$_{22}$)(Q$_{23}$), —N(Q$_{21}$)(Q$_{22}$), —B(Q$_{21}$)(Q$_{22}$), —C(=O)$_2$(Q$_{21}$), —S(=O)$_2$(Q$_{21}$), and —P(=O)(Q$_{21}$)(Q$_{22}$); and —Si(Q$_{31}$)(Q$_{32}$)(Q$_{33}$), —N(Q$_{31}$)(Q$_{32}$), —B(Q$_{31}$)(Q$_{32}$), —C(=O)$_2$(Q$_{31}$), —S(=O)$_2$(Q$_{31}$), and —P(=O)(Q$_{31}$)(Q$_{32}$), wherein Q$_1$ to Q$_3$, Q$_{11}$ to Q$_{13}$, Q$_{21}$ to Q$_{23}$, and Q$_{31}$ to Q$_{33}$ are each independently selected from hydrogen, deuterium, —F, —Cl, —Br, —I, a hydroxyl group, a cyano group, a nitro group, an amidino group, a hydrazine group, a hydrazone group, a C$_1$-C$_{60}$ alkyl group, a C$_2$-C$_{60}$ alkenyl group, a C$_2$-C$_{60}$ alkynyl group, a C$_1$-C$_{60}$ alkoxy group, a C$_3$-C$_{10}$ cycloalkyl group, a C$_1$-C$_{10}$ heterocycloalkyl group, a C$_3$-C$_{10}$ cycloalkenyl group, a C$_1$-C$_{10}$ heterocycloalkenyl group, a C$_6$-C$_{60}$ aryl group, a C$_6$-C$_{60}$ aryl group substituted with at least one C$_1$-C$_{60}$ alkyl group, a C$_6$-C$_{60}$ aryl group substituted with at least one C$_6$-C$_{60}$ aryl group, a terphenyl group, a C$_1$-C$_{60}$ heteroaryl group, a C$_1$-C$_{60}$ heteroaryl group substituted with at least one C$_1$-C$_{60}$ alkyl group, a C$_1$-C$_{60}$ heteroaryl group substituted with at least one C$_6$-C$_{60}$ aryl group, a monovalent non-aromatic condensed polycyclic group, and a monovalent non-aromatic condensed heteropolycyclic group, and wherein, a moiety represented by

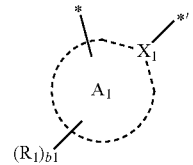

in Formula 1-1 is selected from groups represented by Formulae A$_1$-1 to A$_1$-51 and A$_1$-54 to A$_1$-56, and wherein a moiety represented by

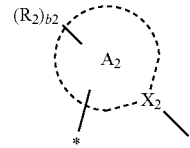

in Formula 1-1 is selected from groups represented by Formulae A2-1 to A2-32, A2-34, A2-35, A2-37 and A2-41 to A2-50:

A1-1

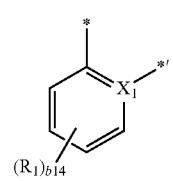

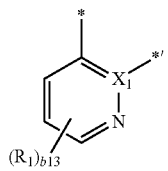 A1-2
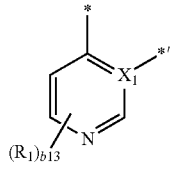 A1-3
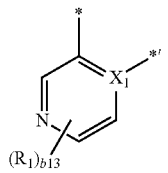 A1-4
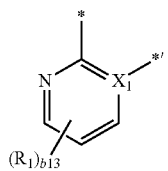 A1-5
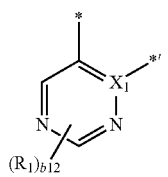 A1-6
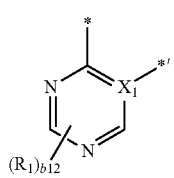 A1-7
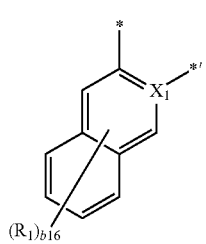 A1-8
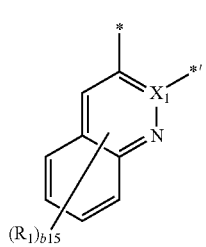 A1-9
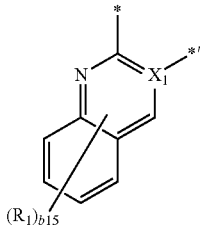 A1-10
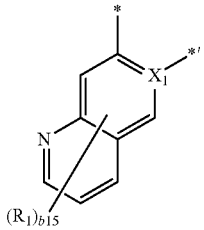 A1-11
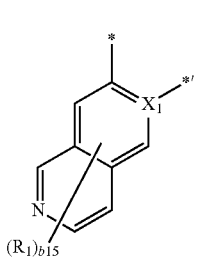 A1-12
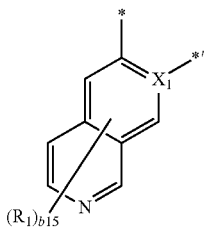 A1-13
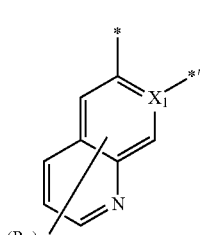 A1-14
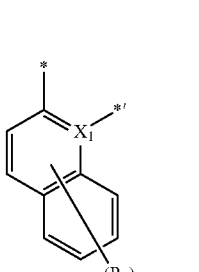 A1-15

-continued
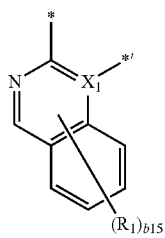
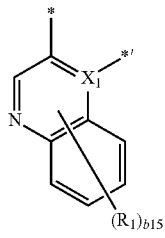
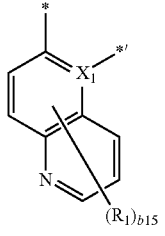
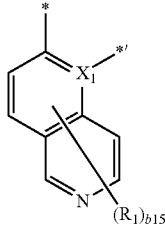
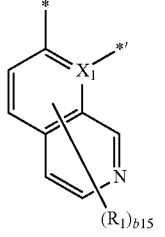
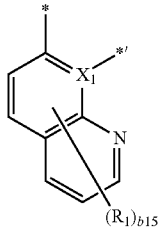
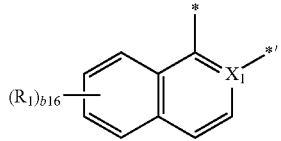
-continued
A1-16
A1-17
A1-18
A1-19
A1-20
A1-21
A1-22
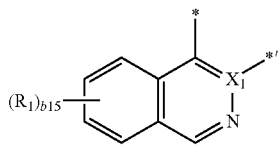
A1-23
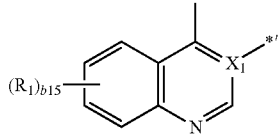
A1-24
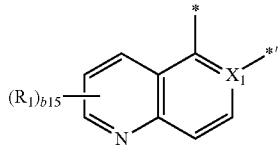
A1-25
A1-26
A1-27
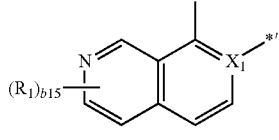
A1-28
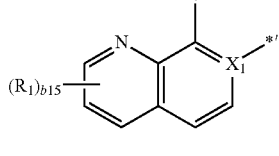
A1-29
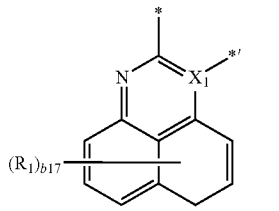
A1-30
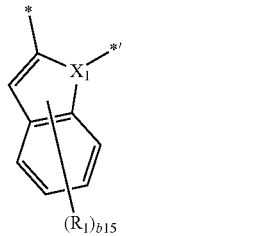
A1-31

-continued
A1-32 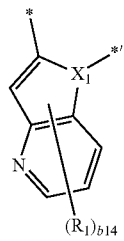
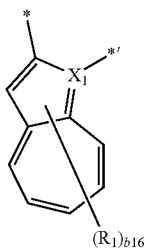
A1-33 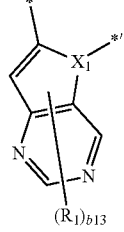
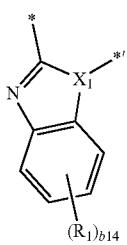
A1-34 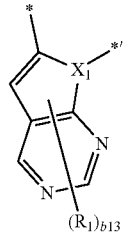
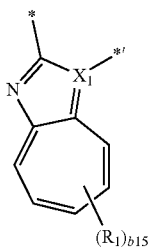
A1-35 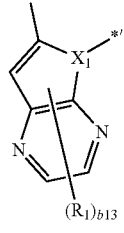
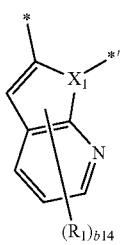
A1-36 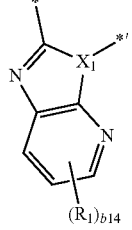
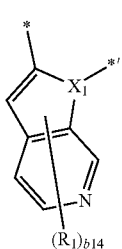
A1-37 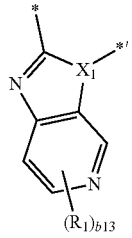
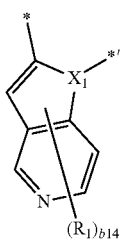
A1-38
A1-39
A1-40
A1-41
A1-42
A1-43

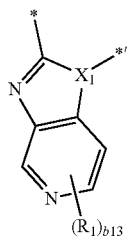
A1-44
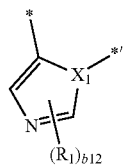
A1-51
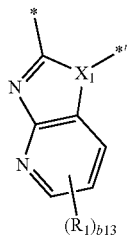
A1-45
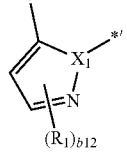
A1-52
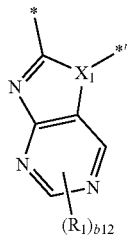
A1-46
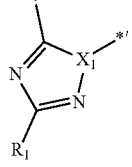
A1-53
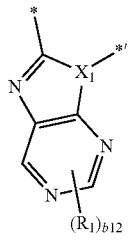
A1-47
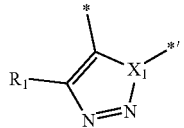
A1-54
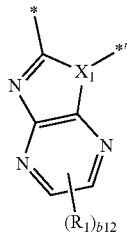
A1-48
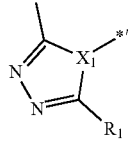
A1-55
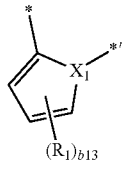
A1-49
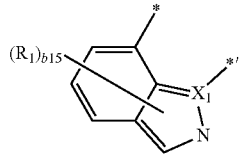
A1-56
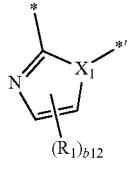
A1-50
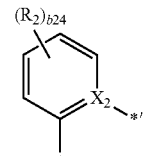
A2-1
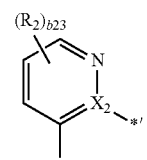
A2-2
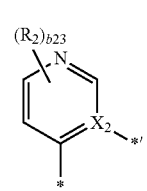
A2-3

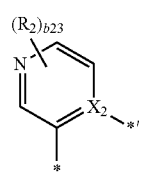 A2-4
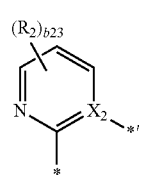 A2-5
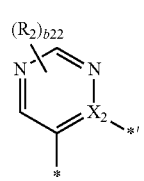 A2-6
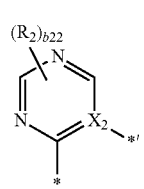 A2-7
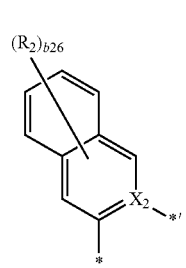 A2-8
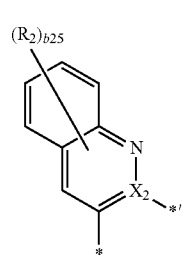 A2-9
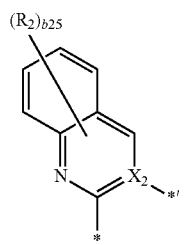 A2-10
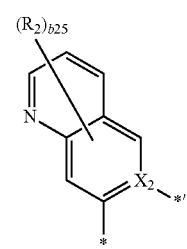 A2-11
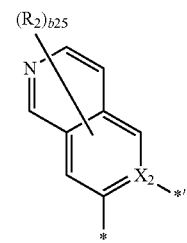 A2-12
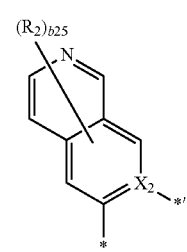 A2-13
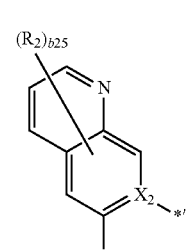 A2-14
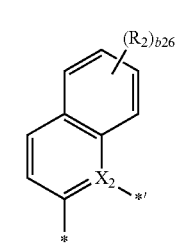 A2-15
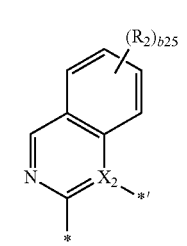 A2-16

-continued
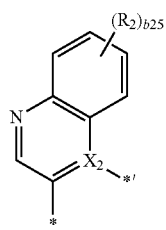
A2-17
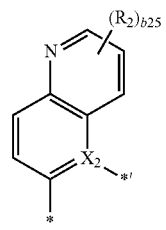
A2-18
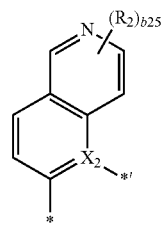
A2-19
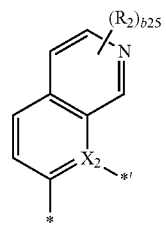
A2-20
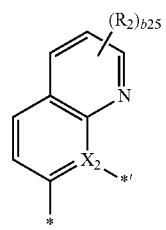
A2-21
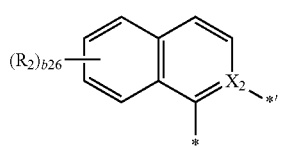
A2-22
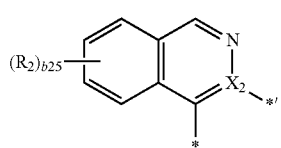
A2-23
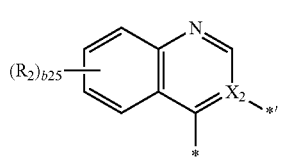
A2-24
-continued
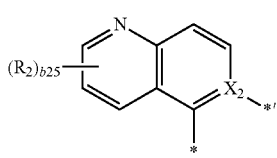
A2-25
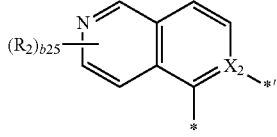
A2-26
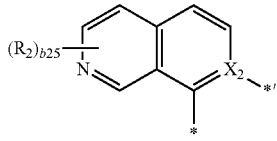
A2-27
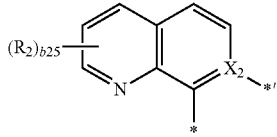
A2-28
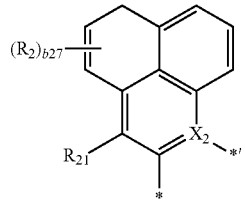
A2-29
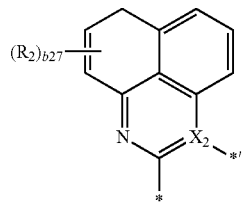
A2-30
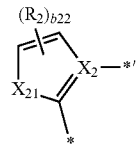
A2-31
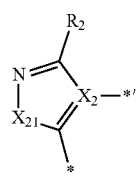
A2-32

A2-34 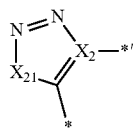

A2-35 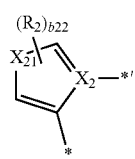

A2-37 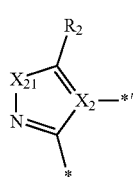

A2-41 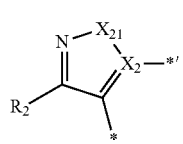

A2-42 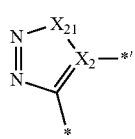

A2-43 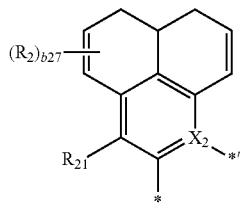

A2-44 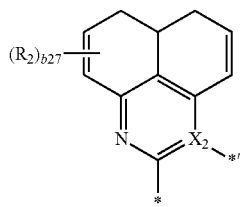

A2-45 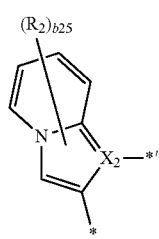

A2-46 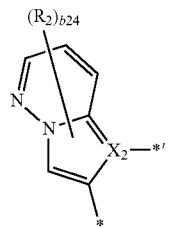

A2-47 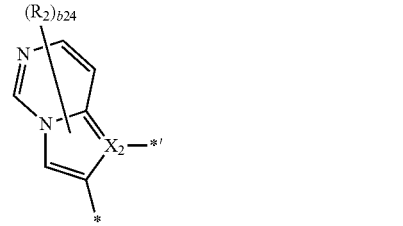

A2-48 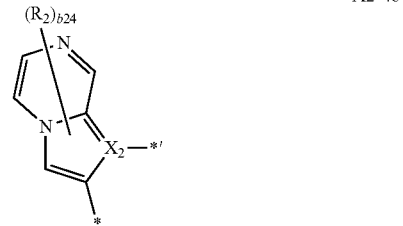

A2-49 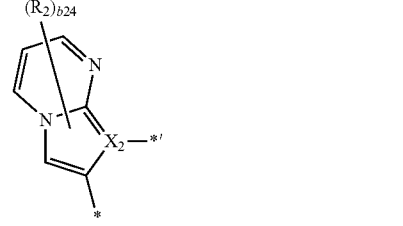

A2-50 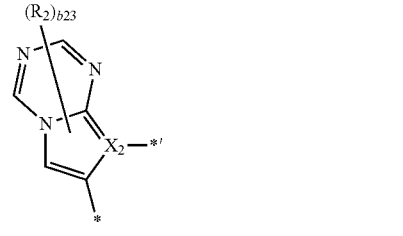

wherein in Formulae $A_1$-1 to $A_1$-51 and $A_1$-54 to $A_1$-56, $X_1$ and $R_1$ are respectively the same as those defined in Formula 1-1, b12 is an integer from 0 to 2,
b13 is an integer from 0 to 3,
b14 is an integer from 0 to 4,
b15 is an integer from 0 to 5,
b16 is an integer from 0 to 6,
b17 is an integer from 0 to 7,
*' indicates a binding site to $Z_{31}$ in Formula 1-1, and
* indicates a binding site to $T_1$ in Formula 1-1,
wherein in Formulae $A_2$-1 to $A_2$-32, $A_2$-34, $A_2$-35, $A_2$-37 and $A_2$-41 to $A_2$-50,
$X_2$ and $R_2$ are respectively the same as those defined with respect to Formula 1-1,
$X_{21}$ is selected from O, S, $N(R_{21})$, $C(R_{21})(R_{22})$, and $Si(R_{21})(R_{22})$,
$R_{21}$ and $R_{22}$ are each defined the same as $R_2$, b22 is an integer from 0 to 2, b23 is an integer from 0 to 3, b24 is an integer from 0 to 4, b25 is an integer from 0 to 5, b26 is an integer from 0 to 6, b27 is an integer from 0 to 7,

*' indicates a binding site to $Z_{32}$ in Formula 1-1, and

* indicates a binding site to $T_1$ in Formula 1-1, wherein the organic layer further comprises a visible light-emitting layer.

12. A device comprising the near-infrared light-emitting diode according to claim 1.

13. The device of claim 12, wherein the device further comprises a visible light-emitting diode comprising a first electrode, a second electrode, and a visible light-emitting layer between the first electrode and the second electrode.

14. The device of claim 12, wherein the device further comprises a sensor configured to identify near-infrared light reflected from a subject exposed to at least a portion of near-infrared light emitted from the near-infrared light-emitting diode.

15. The device of claim 14, wherein the subject is a part of a human body.

16. The device of claim 12, wherein the device is an emission device, an authentication device, or an electronic device.

* * * * *